US008394650B2

(12) United States Patent
Chung

(10) Patent No.: US 8,394,650 B2
(45) Date of Patent: Mar. 12, 2013

(54) SOLAR CELL INTERCONNECTION, MODULE AND PANEL METHOD

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 15 days.

(21) Appl. No.: 13/155,090

(22) Filed: Jun. 7, 2011

(65) Prior Publication Data

US 2011/0300664 A1    Dec. 8, 2011

Related U.S. Application Data

(60) Provisional application No. 61/397,222, filed on Jun. 8, 2010, provisional application No. 61/455,209, filed on Oct. 15, 2010, provisional application No. 61/492,138, filed on Jun. 1, 2011.

(51) Int. Cl.
*H01L 21/66* (2006.01)

(52) U.S. Cl. ............... 438/15; 438/80; 438/83; 438/106; 438/116; 438/127; 257/E31.001; 257/E31.054; 257/E31.093; 257/E31.11; 257/E31.117; 257/E27.124; 257/E27.125; 257/E25.005; 257/E25.009; 136/244; 136/245; 136/251

(58) Field of Classification Search ......................... None
See application file for complete search history.

(56) References Cited

U.S. PATENT DOCUMENTS

| 5,681,402 | A  | 10/1997 | Ichinose et al. |
| 6,376,769 | B1 | 4/2002  | Chung |
| 6,421,013 | B1 | 7/2002  | Chung |
| 6,580,031 | B2 | 6/2003  | Chung |
| 6,581,276 | B2 | 6/2003  | Chung |
| 6,717,819 | B1 | 4/2004  | Chung |
| 7,154,046 | B2 | 12/2006 | Chung |
| 2004/0046154 | A1 | 3/2004 | McVicker et al. |
| 2008/0202682 | A1 | 8/2008 | Husemann et al. |
| 2009/0111206 | A1 | 4/2009 | Luch |
| 2010/0047955 | A1 | 2/2010 | Vijh |

FOREIGN PATENT DOCUMENTS

WO   WO 2011/011091   1/2011

OTHER PUBLICATIONS

Patent Cooperation Treaty, "International Search Report—Application No. PCT/US2011/039476", Dec. 16, 2011, 4 pages.
Photon International, "PV Production pathways to 61 Euro cents per W module in 2 years", Apr. 2011, 2 pages, www.photon-magazine.com/news_archiv/details ....
Gee, James M. et al., "Development of Industrial High-Efficiency Back-Contact Czochralski-Silicon Solar Cells", © 2011, 7 pgs, Applied Materials, Inc., Santa Clara, CA, Paper presented at 25th EU PVSEC WCPEC-5, Valencia, Spain, 2010.

(Continued)

*Primary Examiner* — Fernando L Toledo
*Assistant Examiner* — Yasser Abdelaziez
(74) *Attorney, Agent, or Firm* — Clement A. Berard, Esq.; Dann, Dorfman, Herrell & Skillman, PC

(57) ABSTRACT

A laminated module or panel of solar cells and a laminating method for making same comprise a top layer of melt flowable optically transparent molecularly flexible thermoplastic and a rear sheet of melt flowable insulating molecularly flexible thermoplastic both melt flowing at a temperature between about 80° C. and 250° C. and having a low glass transition temperature. Solar cells are encapsulated by melt flowing the top layer and rear sheet, and electrical connections are provided between front and back contacts thereof. Light passing through the transparent top layer impinges upon the solar cells and the laminated module exhibits sufficient flexural modulus without cross-linking chemical curing. Electrical connections may be provided by melt flowable electrically conductive molecularly flexible thermoplastic adhesive or by metal strips or by both.

44 Claims, 12 Drawing Sheets

OTHER PUBLICATIONS

AI Technology, Inc., "UV Resistant Adhesives for Solar Cells & Panels", including Solartab™, Solarbloc™, and Solargrip™ adhesives, date prior to Jun. 7, 2011, 4 pages.

Applied Materials, Inc., David H. Meakin, James M. Gee, John Telle, William Bottenberg, "Development and Qualification of Monolithically assembled Modules for Back Contact PV Cells", $25^{th}$ European Photovoltaic Solar Energy Conference and Exhibition/5th World Conference on Photovoltaic Energy Conversion, Sep. 6-10, 2010, Valencia, Spain, 5 pages (pp. 3858-3862).

Arkema, Inc., "KYNARr® and KYNAR FLEX® PVDF Overview", date prior to Jun. 7, 2011, 1 page, http://www.arkema-inc.com/kynar/print.cfm?pag=983.

Bloomberg L.P., Ehren Goossens, "Silver Surge Makes 'Headwind' for Solar/Fossil Fuel Rivalry", Jun. 23, 2011, 3 pages, http://www.bloomberg.com/news/print/2011-06-22/silver-surge-makes-headwind . . . .

Gunther Portfolio, Edgar A. Gunther, "Applied Materials: Back Contact Photovoltaic Revolution", May 8, 2011, 9 pages, http://guntherportfolio.com/2011/05/applied-materials-back-contact . . . .

Saint-Gobain Performance Plastics, "LightSwitch™ Applications", © 2010, 2 pages.

Steel & Silicon, LLC, Max Davis, "Electrical, Mechanical, and Thermal Modeling of Photovoltaic Modules: An Overview", Feb. 18, 2010, 50 pages.

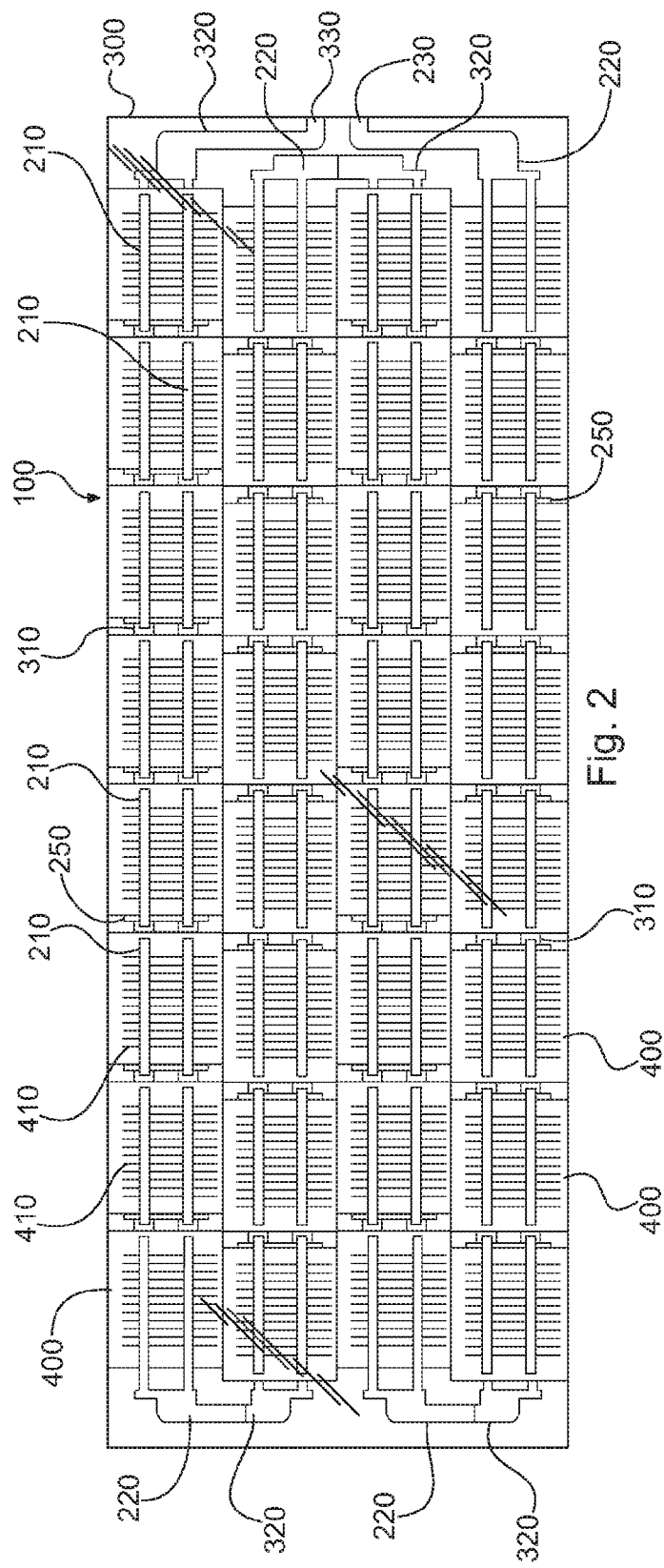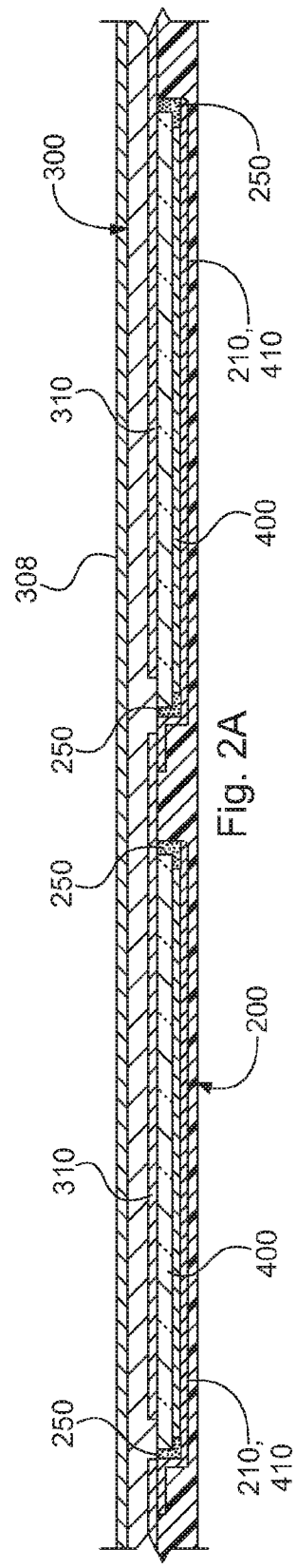
Fig. 2
Fig. 2A

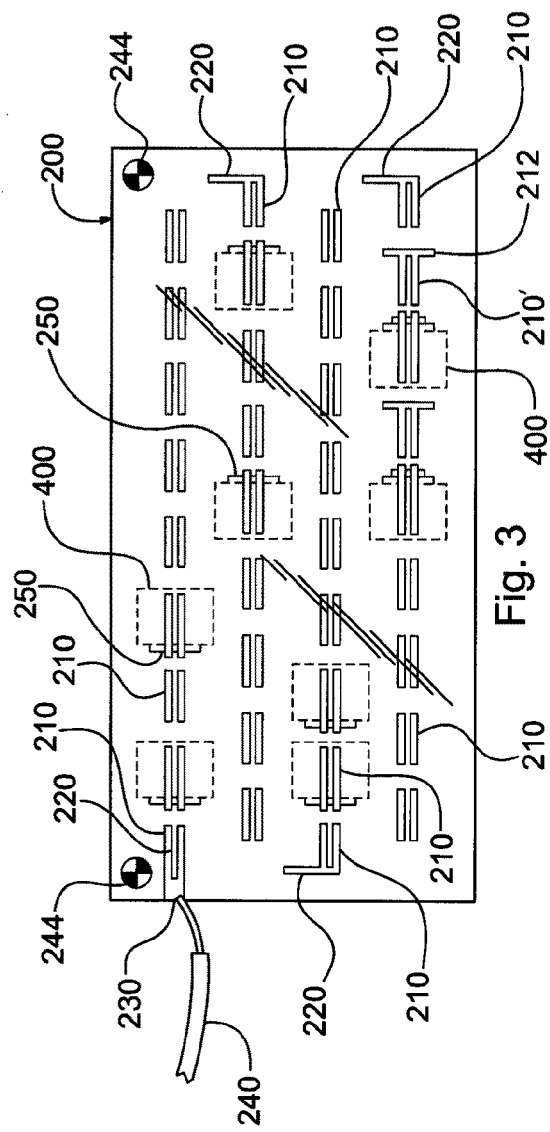
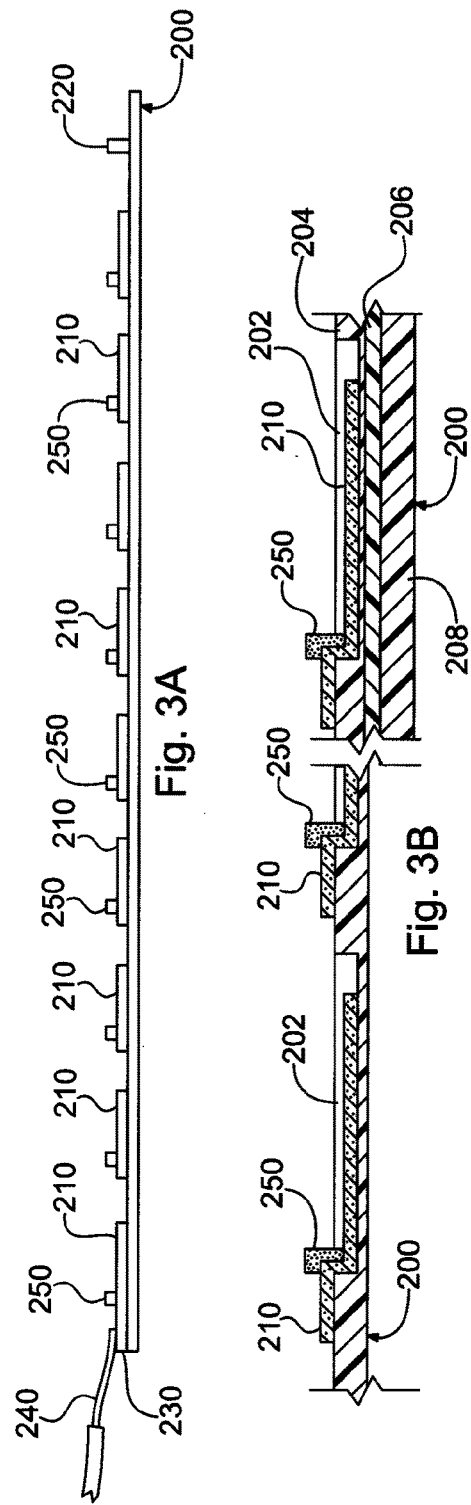
Fig. 3
Fig. 3A
Fig. 3B

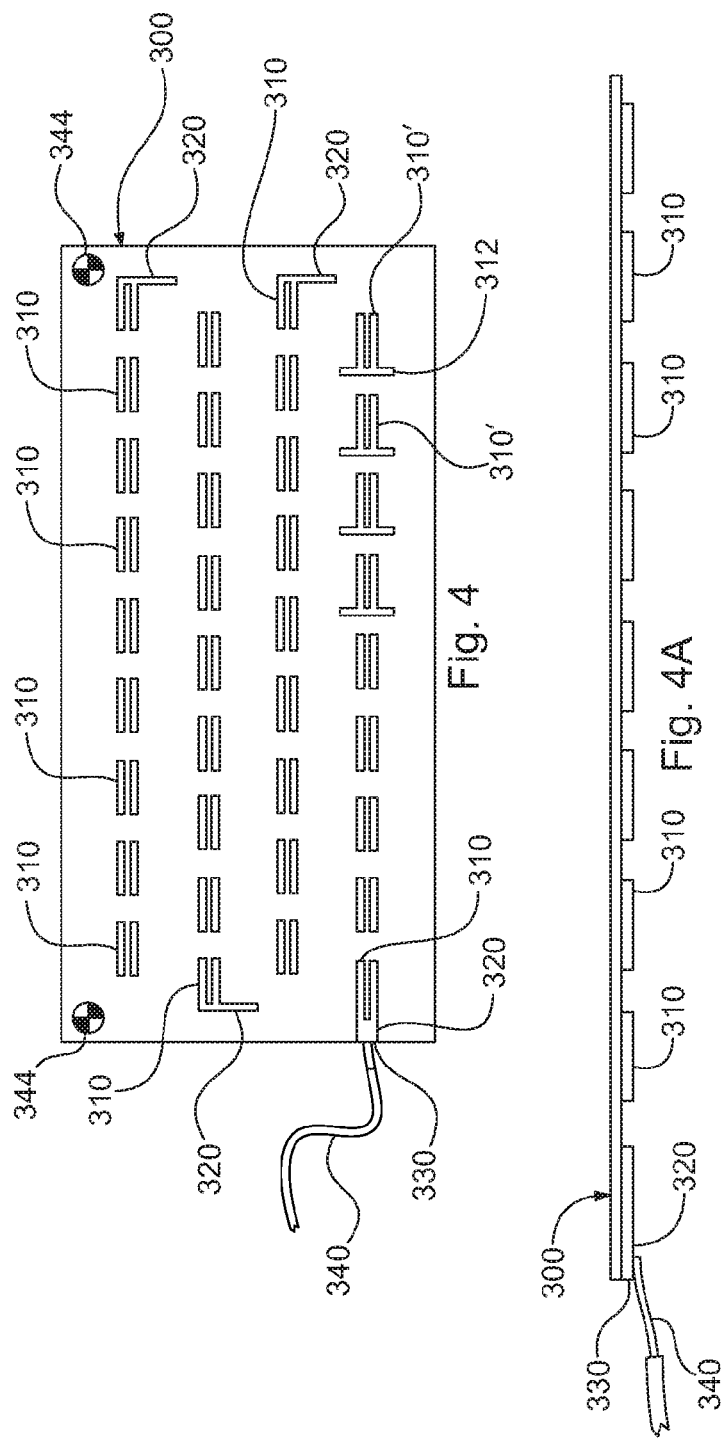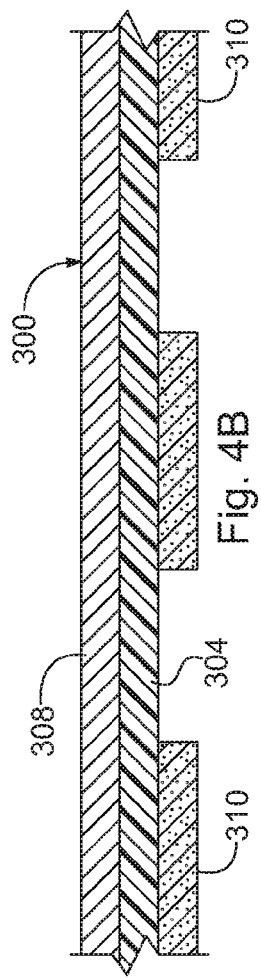

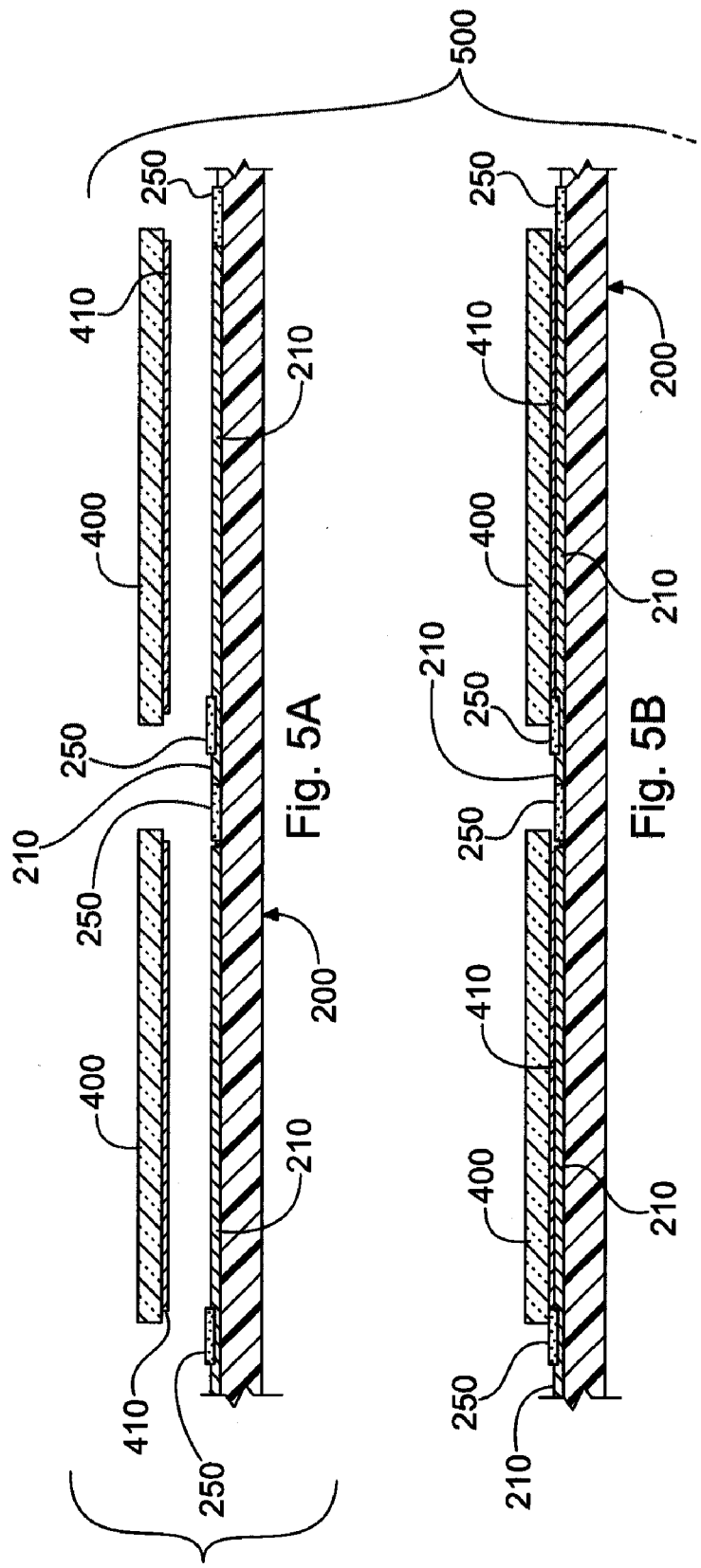

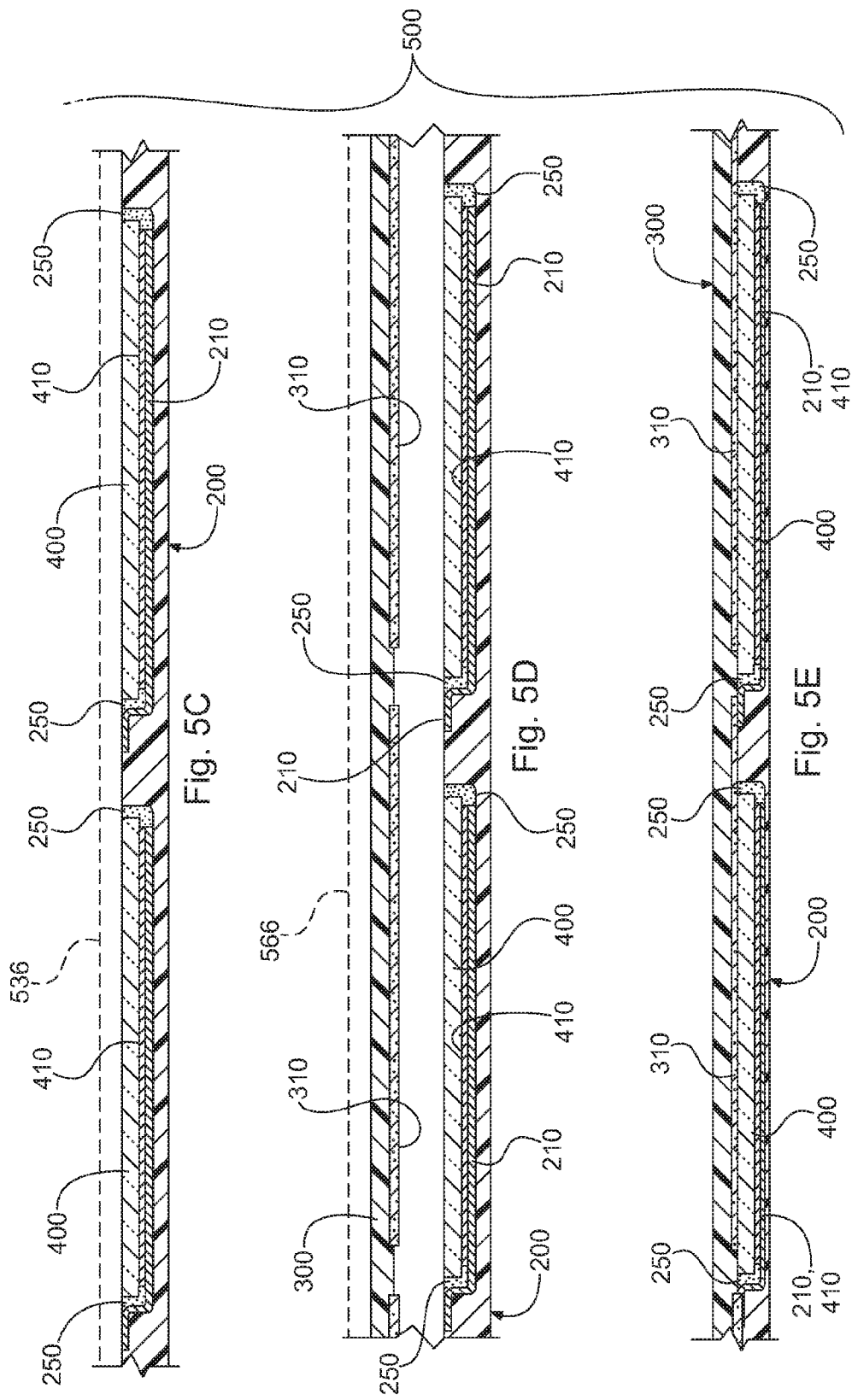

Fig. 8
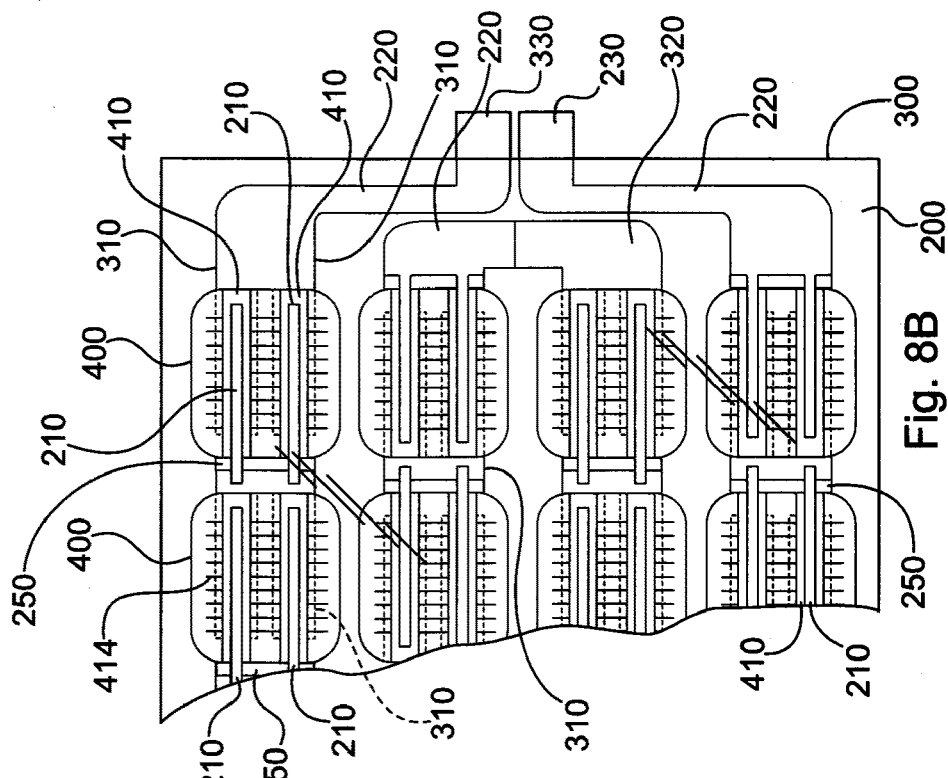
Fig. 8A
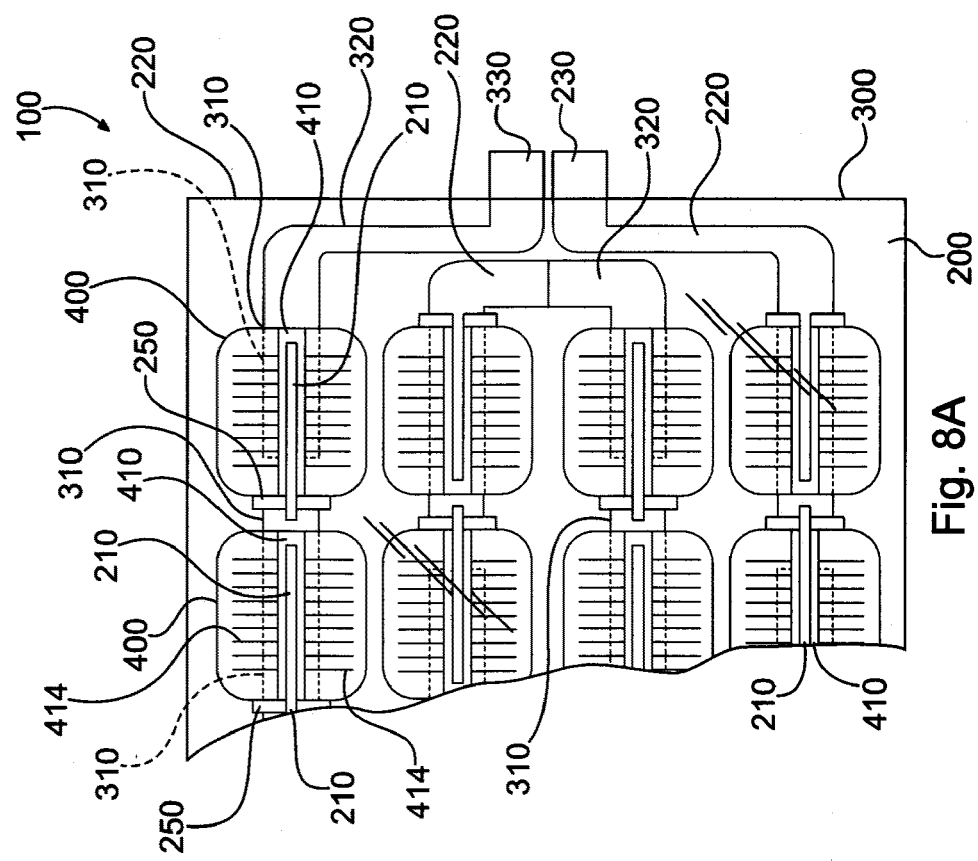
Fig. 8B

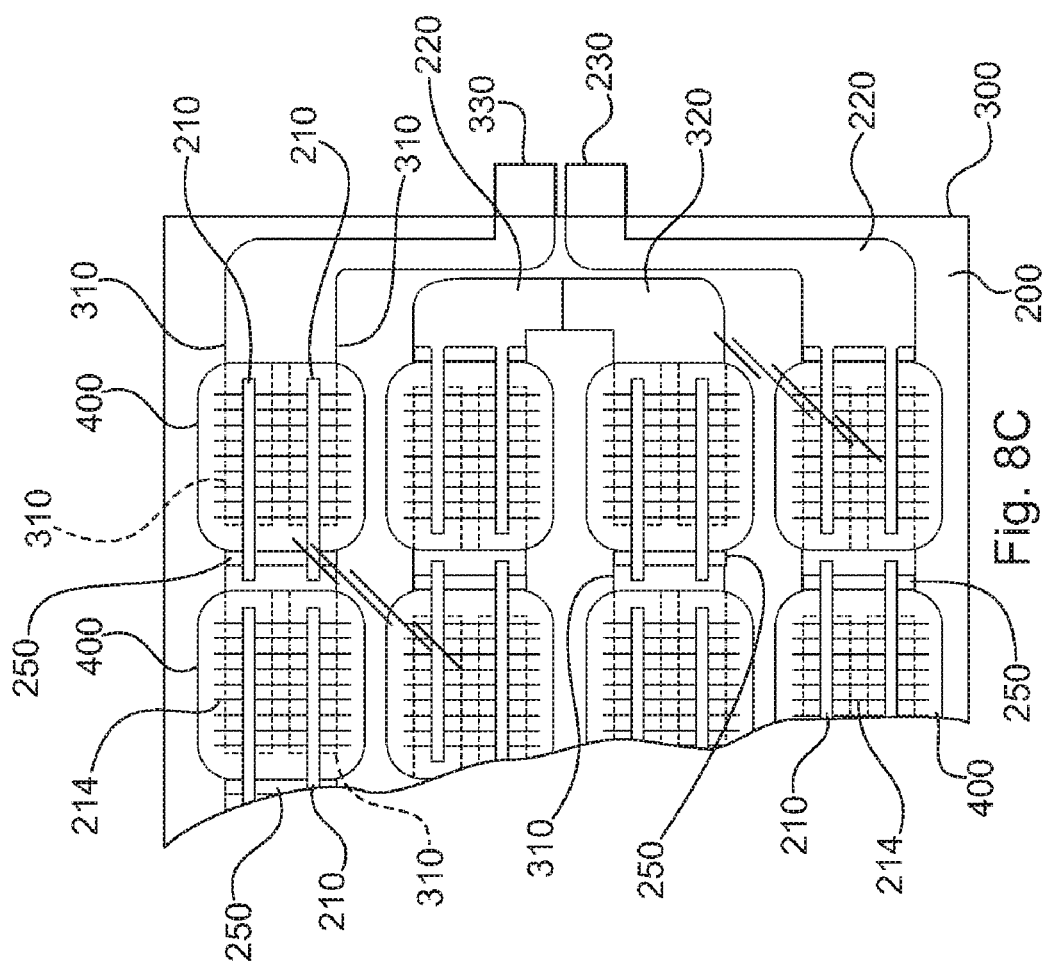

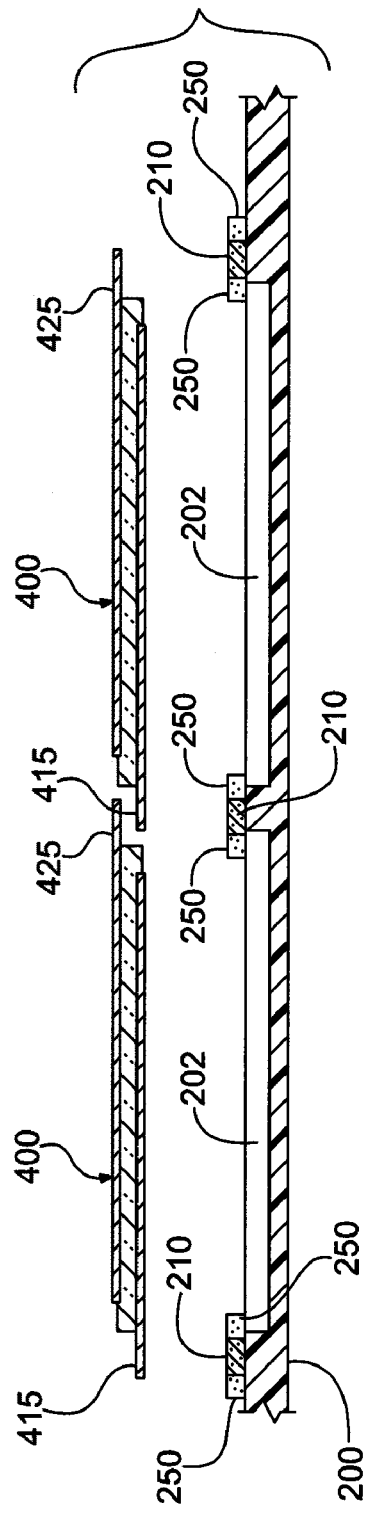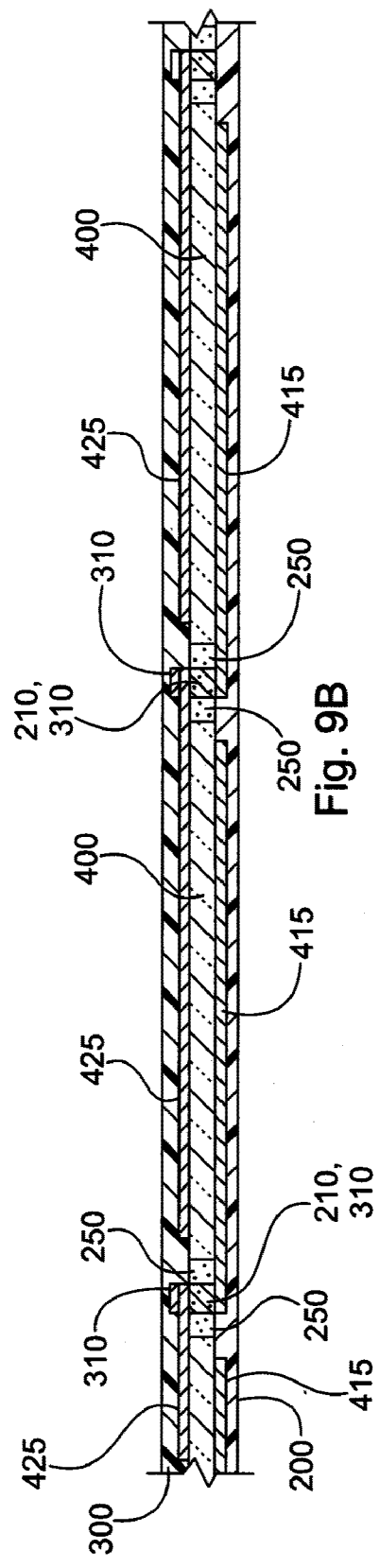

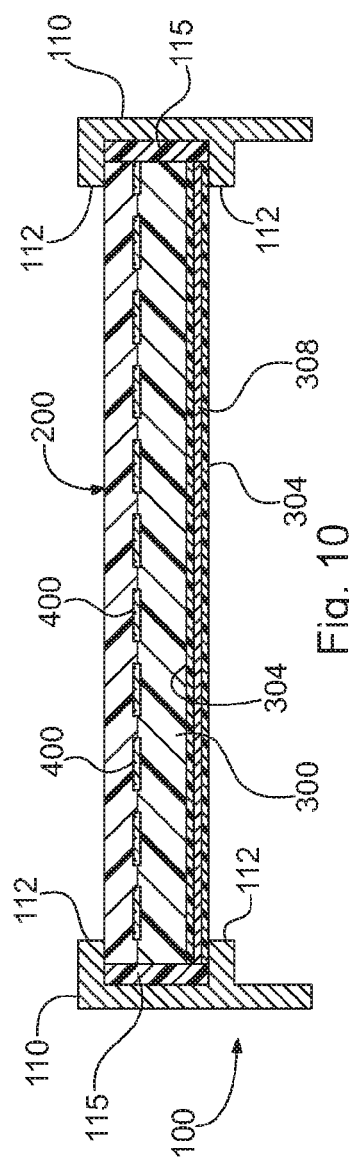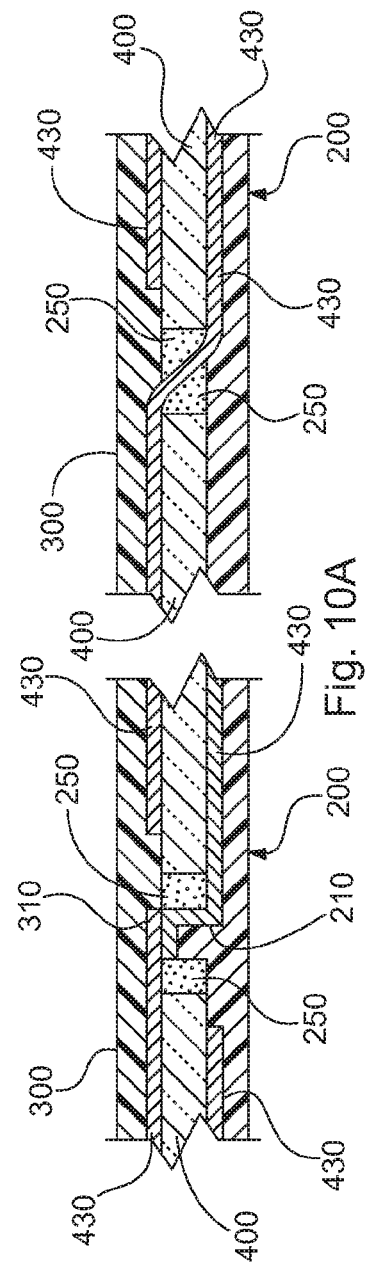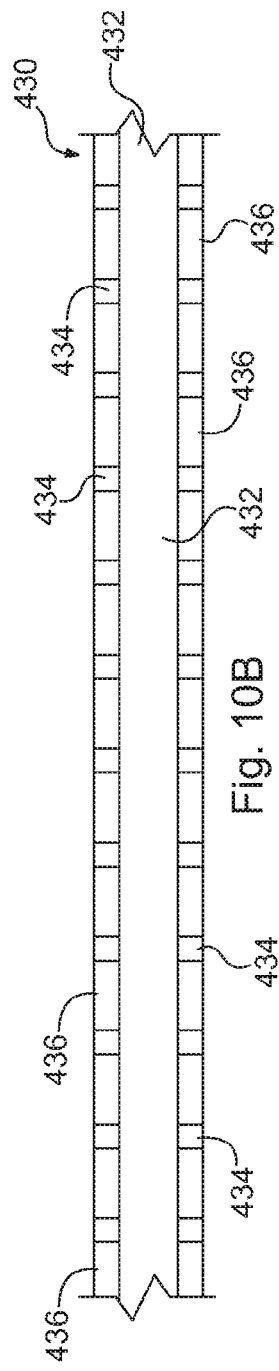

SOLAR CELL INTERCONNECTION, MODULE AND PANEL METHOD

This Application claims the benefit of U.S. Provisional Application Ser. No. 61/397,222 filed Jun. 8, 2010, of U.S. Provisional Application Ser. No. 61/455,209 filed Oct. 15, 2010, and of U.S. Provisional Application Ser. No. 61/492,138 filed Jun. 1, 2011, each of which is hereby incorporated herein by reference in its entirety.

The present invention relates to solar cells and, in particular, to a solar cell interconnection, module and/or panel method.

FIG. 1 is an exploded view of a conventional prior art solar cell panel 900 and FIG. 1A is an enlarged view of interconnected solar cells 920 thereof. Conventional solar cell panels 900 typically comprise a number of solar cells 920, also known as photo-voltaic cells 920, arrayed on a back sheet 910 and covered by a clear or translucent front sheet 930. Individual solar cells 920 have grids of metalized conductive contacts, e.g., fired patterns of glass-silver conductive ink, on both their front and rear surfaces to provide metalized contacts that conduct the current produced when the solar cell 920 is exposed to light.

The metalized conductive grids of adjacent solar cells 920 are interconnected by metal interconnects or tabs 925 that are soldered to the metalized contacts on each solar cell 920 to electrically connect a number of solar cells 920 in series. Each interconnect tab 925 is formed into an appropriate shape, e.g., an "S" shape, and one end thereof is soldered to a contact on the top surface of one solar cell 920 and the other end thereof is soldered to a contact on the bottom surface of another solar cell 920, e.g., to form a string or module of soldered interconnected solar cells.

A string or module of solar cells 920 may include any convenient number of solar cells in series, however, strings of 12, 24, 36 and 48 cells in series are typical. The number of solar cells connected in series may be selected to provide a desired output voltage. Where a large number of series connected solar cells are desired, two or more strings or modules may be utilized and these strings or modules may be connected in series by soldering after mounting to the back sheet 910 so as to avoid handling a series string having a large number of solar cells. In general, soldering to interconnect solar cells 920 may be done before and/or after the solar cells are attached to back sheet 910, as may be convenient.

Strings or modules of solder tab interconnected solar cells are placed, e.g., attached, to the back sheet 910 and are covered by the front sheet 930. The space between the front and back sheets 910, 930 may be filled with an encapsulating material 940 and heat-vacuum laminated in a batch laminating process, and/or may be surrounded by a frame to provide a seal, e.g., to create a sealed space that may be filled with a relatively inert gas.

Typical conventional solar cells may be about 10×10 cm, 12.5×12.5 cm or 15×15 cm in size and are typically operated at a voltage of about 0.6-0.7 volts, with the level of current generated being a direct function of the active area of the solar cell and the intensity of the light impinging thereon, and being inversely related to temperature.

Back sheet 910 may be a plastic and/or a metal, e.g., aluminum. Front sheet 930 may be, e.g., a clear tempered glass, and encapsulating material 940 may be, e.g., an ethylene vinyl acetate (EVA) film which is known to melt flow and provide long term protection against moisture penetration and to have resistance to degradation by ultra-violet (UV) light. However, EVA in the presence of moisture and heat can become acidic and lead to corrosion. Vacuum lamination of panel 900 is typically done at a temperature of about 140° C. and a pressure of about several hundred millibar to one bar. Interconnect tabs 925 are typically of tinned copper, but may be of silver.

The configuration of a typical conventional solar panel 900 may tend to require manual processing and batch processing. In particular, soldering of interconnects to solar cells often involves a manual soldering process, which can be expensive and can produce non-uniform results. In addition, vacuum lamination batch processing is typically employed for laminating a single panel or only a small number of panels at an elevated temperature and pressure selected to permit the EVA material to cure by polymer cross-linking to develop strength followed by a period of controlled cooling, e.g., up to 5-30 minutes cycle time per unit or batch.

As a result, vacuum laminating tends to be a processing step that constricts the flow of panels to completion, i.e. the laminating becomes a production bottleneck that severely constricts the number of solar panels that can be processed on a given piece of laminating equipment, thereby reducing output and increasing unit cost.

Accordingly, Applicant has discovered a need for a solar cell interconnection, module, and/or panel that avoids long curing times needed for cross-linking and is suitable for continuous processing and for a method or process for making such interconnection, module and/or panel.

To this end, a laminated module of solar cells may comprise: a top layer of a melt flowed melt flowable optically transparent electrically insulating thermoplastic having a first pattern of melt flowable electrically conductive thermoplastic thereon for making electrical connection to the front surfaces of solar cells; a plurality of solar cells having front and back surfaces to which electrical connection may be made, the plurality of solar cells being laminated into the melt flowed top layer with the first patterns of melt flowable electrically conductive thermoplastic making electrical connection to the front surfaces of the plurality of solar cells, a rear sheet of a melt flowed melt flowable electrically insulating thermoplastic having a second pattern of melt flowable electrically conductive thermoplastic thereon for making electrical connection to the back surfaces of the plurality of solar cells, the melt flowed rear sheet being laminated to the melt flowed top layer and to the back surfaces of the plurality of solar cells therein with the second patterns of melt flowable electrically conductive thermoplastic making electrical connection to the back surfaces of the plurality of solar cells; wherein the first and second patterns of melt flowable electrically conductive thermoplastic are melt flowed to each other to provide an electrical connection between the front surface of one of the plurality of solar cells and the back surface of another of the plurality of solar cells.

In one aspect, a laminated module of solar cells may comprise: a top layer of a melt flowed melt flowable optically transparent electrically insulating thermoplastic having a first pattern of melt flowable electrically conductive thermoplastic thereon for making electrical connection to the front surfaces of solar cells; a plurality of solar cells having front and back surfaces to which electrical connection may be made, the plurality of solar cells being laminated into the melt flowed top layer with the first patterns of melt flowable electrically conductive thermoplastic making electrical connection to the front surfaces of the plurality of solar cells, and the back surfaces of the plurality of solar cells being exposed, wherein the first pattern of melt flowable electrically conductive thermoplastic melt flowed to provide exposed electrical connections to the front surfaces of the plurality of solar cells, and wherein the back surfaces of the plurality of solar cells are exposed for making electrical connection thereto.

Further, a laminated module of solar cells may comprise: a top layer of a melt flowed melt flowable optically transparent electrically insulating molecularly flexible thermoplastic having at least ten percent molecular crystallites that melt flow at a temperature in the range between about 80° C. and about 250° C. and having a glass transition temperature of less than about 0° C.; to bond to the front surfaces of solar cells; a rear sheet of a melt flowed melt flowable electrically insulating molecularly flexible thermoplastic having at least ten percent molecular crystallites that melt flow at a temperature in the range between about 80° C. and about 250° C. and having a glass transition temperature of less than about 0° C.; to bond to the back surfaces of solar cells; a plurality of solar cells having front and back surfaces to which electrical connection may be made, the plurality of solar cells being encapsulated by the molecularly flexible thermoplastic of the melt flowed top layer and of the melt flowed rear sheet; electrically conductive interconnection members providing electrical connections between the front surfaces of ones of the plurality of solar cells and the back surfaces of others of the plurality of solar cells; wherein the melt flowable molecularly flexible thermoplastic of the top layer is bonded to the front surfaces of the plurality of solar cells and the melt flowable molecularly flexible thermoplastic of the rear sheet is bonded to the back surfaces of the plurality of solar cells, wherein the laminated module including the top layer and the rear sheet exhibits a flexural modulus at about 60° C. that is at least fifty percent of the flexural modulus exhibited at about 20° C. without cross-linking chemical curing.

In another aspect, a method for making a laminated module of solar cells may comprise:

obtaining a top layer of a melt flowable optically transparent electrically insulating thermoplastic having a first pattern of melt flowable electrically conductive thermoplastic thereon for making electrical connection to the front surface of solar cells;

placing a plurality of solar cells having front and back surfaces to which electrical connection may be made on the melt flowable top layer in locations with the first pattern of melt flowable electrically conductive thermoplastic adjacent the front surfaces of the plurality of solar cells, obtaining a rear sheet of a melt flowable electrically insulating thermoplastic having a second pattern of melt flowable electrically conductive thermoplastic thereon for making electrical connection to the rear surface of the solar cells;

placing the melt flowable rear sheet adjacent to the melt flowable top layer and the back surfaces of the plurality of solar cells in a location with the second pattern of melt flowable electrically conductive thermoplastic adjacent the back surfaces of the plurality of solar cells;

heat laminating the melt flowable top layer, the plurality of solar cells and the melt flowable rear sheet to melt flow the melt flowable top layer and the melt flowable rear sheet together so that electrical connections are made between the first pattern of melt flowable electrically conductive thermoplastic and the front surfaces of the plurality of solar cells, between the second pattern of melt flowable electrically conductive thermoplastic and the back surfaces of the plurality of solar cells, and between the first and second patterns of pattern of melt flowable electrically conductive thermoplastic.

In another aspect, a method for making a laminated module of solar cells may comprise:

obtaining a top layer of a melt flowable optically transparent electrically insulating thermoplastic having a first pattern of melt flowable electrically conductive thermoplastic thereon for making electrical connection to the front surface of solar cells;

placing a plurality of solar cells having front and back surfaces to which electrical connection may be made on the melt flowable top layer in locations with the first pattern of melt flowable electrically conductive thermoplastic adjacent the front surfaces of the plurality of solar cells, heat laminating the melt flowable top layer and the plurality of solar cells to melt flow the melt flowable top layer so that electrical connections are made between the first pattern of melt flowable electrically conductive thermoplastic and the front surfaces of the plurality of solar cells;

wherein the plurality of solar cells are embedded into the melt flowable top layer, wherein the first pattern of melt flowable electrically conductive thermoplastic provides exposed electrical connections to the front surfaces of the plurality of solar cells, and wherein the back surfaces of the plurality of solar cells are exposed for making electrical connection thereto.

In a further aspect, a method for making a laminated module of solar cells may comprise:

obtaining a top layer of a melt flowable optically transparent electrically insulating molecularly flexible thermoplastic having at least ten percent molecular crystallites that melt flow at a temperature in the range between about 80° C. and about 250° C. and having a glass transition temperature of less than about 0° C.; to bond to the front surfaces of solar cells;

placing a plurality of solar cells having front and back surfaces to which electrical connection may be made with the front surfaces thereof adjacent the melt flowable top layer;

providing electrical connections between the front surfaces of ones of the plurality of solar cells and the back surfaces of others of the plurality of solar cells;

placing adjacent the back surfaces of the plurality of solar cells and top sheet a rear sheet of a melt flowable electrically insulating molecularly flexible thermoplastic having at least ten percent molecular crystallites that melt flow at a temperature in the range between about 80° C. and about 250° C. and having a glass transition temperature of less than about 0° C.; to bond to the back surfaces of solar cells;

heat laminating the melt flowable top layer, the plurality of solar cells and the melt flowable rear sheet to melt flow the melt flowable top layer and the melt flowable rear sheet together so that the plurality of solar cells and the electrical connections there between are encapsulated in the melt flowed molecularly flexible thermoplastic of at least the top layer;

wherein the laminated module including the top layer and the rear sheet exhibits a flexural modulus at about 60° C. that is at least fifty percent of the flexural modulus exhibited at about 20° C. without cross-linking chemical curing.

BRIEF DESCRIPTION OF THE DRAWING

The detailed description of the preferred embodiment(s) will be more easily and better understood when read in conjunction with the FIGURES of the Drawing which include:

FIG. 1 is an exploded perspective view of a prior art solar cell panel and FIG. 1A is an enlarged view of prior art solder tab interconnected solar cells thereof;

FIG. 2 is a plan view of an example embodiment of a solar cell interconnection, module and panel, and FIG. 2A is an enlarged cross-sectional detail thereof;

FIG. 3 is a plan view of an example embodiment of a front or top sheet for the example solar cell panel of FIG. 1, FIG. 3A is a side view thereof, and FIG. 3B is a side cross-sectional view of a portion thereof;

FIG. 4 is a plan view of an example embodiment of a rear sheet for the example solar cell panel of FIG. 1, FIG. 4A is a side view thereof, and FIG. 4B is a side cross-sectional view thereof;

FIG. 5 includes FIGS. 5A-5E which illustrate various steps in a method or process for making the example solar cell panel of FIG. 1;

FIG. 8 includes FIGS. 8A, 8B and 8C each of which is a partially cut away view of part of an example solar cell panel showing an example interconnection arrangement thereon;

FIG. 9 includes FIGS. 9A-9B which illustrate example steps in the process or method for making a solar cell panel employing a tabbed solar cell; and FIG. 10 is a side sectional view of an example embodiment of an example solar cell panel, FIG. 10A is a side cross-sectional view of a portion thereof, and FIG. 10B is a side of a component thereof.

Figure 1:
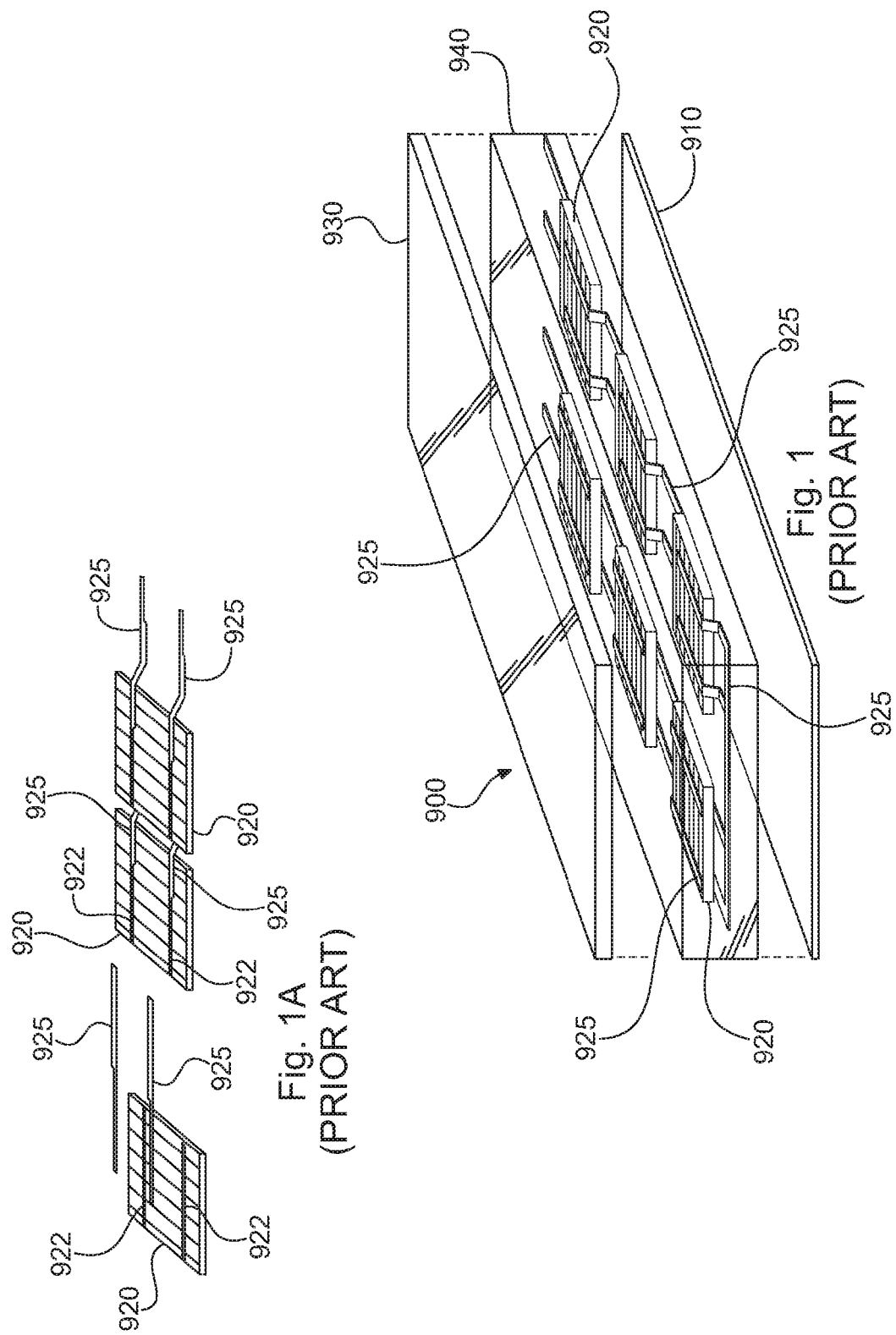

In the Drawing, where an element or feature is shown in more than one drawing figure, the same alphanumeric designation may be used to designate such element or feature in each figure, and where a closely related or modified element is shown in a figure, the same alphanumerical designation primed or designated "a" or "b" or the like may be used to designate the modified element or feature. Similarly, similar elements or features may be designated by like alphanumeric designations in different figures of the Drawing and with similar nomenclature in the specification. According to common practice, the various features of the drawing are not to scale, and the dimensions of the various features may be arbitrarily expanded or reduced for clarity, and any value stated in any Figure is given by way of example only.

DESCRIPTION OF THE PREFERRED EMBODIMENT(S)

The novel solar cell interconnections, solar cell modules and solar cell panels descried herein, and the novel method for making such interconnections, modules and panels, involve combinations of structure and configuration, and of materials and properties, that provide certain characteristics and advantages over the example prior art solar panel described in relation to FIG. 1.

It is noted that the novel solar cell interconnections, modules and panels described herein not only overcome certain disadvantages of the prior art panels, but also may be designed to employ certain aspects of conventional solar panels, e.g., standard size solar cells and processing at about 140° C., so as to be conveniently adoptable.

FIG. 2 is a plan view of an example embodiment of a solar cell interconnection, module and panel 100, and FIG. 2A is an enlarged cross-sectional detail thereof. Solar panel 100 comprises a relatively thin thermoplastic top layer or sheet 200 and an opposing relatively thin thermoplastic rear sheet 300, having a plurality of solar cells 400 there between. Both top sheet 200 and rear sheet 300 preferably include electrical conductors thereon for cooperatively providing interconnections between solar cells 400. Example panel 100 has, e.g., 36 solar cells 400 arranged in four rows of nine solar cells 400, and the 36 solar cells are all electrically connected in series, although a greater or lesser number of solar cells per row or a greater or lesser number of rows, or both, may be employed, thereby to provide any desired number of solar cells per panel 100. Connections to the respective ends of the series connected solar cells 400 may be made at terminals 230 and 330.

Solar cells may be, but need not be, typical conventional solar cells that may be about 10×10 cm, 12.5×12.5 cm or 15×15 cm in size and are typically operated at a voltage of about 0.6-0.7 volts, with the level of current generated being a direct function of the active area of the solar cell and the intensity of the light impinging thereon, and being inversely related to temperature. Typically, each solar cell has an electrically conductive metal grid pattern on the front surface thereof for conducting charge generated by the solar cell to utilization circuitry. In one common solar cell, the conductive grid includes plural thin narrow parallel metal conductors 412 arranged in one direction and one or more parallel thin metal conductors or bus bars 410 arranged in an orthogonal direction that collect the charge from the thin conductors 412 and to which external electrical connection may be made. One or more metal conductors are also provided on the rear surface of the solar cell for making electrical contact therewith. The metal conductors may by made of a fired or sintered glass or ceramic based conductive ink having conductive metal particles, e.g., gold, silver or copper particles, embedded therein. If the conductors are not solderable, a plating of solderable metal may be applied. Solar cells of other configurations and of any desired photo-voltaic material may be employed with the interconnections, modules and panels 100 described herein.

Conductors 210 associated with top sheet 200 and conductors 310 associated with rear sheet 300 cooperate to connect together to provide electrically conductive connections between bus bar contacts 410 on the front surface of each solar cell 400 and a contact on the rear surface of an adjacent solar cell 400, e.g., in each of the four rows of solar cells 400 of panel 100. Electrical connections between the bus bar contacts 410 of solar cells 400 at the ends of each of the four rows thereof are made by end cross connections 220 and 320 which are associated with top layer 200 and rear sheet 300, respectively, and which cooperate to electrically connect together.

Top layer 200 includes a relatively thin layer of a relatively transparent electrically insulating melt flowable thermoplastic polymeric adhesive into which solar cells 400 are pressed in a heated laminating process step described herein, whereby solar cells 400 are encapsulated in top layer 200 and rear sheet 300 which melt flow and bond to the surfaces of solar cells 400 when laminated. Electrical conductors 210, 310 include a patterned melt flowable electrically conductive thermoplastic polymeric adhesive deposited in a pattern on top layer 200 and rear sheet 300, respectively, that physically come together in the gaps or spaces between adjacent solar cells 400 when panel 100 is heat laminated so as to provide an electrical connection between bus bar contacts 410 on the front surface of each solar cell 400 and the rear contact of an adjacent solar cell 400.

Similarly, electrical conductors 230, 330 include a patterned melt flowable electrically conductive thermoplastic polymeric adhesive deposited in a pattern on top layer 200 and rear sheet 300, respectively, that physically come together in the end region between adjacent rows of solar cells 400 when panel 100 is heat laminated so as to provide an electrical connection between bus bar contacts 410 on the front surface of a solar cell 400 at the end of one row of solar cells and the rear contact of a solar cell 400 of an adjacent row of solar cells 400. Conductors 230, 330 that are at the opposite ends of the series connections of solar cells 400 provided by conductors 220, 320 are arranged to provide respective end contacts 230, 330 to which electrical connections may be made, e.g., by electrical wires, for connecting panel 100 in a utilization configuration wherein electrical power generated thereby in response to light impinging on panel 100 may be utilized, e.g., by an electrical load.

Top layer 200 may also include a pattern 250 of melt flowable electrically insulating thermoplastic adhesive positioned at one or more of the edges of solar cells 400 so as to insulate the edges of solar cells 400 with respect to conductive adhesive pattern 210, e.g., typically to insulate the edges of solar cells 400 from any of conductive adhesive 210 that might melt flow to contact an edge of a solar cell 400 when the melt flowable materials of top layer 200 and conductors 210 are melt flowed together. Preferably, a pattern 250 of melt flowable insulating adhesive is provided at least at the edges of solar cells 400 at which conductors 210 may come within close proximity. In the example illustrated, a pattern of insulating thermoplastic adhesive 250 is provided at the edge of solar cell 400 at which conductor 210 will deform to make connection to conductor 310 of rear sheet 300 and at the edge of solar cell 400 opposite that edge.

Processing to melt flow top layer 200, the electrically conductive adhesive thermoplastics forming conductors 210, 220, 310, 320, and the insulating adhesive thermoplastic forming insulator 250, e.g., for heat laminating sheet 200 and 300 and the solar cells 400 and conductors therebetween, is preferably performed at a melt flow temperature in the range of about 80° C.-200° C. and more preferably at a melt flow temperature in the range of about 100° C.-160° C. In general, and preferably, the melt flow adhesives forming sheet 200 and patterns 210, 220, 250, 310, 320 all melt flow at about the same temperature, however, the thermoplastic adhesives of patterns 210, 220, 310, 320 may have a slightly lower melt flow temperature than do top layer 200 and rear sheet 300. Heat laminating is preferably performed as a substantially continuous heated rolling process, as described below, but may be by heated vacuum laminating or heated pressing, e.g., which typically involves batch processing.

The preferred thermoplastic materials employed in top layer 200, rear sheet 300 and in patterned adhesive patterns 210, 220, 230, 250, 310, 320, 330 preferably have the property of being "intrinsically" or "molecularly flexible." By employing intrinsically or molecularly flexible materials to adhere to and encapsulate solar cells 400, the build up of stress due to thermal expansion and contraction is reduced and reliable solar cell modules 200 and panels 100 may be inexpensively made.

An intrinsically flexible or molecularly flexible material is a material that is flexible as a result of its molecular structure, and not just because it has been formed into a very thin sheet. Steel, aluminum and glass can be flexed if made thin enough, but none is intrinsically flexible. As used herein, flexible means a material that has a modulus of elasticity that is less than about 35,000 kg/cm$^2$ (500,000 psi) and that withstands an elongation of at least 30% in length without failure. Preferred materials typically have a modulus of elasticity that is less than about 3,500 kg/cm$^2$ (50,000 psi). Thus, conventional substrate materials, such as polyimide which has a modulus of elasticity of about 140,000 kg/cm$^2$ (about 2,000,000 psi), is not flexible as that term is used herein. Typically, molecularly flexible thermoplastic polymers have a glass transition temperature Tg that is less than or equal to about 0° C., and preferably is less than about −20° C.

Typical molecularly flexible thermoplastic polymers have a molecularly flexible backbone with small crystallites attached thereto, such as unmodified PVF or PVDF which have melting points of about 160-165° C. Modification thereof that increases fluorination tends to increase flexibility and to lower the melting point, e.g., as in the case of KYNAR® fluoro-polymers available from Arkema, Inc. of King of Prussia, Pa., and certain type ST and type TP adhesives available from AI Technology, Inc. of Princeton Junction, N.J.

Preferred thermoplastic materials typically exhibit a mechanical strength and rigidity having a flexural modulus of at least about 10,000 psi (about 700 kg/cm$^2$) at ambient temperature, e.g., at about 20° C., and retain at least about fifty percent (50%) of that strength and rigidity at a temperature of about 60° C. When such thermoplastic materials are raised to their melt flow temperature or above, e.g., when being heat laminated, they melt and flow easily after which they may quickly cool, e.g., to about 60° C. or lower, at which temperature they exhibit substantial strength and may be removed from the laminating equipment. As a result, solar cell panels 100 and/or solar cell modules 200 may be heat laminated, cooled and handled thereafter in a much shorter time, e.g., about 2-5 minutes, instead of the 15-30 minutes required for vacuum laminating conventional solar panels that employ the conventional materials typically employed therein.

FIG. 3 is a plan view of an example embodiment of a front sheet or top sheet 200 for the example solar cell panel 100 of FIG. 1, e.g., viewed through transparent top sheet 200, FIG. 3A is a side view thereof, and FIG. 3B is a side cross-sectional view of a portion thereof. Top layer 200 comprises a relatively thin sheet of relatively optically transparent melt flowable adhesive thermoplastic through which light may pass to impinge on solar cells 400 which are placed adjacent thereto, e.g., when top layer 200 is heat laminated in a panel 100. Top layer 200 comprises a directly bondable electrical circuit structure for providing, in cooperation with rear sheet 300, heat bondable electrical connections between the solar cells 400.

On one of the generally parallel broad surfaces of top sheet 200 is a pattern of electrical conductors 210 that are sized and arranged to correspond to electrical contacts on the front surface of a solar cell 400 to be placed adjacent to top sheet 200. Where solar cells 400 have, e.g., two parallel bus bar contacts 410, conductors 210 include two parallel conductors having a width generally corresponding to the width of bus bars 410 and having a length that is sufficient to extend beyond the edge of solar cell 400 to present in the space between adjacent solar cells 400 placed on top sheet 200. Conductors 210 maybe, but need not be, longer than bus bars 410, however, each conductor 210 extends beyond the edge of a solar cell 400.

Preferably, top sheet 200 has one or more targets 244 or other fiducial marks 244 thereon to provide reference points relative to patterns 210, 220, 250 both when applying patterns 210, 220, 250 and when positioning solar cells 400 on top sheet 200.

Patterned conductors 210 that are at the end of a row, and so will not be at a space between adjacent solar cells 400 in a row, may have a transverse conductor 220 for making, in cooperation with a conductor 320 of rear sheet 300 as described, a connection to the solar cell 400 at the same end of an adjacent row of solar cells 400. Thus the series electrical connection of solar cells 400 runs down one row and up an adjacent row, e.g., in opposite directions in adjacent rows. With an even number of rows of solar cells 400, both ends of the series string will naturally be at the same end of top layer 200; where there are an odd number of rows of solar cells 400, an additional conductor running the length of layer 200 or sheet 30 may be needed to make connections to both ends of the series string at or near the same end of solar cell panel 100.

The patterned conductor 210 that is at the end of the series connection of solar cells to which an external connection is desired to be made provides an end contact 230 to which an external conductor 240, e.g., an electrical wire 240, may be connected, e.g., as by soldering or by an electrically conductive adhesive, e.g., the same adhesive employed for conductors 210, 220. So as to be solderable, end contact 230 may coated or plated with a solderable metal, e.g., coated or plated or otherwise passivated with, e.g., silver or a tin plated copper.

Typically, solar cells 400 have one or more elongated "bus bar" contacts 410 along their front surface and electrically conductive adhesive patterns 310 electrically connect to at least ten percent (10%) or more of the area of contacts 410. Conductive patterns 210, 220, 230 may include a patterned metal conductor, e.g., of copper provided by etching or by electroless or electrolyte plating, and plated or flashed, e.g., with tin, silver, nickel, nickel-tin, nickel-silver, gold, or other solderable oxidation resisting coating. Conductors 210, 210 may be electrically conductive adhesive or may be a combination of metal and electrically conductive adhesive. Contact locations 230 typically have the same construction as patterns 210, but may have a solderable metal contact surface where patterns 210, 220 do not include metal.

Patterned conductors 210, 220 provide part of an interconnection between adjacent solar cells 400, cooperating with corresponding patterned conductors 310, 320 on rear sheet 300 when assembled into a panel 100 to complete the interconnections of solar cells 400.

After patterned conductors 210, 220 are formed on top sheet 200, solar cells 400 are placed thereon, e.g., by pick and place manufacturing equipment. Typically the melt flowable adhesive of top layer 200 and the electrically conductive melt flowable adhesives that form conductors 210, 220 are sufficiently tacky to hold solar cells 400 in the positions at which they are placed, however, the solar cells 400 or the layer 200 or both can be preheated, e.g., to about 50° C.-60° C., so as to be more tacky and better hold solar cells 400 in place. Alternatively, a small area of pressure sensitive adhesive may be used to hold each solar cell 400 in place. Solar cells 400 may be placed on conductors 210, 220 when the adhesive thereof is wet or when it has been dried or B-staged.

Patterned conductors 210 may include an optional transverse conductive part 212 at one end thereof that connects the two parallel conductors 210 in a location that will generally be in the gap or space between adjacent solar cells placed on top sheet 200, thereby to provide a "π"-shaped (pi-shaped) conductor 210' and to increase the area of conductor 210 available for making connections to rear sheet 300 as described.

Top sheet 200 is preferably formed as a relatively thin sheet of a relatively optically transparent melt flowable adhesive thermoplastic that is resistant to being damaged by exposure to UV radiation, such as a fluorinated polymer, e.g., PVF, PVDF and their copolymers, modified copolymers, and blends thereof. The melt flowable adhesive material of top sheet 200 typically melt flows at a temperature in the range of about 80° C. to about 250° C., and preferably at a temperature in the range of about 100° C. to about 200° C., and more preferably between about 120° C. and about 160° C., which is above the temperature that a panel 100 is expected to experience in service and is below the temperature at which a solar cell may experience an undesirable change or be damaged.

The thickness of melt flowed top sheet 200 is greater than the thickness of solar cell 400, plus the thickness of any interconnecting tab thereon, and in a typical instance, would be about 5 mils (about 0.13 mm) thicker than the typical 12-16 mils (about 0.30-0.41 mm) thickness of a typical solar cell 400 after melt flowing. Typically the thickness of top layer 200 as provided before solar cells 400 are placed thereon and before melt flowing is at least about fifty percent (50%) of the thickness of solar cell 400, where no interconnecting tab is employed. (One mil equals 0.001 inch, and one micron equals 0.001 millimeter (mm), and one millimeter equals about 39.4 mils).

Typically, the primary top layer 200 includes a thin layer or sheet of a melt flowable electrically insulating thermoplastic material that does not need to cross-link to provide strength, e.g., a polyvinylidene fluoride (PVDF), or a polyvinyl fluoride (PVF), or a copolymer thereof. Top layer 200 may be a single sheet or layer, or may be a single ply of a laminated or layered sheet. Preferred materials are optically transparent, have good UV resistance and good solvent resistance, and adhere to solar cells, glass and electrically conductive adhesives. In each instance, all of the melt flowable materials should have similar melt flow temperatures, however, the melt flowable conductive and insulating adhesives, e.g., of patterns 210, 220, 250, may have a slightly lower melt flow temperature, e.g., about 10-20° C. lower, than does the substrate, e.g., top sheet 200, on which they are applied, so long as all of top layer 200, rear sheet 300 and thermoplastic patterns 210, 220, 250, 310, 320 flow during the melt flow lamination processing.

Suitable materials for top layer 200 include modified PVF and/or PVDF polymer and copolymer materials, preferably thermoplastics having a glass transition temperature of less than 0° C., and having more than about ten percent (10%) molecular crystallites that flow at melt flow temperatures in the ranges set forth above. Materials with lower glass transition temperatures, e.g., less than about −20° C. and about −40° C., are preferred. Examples of suitable materials include, e.g., PVDF polymer materials such as KYNAR® type 9301, 2500, 2750, and 2800 fluoro-polymers which are available from Arkema, Inc. having an office in King of Prussia, Pa., and similar PVF and PVDF copolymers, and blends thereof. Other suitable materials for transparent top sheet 200, may include a sheet or film 200 of type TP7090, TP7120, TP7130, SG7130, SG7150 or TP7150 thermoplastic insulating adhesive, which are available from AI Technology, Inc. of Princeton Junction, N.J. Preferred top sheet materials, e.g., AI Technology types SG7130, SG7133 and SG7150 thermoplastic insulating adhesives, include acrylic for improving transparency and adhesion, e.g., to glass and solar cells. If a blended or copolymer material includes cross-linkable polymers, such cross-linkable polymers must not amount to more than fifty percent (50%) overall volume fraction.

Alternatively, top sheet 200 may further comprise a melt flowable laminate sheet including an ethylene vinyl acetate (EVA) layer or sheet to provide additional thickness, and the EVA sheet is laminated to the primary top layer 200 which includes a thin layer or sheet of PVDF, or PVF, or a copolymer thereof, and/or to a thin sheet of glass, e.g., a tempered glass, however, any EVA layer employed is not in contact with solar cells 400 and connections 210, 220, 310, 320 thereto, and need not completely cross-link.

In addition, top sheet 200 may be provided with plural wells or cavities 202, one for each solar cell 400, wherein each well 202 is slightly larger in length and width than is solar cell 400 and has a depth that is substantially the thickness of solar cells 400, so that solar cells 400 will fit therein and be properly positioned. The depth of the wells or cavities 202 may be slightly less than, but typically is not more than, the thickness of solar cells 400. The wells 202 in top sheet 200 may be formed by applying a sheet 204 having the pattern of well openings 202 therein on a sheet 206 having a planar surface, or may be formed by applying, e.g., by layering, thermal forming, melt flowing against a heated template mold coated with a release material, screening, printing or otherwise depositing, a pattern of material on a sheet 200, 204 having planar surfaces, or by any other suitable manner. When top sheet 200 with solar cells 400 in the wells 202 thereof is melt flowed to form top layer 200, the degree to which the melt flowable materials of top sheet 200 must melt flow is lessened from that where top sheet 200 does not have such wells or cavities 202.

With the known and conventional process of encapsulating the solar cells in forming the solar module in the construction of solar panel, EVA or a cross-linkable polyolefin is a critical part that provides the interface between the outer protection layer of glass or glass replacement. In the present arrangement, a melt-bonding fluorinated polymer encapsulant is employed to replace conventional cross linking encapsulants that have the undesirable attribute of having to cross-link for an extended time under vacuum forming procedure or post-curing with or without vacuum or pressure. With the present inventive materials and process, heat lamination is complete once the melt-flowing is complete which tends to minimize bubbles and voids within and between the encapsulant layers. Although heat lamination is preferably done without vacuum, conventional vacuum heat lamination may be employed, but without the need for extended curing dwell time at high temperature. As a result, the complete laminating process can be done within seconds or at least less than 5 minutes, rather than 15-30 minutes required with the conventional processes for EVA encapsulant.

More importantly, preferred materials such as types SG7130, TP7090, TP7120, and TP7130, melt flowable fluorinated thermoplastics available from AI Technology of Princeton Junction, N.J., utilize molecular crystallites within the polymer network to provide the mechanical stability with a glass transition temperature below 0° C., and in most cases below −40° C., and with a melt-flow melting temperature between about 80-250° C. More preferable are those fluorinated polymers, polymer blends and copolymers that have melting temperature of crystallites at around 100-200° C., and preferably in the range of about 120-160° C., which tends to reduce the trapped mechanical stress and reduce the cost of manufacturing.

In addition, such polymer encapsulants exhibit reasonable mechanical strength once cooled to below their melting temperature to induce crystallization of the polymer crystallites. Such mechanical structural strength is adequate to provide structural integrity when utilized with typical backside mechanical structure, even with the conventional solar panel backside structure or additional mechanical structure such as a metal sheet, aluminum honeycomb, corrugated plastics, and the like. Fluorinated polymers with adequate fluorination have been proven to withstand direct UV exposure for extended periods, some for more than 30 years. For example, PVDF and its blends with thirty percent (30%) polymethyl methacrylate (PMMA) acrylic plastics have been used as a structural coating for more than 40 years. PVDF polymers and their copolymers and blends have also proven to exhibit very high transmissivity in the 200 nm to 1400 nm spectrum, which allows the final solar module or panel to attain higher efficiency. Moreover, conventional encapsulants such as EVA and cross-linked polyolefins have been shown to be unable to maintaining their light transmission efficiency after 20-30 years direct exposure to UV light without the filtering provided by a protective glass sheet.

Top sheet 200 may include a laminate of materials of the types described. For example, because PVDF copolymers are substantially more expensive than is EVA film, top sheet 200 may include a layer of EVA 206 and a layer of modified PVDF or other suitably fluorinated polymer 204, e.g., both being melt flowable and having substantially the same melt flow temperature, so as to reduce the cost of top layer 200 without affecting the manufacturing process for solar panel 100 or compromising performance. In a typical example of a laminated top sheet 200, the modified PVDF or other suitably fluorinated polymer sheet 204 may be about 3-6 mils (about 0.07-0.15 mm) thick and the EVA layer 206 may be about 10-20 mils (0.25-0.5 mm) thick, depending upon the thickness of solar cells 400 including the thickness of any tabbing conductor thereon. The EVA sheet 206 may be employed after a PVDF top sheet 200 is heat laminated with solar cells 400 to form top layer 200, e.g., for attaching a glass layer 208 to top layer 200 in a heat laminating process wherein top layer 200 and rear sheet are heat laminated to form solar cell panel 100, or in a separate heat laminating step.

In addition, a thin glass layer 208 may be included in top sheet 200, e.g., a tempered glass, to provide a measure of UV reduction and an outer surface relatively resistant to abrasion. The glass sheet 208 may be part of the laminate stack including top sheet 200 that is heat laminated to form top layer 200 or may be applied after top layer 200 is heat laminated, preferably directly or by using an adhesive, e.g., as by using a thin sheet 206 of EVA, an about 2-3 mils (about 0.05-0.08 mm) thick sheet of EVA as an adhesive for adhering the thin glass sheet 208 to top layer 200; the glass sheet 208 may be laminated, e.g., when the laminate stack including top layer 200 and rear sheet 300 are heat laminated.

The present arrangement may employ a single ply of such materials that have been pre-laminated with the multilayer of optically transparent front sheet end and with one or more UV resistant back sheets. In the preferred embodiment, the fluorinated polymer top layer 200 serves as direct interface with and encapsulation of the solar cells 400 with or without other layers. Rear sheet 300 preferably employs the same UV resistant melt flowable fluorinated polymers either as an interface with or as a replacement for the conventional EVA encapsulant. With the present interface materials and construction, there is no dwell time under vacuum pressure for curing EVA or cross-linkable polyolefins or equivalent materials, and so processing time is substantially reduced. White fluorinated polymers are preferred, because the UV exposure is reduced thereby and transparency is not necessary. Other UV resistant polymers such as modified polyethylenes and their blends having a melt flow temperature matching that of top layer 200 may also be employed. AI Technology types SG7113, SG7123 and CB7133 melt flowable thermoplastics may be employed for such uses.

The arrangement thought to be most preferred employs a fluorinated thermoplastic polymer top layer 200 without an additional layer such as glass or an EVA/glass combination, thereby to reduce both material and process costs. Rear sheet 300 preferably employs the same material filled with thermally conductive fillers, including, e.g., any zinc oxide, titanium dioxide and other lower cost fillers, or a combination thereof. Because rear sheet 300 is not directly exposed to solar and UV light, and need not be transparent, materials such polyolefins or other polymers that include melt-flowing polymeric molecular crystallites having melting temperature at least above 80° C., and preferably between 80° C. to 200° C., may be employed and be processed with the same process as top layer 200 and rear sheet 300 of the preferred fluorinated thermoplastic polymers.

Electrically conductive patterns 210 preferably comprise an electrically conductive melt flowable adhesive thermoplastic that has good electrical conductivity and melt flows at a temperature that is higher than the highest temperature that a panel 100 employing such adhesive will experience in service. Such adhesives melt flow to make intimate electrical connections, e.g., to the conductors 410 of solar cell 400 as if they had been directly formed, dried, and cured on the sintered conductors 410, as well as to make intimate electrical connections to electrical contact materials and other electrically conductive materials and adhesives. In a typical instance, adhesive patterns 210, 220 would have a thickness of less than about 0.5-5 mils (about 0.01-0.13 mm), and in other instances could have a thickness of less than about 8 mils (about 0.20 mm). Several electrically conductive melt flowable thermoplastic adhesives commercially available from AI Technology, Inc., located in Princeton Junction, N.J., are suitable. For example, AI Technology type TP8090 electrically conductive adhesive melt flows suitably at about 100° C.-110° C., AI Technology type TP8120 electrically conductive adhesive melt flows suitably at about 130° C.-140° C., AI Technology types TP8130 and ST8130 electrically conductive adhesive melt flow suitably at about 140° C.-150° C., AI Technology type TP8140 electrically conductive adhesive melt flows suitably at about 150° C.-160° C., and AI Technology types CB8150, TP8150 and ST8150 electrically conductive adhesive melt flow suitably at about 160° C.-170° C. Melt flowable electrically conductive adhesive is adhesive that is filled with electrically conductive particles, e.g., of silver, gold, plated copper, and the like, so as to become electrically conductive.

Electrically insulating patterns 250 preferably comprise an electrically insulating melt flowable thermoplastic adhesive that melt flows at a temperature that is higher than the highest temperature that a panel 100 employing such adhesive will experience in service, e.g., between 80° C.-200° C., and preferably between 100° C.-160° C. Such adhesives melt flow so as to conform over the edges of solar cell 400 during the process in which conductive adhesive patterns 210 melt flow to make intimate electrical connections, e.g., to the conductors 410 of solar cell 400. Insulating adhesive patterns 250 thus insulate solar cells 400 from undesired contact by conductors 210, 220, 310, 320. Adhesive 250 should have good adhesion to solar cells 400, to electrically conductive adhesives 210, 220, 310, 320, to top layer 200, and to rear sheet 300. In a typical instance, adhesive patterns 250 would have a thickness of about 1-10 mils (about 0.03-0.25 mm). Several electrically insulating melt flowable adhesives commercially available from AI Technology, Inc., located in Princeton Junction, N.J., are suitable. For example, AI Technology type TP7090 electrically insulating adhesive melt flows suitably at about 100° C.-110° C., AI Technology types TP7120, TP7130 and ST7130 electrically insulating adhesive melt flow suitably at about 130° C.-140° C., and AI Technology types TP7150 and ST7150 electrically insulating adhesive melt flows suitably at about 150° C.-160° C.

In addition, and optionally, patterned conductors 210, 220 may include an etched or deposited, e.g., by electroless plating with or without additional electrolytic plating, or printed patterned metal conductor layer on the surface of top sheet 200, e.g., a metal conductor of copper (e.g., 0.25-2.0 oz. copper) with tin, nickel, silver or nickel-silver flash or plating, a deposited silver conductor or printed silver filled ink plated or flashed with a suitable metal to prevent oxidation, e.g., tin, silver, nickel-tin, gold and/or nickel-silver, or may be the electrically conductive melt flowable adhesive screened or printed or otherwise deposited in the desired pattern. Where patterned metal conductors 210, 220 are employed, they may be formed by the same processes employed for making electrical printed circuit boards. With this option, the electrically conductive adhesive need only connect to a portion of the area of bus bars 410 of solar cells 400, e.g., about ten percent (10%) thereof, and insulating adhesive may be employed for the remainder of the area of bus bars 410.

Printing and etching of patterned metal conductors may employ the same methods employed for making electrical printed circuit boards. Patterned adhesives, e.g., adhesives 210, 220, 250, 310, 320, whether electrically conductive or not and whether thermally conductive or not, may be applied by any suitable method, e.g., screening, deposition, printing, inkjet printing and the like.

FIG. 4 is a plan view of an example embodiment of a rear sheet 300 for the example solar cell panel 100 of FIG. 1, FIG. 4A is a side view thereof, and FIG. 4B is a side cross-sectional view thereof. Rear sheet 300 comprises a relatively thin sheet of stable material and preferably melt flowable material for supporting solar cells 400 which are adjacent thereto, e.g., when rear sheet 300 is heat laminated in a solar cell panel 100. Rear sheet 300 comprises a directly bondable electrical circuit structure for providing, in cooperation with top layer 200, heat bondable electrical connections between the solar cells 400.

On one of the generally parallel broad surfaces of rear sheet 300 is a pattern of electrical conductors 310 that are sized and arranged to connect to electrical contacts on the back surface of a solar cell 400 which is placed adjacent to rear sheet 300 when sheet 300 is laminated in a panel 100. The pattern may be made to match all or part of the contact on the back surface of cells 400. Example conductors 310 may include, e.g., two parallel conductors or another configuration for electrically connecting to the contact on the back of solar cells 400. Conductors 310 may be longer or shorted than the size of solar cells 400, however, each conductor 310 has a length that is sufficient to extend beyond the edge of a solar cell 400 so as to present in the space between adjacent solar cells 400 placed against rear sheet 300.

Patterned conductors 310 that are at the end of a row, and so will not be at a space between adjacent solar cells 400 in a row, may have a transverse conductor 320 for making, in cooperation with a conductor 220 of top layer 200 as described, a connection to the solar cell 400 at the same end of an adjacent row of solar cells 400. Thus the series electrical connection of solar cells 400 runs down one row and up an adjacent row, e.g., in opposite directions in adjacent rows. With an even number of rows of solar cells 400, both ends of the series string will naturally be at the same end of rear sheet 300; where there are an odd number of rows of solar cells 400, an additional conductor running the length of layer 200 or sheet 300 may be needed to make connections to both ends of the series string at or near the same end of solar cell panel 100.

The patterned conductor 310 that is at the end of the series connection of solar cells to which an external connection is desired to be made provides an end contact 330 to which an external conductor 340, e.g., an electrical wire 340, may be connected, e.g., as by soldering or by an electrically conductive adhesive, e.g., the same adhesive employed for conductors 310, 320. So as to be solderable, end contact 330 may coated or plated with a solderable metal, e.g., coated or plated or otherwise passivated with, e.g., tin, nickel-tin, silver, nickel-silver or a tin plated copper.

Patterned conductors 310, 320 provide part of an interconnection between adjacent solar cells 400, cooperating with corresponding patterned conductors 210, 220 on top layer 200 when assembled into a panel 100 to complete the interconnections of solar cells 400. Preferably, rear sheet 300 has one or more targets 344 or other fiducial marks 344 thereon to provide reference points relative to patterns 310, 320, both when applying patterns 310, 320, and also relative to top sheet 200 for placing and positioning rear sheet 300 in proper alignment and registration with top layer 200.

Patterned conductors 310 may include an optional transverse conductive part 312 at one end thereof that connects the two parallel conductors 310 in a location that will generally be in the gap or space between adjacent solar cells placed on top layer 200, thereby to provide a "π"-shaped (pi-shaped) conductor 310' and to increase the area of conductor 310 available for making connections to conductors 210, 212 of top layer 200 as described.

Rear sheet 300 is preferably formed of a substrate electrically insulating material suitable for supporting conductors 310, 320 and panel 100. Sheet 300 is typically a relatively thin sheet of a polyethylene terephthalate (PET), which is also known as polyethylene terthalate (PET), polyethylene napthalate (PEN) and/or PVDF or a copolymer thereof and may have any suitable thickness, e.g., may be as thin as 3-5 mils (about 0.09-0.13 mm), and may be of a greater thickness, as may be desired for durability and strength in any particular instance. The electrically conductive melt flowable adhesive material of conductors 310, 320 of rear sheet 300 preferably melt flow at the same temperature as do the melt flowable adhesives of top layer 200, e.g., at a temperature in the range of about 80° C. to about 200° C., and more preferably at a temperature in the range of about 100° C. to about 160° C., which is above the temperature that a panel 100 is expected to experience in service and is below the temperature at which a solar cell may experience an undesirable change or be damaged. Preferably, the same electrically conductive melt flowable adhesive is utilized for all of conductors 210, 220, 310, 320.

Suitable materials for rear sheet 300 include EVA, PET, PVF and/or PVDF polymer materials, e.g., PVDF polymer materials such as KYNAR® type 9301, 2500, 2750, and 2800 fluoro-polymers which are available from Arkema, Inc. having an office in King of Prussia, Pa., and similar PVF and PVDF copolymers, and laminates thereof either alone or with other materials. Preferred materials have good UV resistance and good solvent resistance, and for the layer or layers that are adjacent to solar cells 400, have good adhesion to solar cells and their metal contacts, glass and electrically conductive adhesives. In each instance, all of the melt flowable materials should have similar melt flow temperatures, however, the melt flowable conductive adhesives, e.g., of patterns 310, 320, may have a slightly lower melt flow temperature, e.g., about 10-20° C. lower, than does the substrate, e.g., rear sheet 300, on which they are applied.

Because solar panels 100 when exposed to intense sunlight in warm or hot climates may be heated to relatively high temperatures, e.g., temperatures rising to as high as about 80-110° C., it is desirable to provide for conduction of heat away from solar cells 400 so as to lessen the reduction in their efficiency that occurs with increasing temperature. Rear sheet 300 may be made thermally conductive so as to lessen such temperature rise, and further may be thermally coupled to a metal back sheet having good thermal conductivity. Where sheet 300 includes an EVA, PVF or PVDF material, the EVA, PVF or PVDF material and laminates thereof may be filled or loaded with thermally conductive particles so as to be a thermally conductive material. Such particles may include alumina, zinc oxide, and other thermally conductive electrically insulating particles. Suitable melt flowable thermally conductive sheets 304 include, e.g., types EVAT7355 and EVAT7358 which have thermal conductivities of about 0.5-4.0 Watts per meter degree Kelvin (i.e. Watt/meter° K. or W·m$^{-1}$·K.$^{-1}$), and types EVAT7359, SG7113 and SG7133 which have a thermal conductivity up to about 12-20 Watt/meter° K., all of which are available from AI Technology, Inc. of Princeton Junction, N.J. Rear sheets 300 of the foregoing types may be and preferably are adjacent solar cells 400 for encapsulating solar cells 400, and should have a thickness that is at least the thickness of any connecting tabs that may be on the back sides of solar cells 400.

Such thermally conductive rear sheets 300, 304, when used with a copper or aluminum outer rear backing sheet 308, e.g., an aluminum sheet 308 having a thickness of about 2-5 mils (about 0.02-0.12 mm), or thicker, e.g., about 15 mils (about 0.4 mm), and with a frame, can reduce the junction temperature of the solar cells 400 substantially, e.g., to about 70° C., depending upon their thickness. Metal sheet 308 may be part of a honeycomb, perforated laminate or other structural member, as may be desired for structural strength and/or thermal conductivity. Metal sheet/layer 308 may be patterned and/or coated on its exterior facing surface so as to increase the heat transfer therefrom.

Electrically conductive patterns 310, 320 preferably comprise an electrically conductive melt flowable adhesive that has good electrical conductivity and melt flows at a temperature that is higher than the highest temperature that a panel 100 employing such adhesive will experience in service. Patterns 310, 320, 330 are formed on the surface of rear sheet 300 against which the back sides of solar cells 400 will be disposed. Such adhesives, which may be used wet or after being dried or B-staged, melt flow to make intimate electrical connections, e.g., to the back contact of solar cell 400 as if they had been directly screened and cured thereon, as well as to make intimate electrical connections to electrical contact materials and other electrically conductive materials and adhesives. In a typical instance, adhesive patterns 310, 320 would have a thickness of about 5-8 mils (about 0.13-0.20 mm). Several electrically conductive melt flowable adhesives commercially available from AI Technology, Inc., located in Princeton Junction, N.J., are suitable. For example, AI Technology type TP8090 electrically conductive adhesive melt flows suitably at about 100° C.-110° C., AI Technology type TP8120 electrically conductive adhesive melt flows suitably at about 130° C.-140° C., AI Technology types TP8130 and ST8130 electrically conductive adhesive melt flow suitably at about 140° C.-150° C., AI Technology type TP8140 electrically conductive adhesive melt flows suitably at about 150° C.-160° C., and AI Technology types TP8150 and ST8150 electrically conductive adhesive melt flow suitably at about 160° C.-170° C. Melt flowable electrically conductive adhesive is adhesive that is filled with electrically conductive particles, e.g., of silver, gold, plated copper, and the like, so as to become electrically conductive. Because the conductive adhesive 310, 320 is protected against direct UV exposure, suitable conductive adhesives typically have a melt-flow temperature at about the same melt flow temperature as top layer 200, and may include AI Technology types CB8130 and ESP8450, and the like.

In addition, and optionally, patterned conductors 310, 320 may include an etched or deposited, e.g., by an electroless plating with or without electrolytic plating, or printed patterned metal conductor layer on the surface of rear sheet 300, e.g., a metal conductor of copper (e.g., 0.25-2.0 oz. copper) with tin, silver or nickel-silver flash or plating, a deposited silver conductor or printed silver filled ink plated or flashed with a suitable metal to prevent oxidation, e.g., tin, nickel, nickel-tin, silver, gold and/or nickel-silver, or may be the electrically conductive melt flowable adhesive screened or printed or otherwise deposited in the desired pattern. Where patterned metal conductors 310, 320 are employed, they may be formed by the same processes employed for making electrical printed circuit boards. With this option, the electrically conductive adhesive need only connect to a portion of the contact area of solar cells 400, e.g., about ten percent (10%) thereof, and insulating adhesive may be employed for the remainder of the area thereof.

Printing and etching of patterned metal conductors may employ the same methods employed for making electrical printed circuit boards. Patterned adhesives, e.g., adhesives 210, 220, 250, 310, 320, whether electrically conductive or not and whether thermally conductive or not, may be applied by any suitable method, e.g., screening, stenciling, roll coating, masking, deposition, printing, screen printing, inkjet printing, sheet laminating, and the like.

While all melt flowable materials of top layer 200, rear sheet 300 and the patterned adhesives thereon should have similar melt flow temperatures, it is thought preferable that the melt flow temperatures of the layer directly facing the incoming sunlight have a slightly higher melt flow temperature than the layer or layers behind it. For example, if rear sheet 300 is a PVDF layer that melt flows at about 135° C.-150° C., e.g., as does a KYNAR® 2750 PVDF material and suitable blends thereof, then top layer 200 may be a PVDF layer that melt flows at about 120° C.-130° C., e.g., as does a KYNAR® 2500 PVDF material and suitable blends thereof, and electrically conductive adhesives such as AI Technology types TP8130, ST8130, TP8140 and ST8150 adhesives modified for such polymers may be employed. While fluorinated thermoplastic polymers and their blends are preferred, other UV resistant polymers that melt flow or melt bond at a temperature between about 80-200° C. that is close to the melt flow temperature of top layer 200 may be employed.

Figure 6:
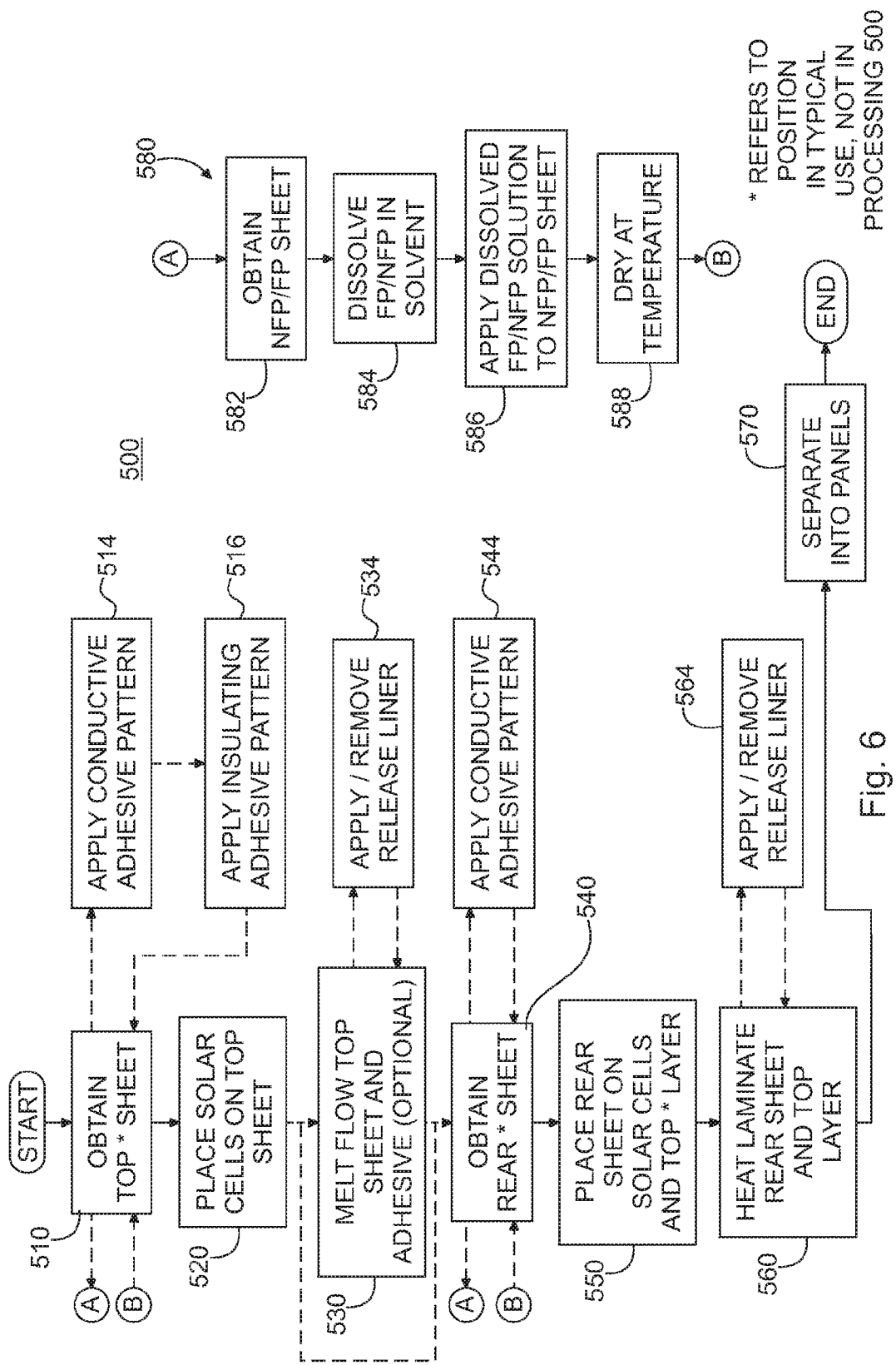
FIG. 6 is a schematic diagram of a process flow chart illustrating an example embodiment of a method for making an example solar cell panel.

FIG. 5 includes FIGS. 5A-5E which illustrate various steps in a method or process 500 for making the example solar cell panel 100 of FIG. 1 and FIG. 6 is a schematic diagram of a process flow chart illustrating an example embodiment of a method 500 for making the example solar cell panel 100. Therein, only a portion of the solar cells and elements of panel 100 are shown. While references such as top layer 200, rear sheet 300, the front and back of solar cells 400 and the like may be used in describing process 500, e.g., for consistency with description of such articles, terms such as top, rear, front, back and the like do not necessarily describe positions or orientations of elements in process 500.

Unlike conventional solar cell panel assembly processes which typically start with assembling solar cells into strings or modules, followed by mounting the strings or modules with the back side of the solar cells on a back plate, and then encapsulating and covering the back plate and the front of the solar cells with a transparent front pane, process 500 begins with a melt flowable top or front sheet having melt flowable conductors thereon, placing the solar cells on the top sheet with their front sides adjacent the top sheet, and placing the rear sheet over the solar cells. The stack is heat laminated to melt flow the top sheet and the melt flowable conductors to make interconnections between solar cells and encapsulate the solar cell panel. This process could be referred to as "reflow molding" of the solar cells 400 into a solar panel 100.

Advantageously, process 500 avoids the costly and difficult conventional steps of soldering solar cells into series strings, of transferring and mounting the series strings of solar cells onto the back plate, and of batch processing for vacuum laminating the panels. Also advantageously, process 500 and solar cell panel 100 are compatible with readily available standard solar cells and with certain materials of proven performance, thereby reducing technical and reliability risk. In addition, only a heat laminating process need be employed in assembling solar cell panels 100, other processes such as soldering, which for the interconnection of solar cells can introduce stress and lead to potential failure, are avoided.

In FIG. 5A, step 510 includes obtaining 510 the melt flowable electrically insulating top sheet 200 as described, which, if the top sheet does not already have the pattern 210, 220 of melt flowable electrically conductive adhesive thereon, may further include the steps of applying 514 the pattern of melt flowable electrically conductive adhesive 210, 220 to one surface of the melt flowable top sheet and of applying 516 the pattern of melt flowable electrically insulating adhesive 250 to the one surface of the melt flowable top sheet. Top sheet 200 is thus ready to receive solar cells 400 thereon.

In FIG. 5B, solar cells 400 are placed 520 on the conductive adhesive pattern with their front (light sensitive) side against the conductive adhesive pattern 210 and top sheet 200. Placing 520 includes aligning the solar cells relative to conductive adhesive pattern 210 so that the part of the conductive adhesive pattern that corresponds to the electrical contact on the front of the solar cell is adjacent the electrical contact of the solar cell for making electrical connection there between. The part of the conductive adhesive pattern 210 that is to eventually contact the conductive adhesive pattern 310 of the rear sheet 300 is at this step exposed at one edge of the solar cell, e.g., is not covered by the solar cell, and the opposite edge of the solar cell is partially covering the insulating adhesive 250. Thus, parts of both the electrically conductive adhesive 210 and the electrically insulating adhesive 250 are exposed at opposite edges of the solar cell 400.

Typically, the adhesive material of top sheet 200 is sufficiently tacky so as to retain solar cells 400 pressed against top sheet 200 on top sheet 200, however, either top sheet 200 or solar cells 400 or both may be heated so as to increase tackiness to the extent desired or necessary to retain solar cells 400 on top sheet 200, e.g., to about 60° C. Top sheet 200 may have recesses or wells sized for receiving solar cells 400 therein. Preferably, top sheet 200 has one or more targets 244 or other fiducial marks 244 thereon to provide reference points relative to adhesive patterns 210, 220, 250 for use both when applying patterns 210, 220, 250 and when positioning solar cells 400 on top sheet 200.

In FIG. 5C, top sheet 200 and solar cells 400 are heat laminated 530 at a temperature and pressure sufficient to melt flow the materials of top layer 200 and adhesives 210, 220, 250 thereon, so that solar cells 400 are pressed into the melt flowed materials and adhesives. As a result, solar cells 400 are embedded in top layer 200 and have conductive adhesive connections 210 made to the conductive grid contacts 410 on their front sides. Insulating adhesive 250 melt flows to conform to the edges of solar cells 400 to insulate these edges from melt flowed conductors 210. Top layer 200 with solar cells 400 embedded therein preferably has relatively planar front and rear surfaces and has a relatively uniform thickness, and the back surfaces of solar cells 400 and the electrical contacts thereon are exposed, as are contacts provided by the portions of electrically conductive adhesive 210 that extend beyond the edges of solar cells 400, for subsequently making electrical connection thereto. A relatively stiff backing panel or panels may be employed when heat laminating top layer 200 for defining the relatively planar front and/or rear surfaces thereof.

Heat laminated top layer 200 may be utilized as a module of solar cells 200 wherein the solar cells 400 are embedded in an optically transparent layer 200 and wherein connections may be made to both the fronts and backs of solar cells 400 at a relatively planar surface at the rear of heat laminated top layer 200. While modules 200 may include all of the solar cells 400 embedded into the heat laminated top layer 200, that top layer 200 may be separated into smaller modules having lesser numbers of solar cells 400, e.g., as in separating step 570, as may be desired.

Step 530 may include placing 534 a release liner 536 against top layer 200 and solar cells 400 prior to heat lamination 530 so that top layer 200 does not adhere to the laminating roller or plate, whether or not such roller or plate is heated, and removing the release liner 536 following the laminating 530. A TEFLON® release liner or other suitable release liner material may be employed and is preferably slightly larger than is top layer 200. Preferably, a release liner 536 is utilized against the side of top layer 200 that has the back sides of solar cells thereon, and a release liner may also be utilized against the other side of layer 200 as well. In step 560, a relatively stiff backing may be placed against the exposed side of release liner 536 and/or a glass sheet may be placed against the exposed side of top sheet 200, e.g., opposite the front sides of solar cells 400.

At this stage following step 530, or following step 544 where adhesive patterns 310 and/or 320 is applied to top layer 200, top layer 200 is suitable for providing articles including one or more solar cells and/or providing encapsulated single or plural solar cells 400 for inclusion into other articles. In this instance, top layer 200 and solar cells 400 thereon are heat laminated 530 to melt flow into the top layer structure as shown, however, where a panel 100 is to be made, heat laminating step 530 may be omitted and top layer 200, solar cells 40 and rear sheet 300 may all be heat laminated 560 in one operation. Thus, heat laminating 530 may be optional and one heat lamination 560 may be necessary.

In FIGS. 5D and 5E, step 540 includes obtaining 540 the electrically insulating rear sheet 300 as described, which, if the rear sheet 300 does not already have the pattern 310, 320 of melt flowable electrically conductive adhesive thereon, may further include the steps of applying 544 the pattern 310, 320 of melt flowable electrically conductive adhesive to one surface of the rear sheet 300. It is noted that conductive adhesive patterns 310, 320 may be applied to rear sheet 300 before sheet 300 is aligned with and laminated to top layer 200, or may be applied to top layer 200, e.g., on the side thereof having the backs of solar cells 400 exposed. Rear sheet 300 is thus ready to be assembled to top layer 200 from step 530 and is aligned with and placed against 550 top layer 200.

With rear sheet 300 and top layer 200 in proper alignment 550, the portions of conductive patterns 310, 320 that make connection to the back contact of solar cells 400 are adjacent to the back contacts of solar cells 400 and the portions of electrically conductive adhesive patterns 310, 320 that are to make connection to the exposed portions of electrically conductive adhesive patterns 210, 220 of top layer 200 are adjacent the exposed portions of electrically conductive adhesive patterns 210, 220.

Step 560 includes heat laminating 560 rear sheet 300 and top layer 200 at a temperature and pressure that will melt flow at least top layer 200 and adhesive patterns 210, 220, 250, 310, 320 thereof to adhere to the back contacts of solar cells 400 and to rear sheet 300, which may also be of a melt flowable material, to form solar panel 100 as shown. Preferably, heat laminating 560 includes heated rolling lamination 560 wherein the heat lamination proceeds essentially in a line (rolls) across a top layer 200 and/or a solar cell panel 100 so that all air or other gas is pressed out ahead of the laminating edge and tends not to become trapped or form bubbles or voids, which can lead to de-lamination, as can occur with press or vacuum laminating.

Specifically, in step 560 the exposed portions of electrically conductive thermoplastic adhesive patterns 210, 310 are adjacent and overlapping, and melt flow together to complete a permanent electrical connection between the front contact of each solar cell 400 and the back contact of the adjacent solar cell 400. Further, in step 560 the exposed portions of electrically conductive thermoplastic adhesive patterns 220, 320 are adjacent and overlapping, and melt flow together to complete a permanent electrical connection between the front contact of a solar cell 400 at the end of one row and the back contact of the solar cell 400 in the row adjacent thereto. At the same time, thermoplastic top layer 200 and insulating thermoplastic adhesive patterns 250 melt flow in step 560 to adhere to the portions of rear sheet 300 that do not have conductive adhesive 210, 220, 310, 320 thereon, thereby to form a continuous and substantially void-free interface between top layer 200 and rear sheet 300 of solar panel 200.

Step 560 may include placing 564 a release liner 566 against rear sheet 300 prior to heat lamination 560 so that rear sheet 300 does not adhere to the laminating roller or plate, whether or not such roller or plate is heated, and removing the release liner 566 following the laminating 560. A TEFLON® release liner or other suitable release liner material may be employed and is preferably slightly larger than is solar panel 100. Preferably, a release liner 566 is utilized against the rear sheet 300, and a release liner may also be utilized against top layer 200 as well.

Because all of the layers 200, 300 and the adhesives 210, 220, 250, 310, 320 adjacent solar cells 400 are thermoplastic and do not require complete cross-linking for strength, the heat laminating step 530, 560 need only last for a sufficient time to heat and melt flow these thermoplastic materials, which time can be quite short, e.g., typically about 1-3 minutes. No extended curing time at elevated temperature is required; "curing" is complete when the temperature drops sufficiently below the melt flow temperature of the thermoplastic materials. As a result, many more solar cell panels 100 can be processed in a given period of time than is the case for conventional solar panels which require long cure times, e.g., typically 15-30 minutes, to allow for complete cross-linking of polymer materials for strength. This feature of the present arrangement and method produces a significant advantage in the efficient utilization of laminating equipment, e.g., processing up to 20-60 units per hour as contrasted to the 2-4 units per hour with vacuum lamination of conventional solar panels, thereby to reduce unit production time and cost.

In addition, because the present structure and method can employ roll lamination 530, 560, as may be preferred, bubbles and voids tend to be squeezed out by the rolling action and so vacuum lamination, and the attendant cost of vacuum lamination equipment, can be avoided. However, the present arrangement and method can employ vacuum lamination in steps 530 and/or 560 if desired, or if vacuum lamination equipment is available. In this instance, the processing time per unit is still substantially less than for a conventional panel, and so significant improvement in efficiency and reduction in cost can be expected. Should one or more layers in the present arrangement include EVA or another cross-linking polymer, the laminating steps need not be any longer than needed to melt flow the thermoplastic materials, and any cross-linking needed can occur in subsequent post-curing without vacuum.

Figure 7:
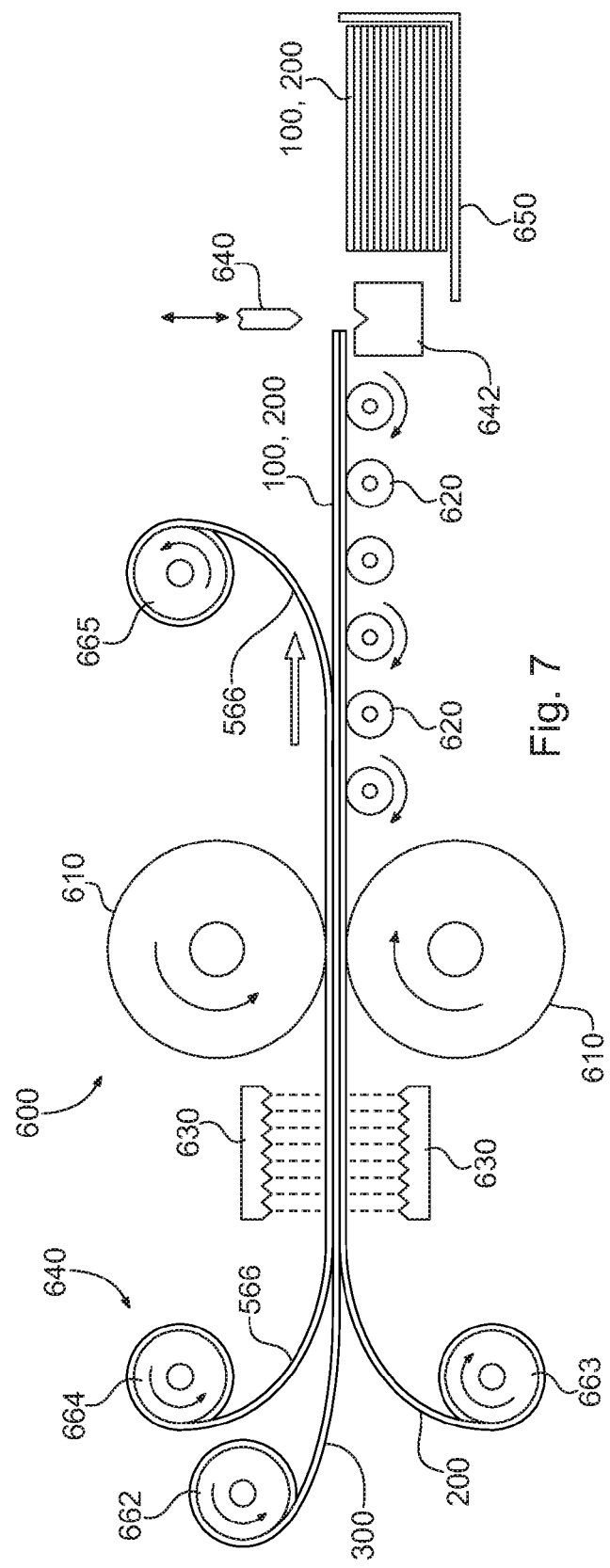
FIG. 7 is a schematic diagram illustrating an example roll laminating process useful with the example solar cell panel.

FIG. 7 is a schematic diagram illustrating a roll laminating apparatus 600 useful for making solar cell panels 100, e.g., for performing steps 530 and/or 560 of method 500. Laminating rollers 610 are spaced apart by a spacing that is substantially the desired thickness of the laminated product, e.g., laminated top layer 200 in step 530 or laminated solar panel 100 in step 560. Typically, rollers 610 are heated, e.g., to a temperature higher than the desired melt flow temperature, and are driven to rotate at a rate or rotation suitable for moving top layer 200 and/or solar panel 100 through at a speed at which they are raised to the desired melt flow temperature for heated roll laminating.

Melt-lamination apparatus 600 may employ suitable rubberized pressure rolls which can form laminated encapsulated modules and panels having minimal voids or with no voids. Encapsulation and the minimizing of interfacial voids may further be enhanced by laminating at a higher temperature, e.g., at a temperature above the melting points of the crystallites of the melt flowable thermoplastic polymer and/or with a slightly greater thickness. Alternatively, a standard batch based vacuum lamination process can also be used. The enhancement of instant melt-flow and encapsulation of the present arrangement eliminates the need for the extended dwell time at temperature for chemical curing of EVA type or other cross-linking encapsulants.

Where a laminating speed is desired that is higher than a speed at which heated laminating rollers 610 can transfer heat to top layer 200 and/or solar panel 100 quickly enough to raise it to the desired melt flow temperature, top layers 200 and/or solar panels 100 to be laminated may pass one or more heating elements 630, e.g., radiant heating elements 630 or heated surface 650, so as to be heated substantially to the melt flow temperature prior to entering heated laminating rollers 610 wherein the melt flowable materials thereof melt flow from being heated to the melt flow temperature and are heat laminated.

A plurality of idler rollers 620 may be provided along a path leading away from heated rollers 610 to support the heated laminated top layer 200 and/or solar panel 100 after heat lamination while it cools to a temperature below the melt flow temperature of the various melt flowable elements thereof at which it can be removed from being supported, e.g., by rollers 620. The length and/or width of the path of rollers 620 may be substantially longer than the length and width of a top layer 200 and/or of a solar panel 100 so that plural top layers 200 and/or plural solar panels 100 may be moved away from heated rollers 610 and supported by rollers 620 while they cool, whereby the time needed for a top layer 200 and/or a solar panel 100 to cool sufficiently doesn't delay the heat laminating of subsequent top layers 200 and/or solar panels 100.

Laminated top layers 200*eg* whether for use as solar cell modules 200 or as top layers 200 for lamination with a rear sheet 300, and/or laminated solar cell panels 100 may be collected in any convenient manner, e.g., a container 650 may be provided, for storage, packaging, and/or shipment thereof. Optionally, container 650 may have a weight responsive base that when empty is substantially at the level of rollers 620 and that moves downward as solar panels 100 are stacked thereon, as may be provided by one or more supporting springs or by an electrical or other mechanical drive. Optionally, the release liner may be left in place on a laminated top layer 200 and/or a laminated solar panel 200 so as to protect the surface thereof, e.g., for stacking for storage, packing, and/or shipment, and may be removed prior to use.

Roll lamination of top layers 200 and/or solar panels 100 may employ a relatively stiff or rigid backing sheet, for supporting the top layer 200 or panel 100 during roll lamination, thereby to define a plane to which the melt flowed laminated product will substantially conform. Examples include, e.g., a sheet of metal such as aluminum or thermoset panels such as epoxy or a laminate that maintains its flatness and shape at the melt flow temperature employed for lamination of modules 200 and/or panels 100, For example, a backing sheet may be employed against release liner 536, e.g., for defining a plane to which the back surfaces of solar cells 400 and melt flowed top sheet 200 including adhesive patterns 210 thereon conform, e.g., against release liner 536.

Heat laminated top layer 200 may be utilized as a module of solar cells 200 embedded in an optically transparent layer 200 wherein connections may be made to both the fronts and backs of solar cells 400 at a relatively planar surface at the rear of heat laminated module 200. Top layer 200 may be separated into smaller modules having lesser numbers of solar cells 400, e.g., as in separating step 570, as may be desired.

Where laminating 560 is to be performed by a continuous heated roll lamination wherein materials to be laminated are supplied from supply rolls 660, both top layers 200 and rear sheets 300 may be provided from rolls or strips thereof, and the continuous laminating 560 processing results in a relatively long sheet or strip of solar panels 100. In that instance, the long sheet of solar panels 100 may be cut 570 or otherwise separated 570 into individual solar panels 100, e.g., by a vertically movable blade 640 and an anvil 642, and may then be collected in container 670.

Where laminating 560 is to be performed by a heated roll lamination wherein materials to be laminated are supplied as relatively long and/or large sheets, e.g., top layers 200 and/or rear sheets 300 may be provided as large sheets, the continuous laminating 560 processing results in a relatively long and/or large sheet of laminated top layers 200 and/or solar panels 100. In that instance, the long and/or large sheet of top layers 200 and/or solar panels 100 may be cut 570 or otherwise separated 570 into individual solar cell modules and/or solar panels 100, e.g., by a vertically movable blade 640 and an anvil 642, and may then be collected, e.g., in container 670.

Apparatus 600 may be provided with supply rolls 660 including supplies of top layer 200 from roll 662 and rear sheet 300 from roll 663 which come together as a laminate stack and are fed into heated rollers 610. Supply rolls 660 may also include one or more rolls 664 of release liner that supply release liners that overlie surfaces of top layer 200 and/or solar cell panels 100 prior to the heated roll lamination thereof into top layer 200 and/or solar cell panels 100 and further may be provided with one or more take up reels 665 that wind the release liner removed from top layer 200 and/or solar cell panels 100 following the heated roll lamination thereof.

FIG. 8 includes FIGS. 8A, 8B and 8C each of which is a partially cut away view of part of an example solar cell panel 100 showing an example interconnection arrangement 210, 220, 310, 330 thereon. Therein, examples of solar cells 400 having different grid patterns on their front (active) surfaces are employed in a solar cell panel 100 according to the present arrangement and method.

In FIG. 8A, solar cells 400 have a single elongated bus bar 410 with a plurality of narrow elongated conductors extending perpendicularly thereto in both directions on the front surface thereof. These are typically sintered metal conductors. Electrically conductive adhesive patterns 210 have a corresponding single elongated conductor substantially overlying bus bar 410. So as to minimize covering (reducing) the active area of solar cell 400, bus bars 410 are typically made as small in area as possible and electrically conductive patterns 210 preferably are correspondingly minimized to substantially coincide with bus bars 410. Top layer 200 electrically conductive adhesive patterns 220 typically are made wider where not adjacent the front surfaces of solar cells 400 to as to reduce electrical resistance. Rear sheet 300 electrically conductive adhesive patterns 310, 320 may have an elongated rectangular shape or other desired shape, but typically may be made wider to as to reduce electrical resistance. Electrically conductive adhesive patterns 220, 320 may be routed to any desired locations, e.g., close together or apart at the narrow end of solar panel 100 or at one or both longer sides thereof, at which connections to external circuitry may be made, e.g., as by wires 240, 340.

In FIG. 8B, solar cells 400 have double elongated bus bars 410 with a plurality of narrow elongated conductors extending perpendicularly thereto in both directions on the front surface thereof. These are typically sintered metal conductors. Electrically conductive adhesive patterns 210 have corresponding double elongated conductors substantially overlying double bus bars 410. So as to minimize covering (reducing) the active area of solar cell 400, bus bars 410 are typically made as small in area as possible and electrically conductive patterns 210 preferably are correspondingly minimized to substantially coincide with bus bars 410. Top layer 200 electrically conductive adhesive patterns 220 typically are made wider to as to reduce electrical resistance. Rear sheet 300 electrically conductive adhesive patterns 310, 320 may have an elongated rectangular shape or other desired shape, e.g., may have single or double conductors, but typically are made wider to as to reduce electrical resistance. Electrically conductive adhesive patterns 220, 320 may be routed to any desired locations, e.g., close together or apart at the narrow end of solar panel 100 or at one or both longer sides thereof, at which connections to external circuitry may be made, e.g., as by wires 240, 340.

In FIG. 8C, solar cells 400 have no bus bar or other sintered metal conductors thereon, but are typically covered in a thin transparent electrically conductive layer, e.g., a layer in indium-tin oxide. In this instance, electrically conductive adhesive patterns 210 may have single or double elongated bus bars 210 with a plurality of narrow elongated conductors 214 extending perpendicularly thereto in both directions on the front surface thereof, thereby to become melt flowed and electrically connected to the front surface of solar cells 400 when top layer 200 is heat laminated, thereby to serve the same function as the bus bars and other thin conductors of the solar cells 400 described above. So as to minimize covering (reducing) the active area of solar cell 400, electrically conductive patterns 210 preferably are made as small in area as possible. As above, top layer 200 electrically conductive adhesive patterns 220 and rear sheet conductors 310, 320 are typically made wider to as to reduce electrical resistance. Rear sheet 300 electrically conductive adhesive patterns 310, 320 may have an elongated rectangular shape or other desired shape, e.g., may have single or double conductors. Also as above, electrically conductive adhesive patterns 220, 320 may be routed to any desired locations at which connections to external circuitry may be made.

Preferably, electrically conductive thermoplastic adhesive patterns 210 include a metal electrical conductor. In this instance, a patterned metal conductor pattern may be formed on a transparent top sheet 200, e.g., a sheet of AI Technology type TP7090, TP7120, TP7130, SG7130, SG7150 or TP7150 thermoplastic insulating adhesive, e.g., by pattern etching as in printed circuit boards or by depositing metallizing directly on sheet 200, e.g., by electroless or electrolytic plating, or by another suitable process. Preferably the metallization is protected by a tin, nickel, nickel-tin, nickel-silver or other precious metal finish, and the pattern 210, 220 of electrically conductive thermoplastic adhesive, e.g., of AI Technology type TP8090, TP8120, TP8150 or ST8150 thermoplastic electrically conductive adhesive may be deposited thereon. The electrically conductive adhesive is formed in lines of a sufficient width, e.g., about 2 mils (about 0.05 mm) or more, which is at least the width of the fine metallization lines.

FIG. 9 includes FIGS. 9A-9B which illustrate example steps in the process or method for making a solar cell panel 100 employing a tabbed solar cell 400. Tabbed solar cells 400 have one or more elongated solderable metal connection tabs 415 soldered to the one or more conductive bus bars 410 on the front thereof and extending beyond a first edge thereof, and has one or more solderable elongated metal connection tabs 425 soldered to the conductive contact or contacts on the back of solar cell 400 and extending beyond an edge opposite the first edge thereof. Metal connection tabs 415, 425 are typically silver or tinned copper so as to be solderable, e.g., for assembly of solar cells 400 into series strings. Thus, metal conductors 415, 425 are available outside the edges of tabbed solar cells 400 for making electrical connections thereto.

In FIG. 9A, top sheet 200 has melt flowable electrically conductive adhesive patterns 210, 220 located thereon in positions adjacent to where connection tabs 415 of solar cells 400 will be located for making electrical connection thereto. Top sheet 200 may also include melt flowable electrically insulating adhesive patterns 250 for insulating the edges of solar cells 400 as described.

Top sheet 200 may have wells 202 therein for receiving solar cells 400 therein, as illustrated, and wells 202 may have features into which tabs 415 will reside when solar cells 400 are placed on sheet 200 in which instance electrically conductive adhesive patterns 210, 220 on the surface of top sheet 202 may extend into wells 202 thereof for assuring connection to tabs 415. Even if wells 202 are not provided, connection tabs 415 are substantially stiffer than are the melted melt flowable materials of top sheet 200 and of adhesives 210, 220, 250 thereon so that the melt flowable materials will flow around tabs 415 and tabs 415 will become embedded in top layer 200 and allow connections to be made to conductors 210, 220 without introducing substantial stress on solar cell 400.

Rear sheet 300 has melt flowable electrically conductive adhesive patterns 310, 320 located thereon in positions adjacent to where connection tabs 425 of solar cells 400 will be located for making electrical connection thereto and to connection tabs 415 via electrically conductive adhesive patterns 210, 220 when top layer 200 and rear sheet 300 are stacked and heat laminated together to melt flow top layer 200 including adhesive patterns 210, 220, 250 and rear sheet 300 including adhesive patterns 310, 320 to form solar panel 100.

In FIG. 9B, heat laminated solar cell panel 100 is seen to have solar cells 400 embedded in top layer 200 with melt flowable electrically conductive adhesives having melt flowed around solar cell connection tabs 415, 425 to make an electrical connection therebetween, whereby adjacent solar cells 400 are connected in series.

FIG. 10 is a side sectional view of an example embodiment of an example solar cell panel 100, FIG. 10A is a side cross-sectional view of a portion thereof, and FIG. 10B is a side view of a tabbing component 430 thereof. Solar panel 100 includes plural solar cells 400 encapsulated by heat lamination between a transparent melt flowable thermoplastic top sheet 200 and a layered or laminated rear sheet 300 which includes a melt flowable thermally conductive electrically insulating thermoplastic layer 300 that is backed by a thin metal layer 308 which is between two thin fluoro-polymer layers. Electrical connections to the front and backs of solar cells 400 may be made by any of the arrangements described, and preferably employ a tab 430 described below.

The edges of solar cell panel 100 are supported by, and are preferably surrounded by, a frame 110, e.g., an aluminum frame 110, that typically has a pair of inwardly extending flanges 112 that bear against the front and rear surfaces of laminated layers 200, 300-308 to support the laminated layers at their edges. Preferably an edge seal 115 is provided at assembly of laminated layers 200, 300-308 and frame 110 to seal the edges of laminated layers 200, 300-308 within frame 110 between flanges 112.

In a typical panel 100, top layer 200 may have a thickness of about 12-15 mils (about 0.25-0.38 mm or about 250-375 microns) and preferably be of a type SG7130 melt flowable transparent electrically insulating thermoplastic available from AI Technology, which may be employed as encapsulant and protection so that a glass sheet may be omitted. If a glass or other front sheet is desired or required, top layer 200 of type SG7130 and similar thermoplastics can be laminated therewith either before or after being laminated with solar cells 400 and/or rear sheet 300, or top layer 200 may be formed on the glass or other front sheet.

Rear sheet 300 may be of the same material as top sheet 200 or may be of AI Technology type SG7120 melt flowable electrically insulating thermoplastic or of AI Technology type SG7133 or type CB7135 melt flowable thermally conductive electrically insulating thermoplastic as may provide an advantage in lowering the operating temperature of solar cells 400. Thermally conductive thermoplastics like SG7133 and CB7135 have good UV resistance and so may be used as an outer rear coating 304. The foregoing thermoplastic polymers have good adhesion to the solar cells 400, and do not require cross linking for strength and so may be processed efficiently, e.g., in about one tenth the time of a conventional vacuum laminated panel, as described above. These materials also have substantial strength and so permit the overall rear sheet 300 to be thinner and lighter than would be necessary with conventional solar panel backing materials. Other materials, such as PET, HDPE, PVF, EVA, EPDM and the like may be employed behind rear layer 300 where they do not contact solar cells 400.

Electrically conductive connections to solar cells 400 may include AI Technology types ST8130, ST8133 and/or ST8150 melt flowable electrically conductive thermoplastic adhesives applied to sheets 200, 300 in any suitable manner. Fluoro-polymer layers 304 may be AI Technology type SG7120, SG7130, SG7133 or SG7150 material which may be laminated with a metal layer, e.g., an aluminum or copper sheet, to provide a back sheet 304-308 for solar cell panels. The foregoing thermoplastic polymers have good adhesion and low contact resistance to the metal contacts of solar cells, and do not require cross linking for strength and so may be processed efficiently as described above.

In FIG. 10A are shown details of interconnections between the front contact 410 of one solar cell 400 and the back contact of an adjacent solar cell 400 that employ a tabbing material 430 as shown in FIG. 10B. Tabbing material 430 is a layered structure having a central layer of a thin metal conductor 432, e.g., a copper foil or sheet of between about ¼ ounce and 2.0 ounce weight (or a thickness of about 0.7 mil to 3 mils, or about 0.02 to 0.08 mm) and of between about 0.04 and 0.2 inch (about 1 and 5 mm) in width, and having melt flowable electrically conductive thermoplastic adhesive 434 on both surfaces of metal core 432. Preferably, the metal foil 432 is covered by an oxidation resistant finish, e.g., a tin, silver, nickel, nickel-tin, or nickel-silver plating.

Electrically conductive adhesive 434 may extend continuously on either or both surfaces of metal core 432, or may be on only a portion of the surfaces thereof where the electrical conductivity of the metal core 432 and of the electrically conductive adhesive 434 is sufficient to carry the expected current with acceptable loss. In one embodiment employing AI Technology type ST8130, ST8133 and/or ST8150 melt flowable electrically conductive thermoplastic adhesive, only about ten percent (10%) of the surface of metal conductor 432 need be covered by the melt flowable electrically conductive thermoplastic adhesive 434 and the remainder may be covered by an insulating adhesive 436, e.g., AI Technology type SG7120, and/or SG7130 electrically insulating thermoplastic adhesive. Typically, one area of electrically conductive adhesive 434, e.g., a circle diameter or square of about 1-8 mils (about 0.02-0.2 mm), is employed for each one or two or five, or even each ten, equivalent areas of insulating adhesive.

As a result, the thickness of tabs 430 may be reduced from the typical 8-10 mils (~0.25 mm) of soldered tinned copper tabs to about 2-5 mils (about 0.05-0.13 mm) with tabbing 430, thereby to advantageously allow for correspondingly reducing the thickness of top layer 200, e.g., to about 5 mils (about 0.13 mm), and thereby to reduce the weight and the cost of materials needed for solar cell panel 100. One example tab 430 has a copper core 432 of about 1.5 mils (about 0.04 mm) thickness and thermoplastic adhesive layers 434, 436 of about 1 mil (about 0.025 mm) thickness so that the total thickness of tab 430 is about 3.5 mils (about 0.09 mm). Another example tab 430 has a copper core 432 of about 0.7 mils (about 0.02 mm) thickness and thermoplastic adhesive layers 434, 436 of about 1 mil (about 0.025 mm) thickness so that the total thickness of tab 430 is about 2.7 mils (about 0.07 mm).

Lengths of tabbing 430 shorter than the dimension of solar cells 400 may be employed in the place of conductor patterns 210 of top sheet 200 and of conductor patterns 310 of rear sheet 300 as in the left hand portion of FIG. 10A wherein melt flowing of adhesives 210, 310 join when top layer 200 or when layers 200, 300 are heat laminated to form connections between tabs 430, thereby to connect the front contact of a solar cell 400 to the back contact of another solar cell 400 as described. Such tabs 430 may be made on top layer 200 and rear sheet 300 as described, or may be applied to solar cells 400 prior to their being laminated to top sheet 200 and rear sheet 300, or may be made on top layer 200 as described and applied to the backs of solar cells 400 prior to their being laminated to rear sheet 300.

Alternatively, lengths of tabbing 430, e.g., longer than the dimension of solar cell 400 and shorter than twice that dimension, may be used and applied to solar cells 400 in similar manner to soldered metal tabs to connect the front contact of a solar cell 400 to the back contact of another solar cell 400. Where tabbing 430 lacks sufficient tackiness to adhere to the contacts of solar cells 400 as required for the handling thereof, tabs 430 and/or solar cells 400 may be heated so as to obtain sufficient adhesion for handling, e.g., by touching tab 430 with a heated tool such as a soldering iron heated to a temperature sufficient to melt flow adhesive 434, 436, about 140-150° C. as compared to about 250° C. needed for soldering.

For certain uses it may be desirable to employ laminate sheets to provide protection for the front and/or back sides of solar cells 400 and panels 100. Where a layer and/or sheet comprises a laminate of a layer of a fluorinated polymer (FP), e.g., PVF and/or PVDF, and/or co-polymers thereof, with a layer or sheet of non-fluorinated polymer (NFP), e.g., PET, EVA, PEN, and/or polyimide, suitable adhesion promotion should be employed to avoid limited bonding and/or easy de-lamination. Either top layer 200 and/or rear sheet 300, or another layer or sheet applied thereto may comprise a laminate of a layer of, e.g., PVF and/or PVDF, and/or co-polymers thereof, with a layer or sheet of a non-fluorinated polymer, suitable adhesion promoting between layers may be provided by employing a suitable solvent having a sufficiently low boiling point. While an adhesion promoting layer may be employed, such layer may not be needed where a suitable adhesion promoting process is employed, thereby simplifying manufacture.

For example, an optional sub-process 580 which is part of process 500 of FIG. 6 may be employed. Process 580 may be a part of step 510 and/or of step 540 of process 500 wherein a layer or sheet of a non-fluorinated polymer (NFP), e.g., EVA or PET, is obtained. The fluorinated polymer and/or co-polymer (FP), e.g., PVF or PVDF, may be dissolved into solution with a solvent, e.g., a N-methyl-2-pyrrolidone (NMP), a ketone such as methyl-ethyl ketone (MEK), acetone, or other polar solvent to make a solution that is as thick as possible for being applied 586 as a coating, e.g., as by drawing down or spraying. Lower boiling point (LBP) solvents are preferred so as to speed completion of the drying process 588. The solution is then drawn down, cast, sprayed or otherwise applied 586 to coat a substrate polymer layer or sheet, e.g., of PET, PEN, or polyimide, to the desired thickness, e.g., a thickness of about 25-500 microns (about 0.025-0.5 mm, or about 1-20 mils), followed by drying 588 to drive out the solvent at a suitable rate that avoids bubble or void creation, e.g., drying 588 at ambient temperature or at a higher temperature, e.g., a temperature below its flash point. One or more FP layers may be applied to the NFP substrate, or a thicker FP layer may be obtained, by repeating steps 584-588 as may be desired, wherein the layers applied may be of the same fluorinated polymer or of different fluorinated polymers. The solvent should completely evaporate before heat lamination is performed.

The foregoing process 580 may also be employed for providing layers of non-fluorinated polymers on a fluorinated polymer substrate. As above, process 580 may be a part of step 510 and/or of step 540 of process 500 wherein a layer or sheet of a fluorinated polymer (FP), e.g., PVF or PVDF or their copolymers and blends thereof, is obtained. The non-fluorinated polymer and/or co-polymer (NFP), e.g., PET or EVA, may be dissolved into solution with a solvent, e.g., a MEK or NMP or other suitable solvent, to make a solution that is as thick as possible for being applied 586 as a coating, e.g., as by drawing down or spraying. Lower boiling point (LBP) solvents are preferred so as to speed completion of the drying process 588. The solution is then drawn down, cast, sprayed or otherwise applied 586 to coat a substrate polymer layer or sheet, e.g., of PVF or PVDF or blends or copolymers thereof, to the desired thickness, e.g., a thickness of about 25-500 microns (about 0.025-0.5 mm, or about 1-20 mils), followed by drying 588 to drive out the solvent at a suitable rate that avoids bubbling or void creation, e.g., at ambient or a higher temperature. One or more NFP layers may be applied to the FP substrate, or a thicker NFP layer may be obtained, by repeating steps 584-588 as may be desired, wherein the layers applied may be of the same fluorinated polymer or of different fluorinated polymers.

The foregoing process 580 may also be employed for providing layers of filled polymers, e.g., pigmented, electrically conductive, and/or thermally conductive fluorinated polymers, either on a non-fluorinate polymer substrate or on a fluorinated polymer substrate.

Suitable melt flowable materials for rear sheets 300 may also include laminated back sheets comprising a sheet of PET laminated between sheets of modified PVDF or blends or copolymers thereof, such as SOLARBLOC™ UV resistant back film laminates, e.g., type SG7133, available from AI Technology, Inc. located in Princeton Junction, N.J. AI technology back film laminates such as types BF7110 and BF7140 laminates melt flow at a temperature above about 110° C. and above about 140° C., respectively, and are heat laminatable, e.g., at a pressure greater than about 15 psi for about 0.5 second or longer. In addition, SOLARBLOC™ moisture barrier coatings types SB7122, SG7133, SB9122 may be employed for providing a moisture barrier seal or layer, e.g., on the exposed surface of top layer 200 or on the exposed surface of rear sheet 300, or around a solar panel frame or other structure.

Suitable electrically conductive adhesives include, e.g., AI Technology SOLARTAB™ UV resistant electrically conductive adhesive, e.g., types ST8150 and ST8130 conductive tab adhesive, which may be employed for the conductive patterns 210, 220, 310, 320 connecting to the front and back contacts of solar cells 400. Type ST8150 adhesive melt flows at a temperature greater than about 140° C. and is heat laminatable, e.g., at a pressure greater than about 10 psi for about 0.5 second or longer.

Suitable PVDF polymer materials include KYNAR® 9301, 2500, 2750, and 2800 fluoropolymers, and blends and copolymers thereof, which may be obtained from Arkema, Inc. having an office in King of Prussia, Pa., and similar PVDF copolymers.

It is noted that only the exposed surface of rear sheet 300 need include a fluorinated polymer; the inner layer or layers may include a high moisture barrier thermoplastic, e.g., PET, or a thermoset rubber, e.g., ethylene propylene diene monomer (EPDM) rubber. One preferred inner layer is an AI Technology type SG7113 thermoplastic which can melt flow and conform very quickly at a temperature of about 130-160° C., typically in an about 5-15 mils (about 0.13-0.4 mm) thick layer. When both top sheet 200 and rear sheet 300 are of the preferred thermoplastics, e.g., a top sheet 200 of AI Technology type SG7130 transparent insulating thermoplastic and a rear sheet 300 of AI Technology type SG7113 or SG7133 insulating thermoplastic, the full advantage, e.g., in time and cost savings, flowing from very quick melting and flowing may be realized. With the preferred materials, e.g., the melt flowing 530, 560 can be completed in less than about 1-5 minutes with or without vacuum.

A laminated module 100, 200 of solar cells 400 having front and back surfaces may comprise: a top layer 200 of a melt flowed melt flowable optically transparent electrically insulating thermoplastic adhesive material having a first pattern 210, 220 of melt flowable electrically conductive thermoplastic adhesive thereon for making electrical connection to the front surfaces of solar cells 400; a plurality of solar cells 400 having front and back surfaces to which electrical connection may be made, the plurality of solar cells 400 being laminated into the melt flowed top layer 200 with the first pattern 210, 220s of melt flowable electrically conductive thermoplastic adhesive making electrical connection to the front surfaces of the plurality of solar cells 400, whereby light may pass through the melt flowed optically transparent top layer 200 to impinge upon the front surface of the plurality of solar cells 400; a rear sheet 300 of a melt flowed melt flowable electrically insulating thermoplastic adhesive material having a second pattern 310, 320 of melt flowable electrically conductive thermoplastic adhesive thereon for making electrical connection to the back surfaces of the plurality of solar cells 400, the melt flowed rear sheet 300 being laminated to the melt flowed top layer 200 and to the back surfaces of the plurality of solar cells 400 therein with the second patterns of melt flowable electrically conductive thermoplastic adhesive making electrical connection to the back surfaces of the plurality of solar cells 400; wherein the first and second patterns 210, 220, 310, 320 of melt flowable electrically conductive thermoplastic adhesive are melt flowed to each other to provide an electrical connection between the front surface of one of the plurality of solar cells 400 and the back surface of another of the plurality of solar cells 400, whereby ones of the plurality of solar cells 400 are electrically connected in series by the connection between the first and second patterns 210, 220, 310, 320 of electrically conductive thermoplastic adhesive. The first pattern 210, 220 may include: a first pattern 210, 220 of an electrically conductive metal on the top layer 200 in the first pattern 210, 220 and the first pattern 210, 220 of melt flowable electrically conductive thermoplastic adhesive disposed on the first pattern 210, 220 of electrically conductive metal. The first pattern 210, 220 may include: an insulating pattern 250 of a melt flowable electrically insulating thermoplastic adhesive on the first pattern 210, 220 of melt flowable electrically conductive thermoplastic adhesive, wherein the insulating pattern 250 has a plurality of elongated areas at locations corresponding to locations at which edges of the plurality of solar cells 400 are to be placed. The second pattern 310, 320 may include: a second pattern 310, 320 of an electrically conductive metal on the rear sheet 300 in the second pattern 310, 320 and the second pattern 310, 320 of melt flowable electrically conductive thermoplastic adhesive disposed on the second pattern 310, 320 of electrically conductive metal. The first and second patterns 210, 220, 310, 320 of melt flowable electrically conductive thermoplastic adhesive each include respective portions extending beyond edges of the plurality of solar cells 400, and wherein the respective extended portions thereof are melt flowed to each other to provide the electrical connection between the front surface of one of the plurality of solar cells 400 and the back surface of another of the plurality of solar cells 400. Each of the plurality of solar cells 400 may include a transparent electrically conductive front contact substantially covering the front surface thereof and the first pattern 210, 220 may include for each of the plurality of solar cells 400 at least one elongated conductor 210 having a plurality of relatively narrower elongated conductors 214 extending substantially perpendicular thereto for making an electrical connection to the front contact of the solar cell 400; or each of the plurality of solar cells 400 may include at least one elongated electrically conductive front contact 210 on the front surface thereof and the first pattern 210, 220 includes for each of the plurality of solar cells 400 at least one elongated conductor 210 corresponding to the at least one elongated electrically conductive front contact of the solar cell 400 and located for making an electrical connection to the front contact of the solar cell 400; or each of the plurality of solar cells 400 may include at least two parallel elongated electrically conductive front contacts on the front surface thereof and the first pattern 210, 220 includes for each of the plurality of solar cells 400 at least two parallel elongated conductors 210 corresponding to the at least two parallel elongated electrically conductive front contacts of the solar cell and located for making an electrical connection to the front contacts of the solar cell. The first pattern 210, 220 of melt flowable electrically conductive thermoplastic adhesive or the second pattern 310, 320 of melt flowable electrically conductive thermoplastic adhesive or both may comprise: at least one elongated continuous strip 210 of melt flowable electrically conductive thermoplastic adhesive where the plurality of solar cells 400 do not have a metalized contact on the front surface and/or on the back surface thereof; or a plurality of areas 434 comprising between about ten percent and 100 percent of the area of metalized contact where the plurality of solar cells 400 have a metalized contact on the front surface and/or on the back surface thereof. Wherein each of the plurality of solar cells 400 includes an electrically conductive tab 415, 425, 430 applied to a contact on the front surface or on the back surface thereof or on both surfaces thereof, the tab 415, 425, 430 extending beyond an edge of the solar cell, the electrically conductive tab 415, 425, 430 may include: a solderable metal strip 415, 425 soldered to a metalized contact of the solar cell 400; or a metal strip 432 having on opposing broad surfaces thereof a plurality of areas 434 comprising melt flowable electrically conductive thermoplastic adhesive covering between about ten percent and 100 percent of the area of the metal strip and melt flowable electrically insulating thermoplastic adhesive substantially covering the remaining area 436 of the metal strip 432. The laminated module 100, 200 of solar cells 400 may further comprise: a glass layer 208 on an exposed front surface of the melt flowable optically transparent top layer 200; or a melt flowable optically transparent fluorinated polymer front layer 206 on an exposed front surface of the melt flowable optically transparent top layer 200; or a thermally conductive layer 308 on an exposed rear surface of the melt flowable rear sheet 300; or an ultraviolet resistant melt flowable layer 304, 308 on an exposed rear surface of the melt flowable rear sheet 300; or any combination of the foregoing. In laminated module 100, 200 of solar cells 400: the top layer 200 may not be as thick as is the rear sheet 300; or the top layer 200 may be at least as thick as are the solar cells 400; or the top layer 200 may not be as thick as is the rear sheet 300 and may be at least as thick as are the solar cells 400. The laminated module 100, 200 of solar cells 400 may comprise a laminated solar cell panel. The thermoplastic adhesives of the top layer 200, of the first pattern 210, 220 of thermoplastic adhesive, of the rear sheet 300 and of the second pattern 310, 320 of thermoplastic adhesive, may comprise a molecularly flexible thermoplastic adhesive having a melt flow temperature in the range between about 80° C. and about 200° C. and having a glass transition temperature of less than about 0° C.

A laminated module 100, 200 of solar cells 400 having front and back surfaces may comprise: a top layer 200 of a melt flowed melt flowable optically transparent electrically insulating thermoplastic adhesive material having a first pattern 210, 220 of melt flowable electrically conductive thermoplastic adhesive thereon for making electrical connection to the front surfaces of solar cells 400; a plurality of solar cells 400 having front and back surfaces to which electrical connection may be made, the plurality of solar cells 400 being laminated into the melt flowed top layer 200 with the first pattern 210, 220s of melt flowable electrically conductive thermoplastic adhesive making electrical connection to the front surfaces of the plurality of solar cells 400, and the back surfaces of the plurality of solar cells 400 being exposed, whereby light may pass through the melt flowed optically transparent top layer 200 to impinge upon the front surface of the plurality of solar cells 400 and connection may be made to the back surfaces thereof; wherein the first pattern 210, 220 of melt flowable electrically conductive thermoplastic adhesive melt flowed to provide exposed electrical connections to the front surfaces of the plurality of solar cells 400, and wherein the back surfaces of the plurality of solar cells 400 are exposed for making electrical connection thereto, whereby electrical connections to the front and back surfaces of the plurality of solar cells 400 are exposed on the same surface of the laminated module 100, 200 of solar cells 400. The laminated module 100, 200 of solar cells 400 may further comprise: a rear sheet 300 of a melt flowed melt flowable electrically insulating thermoplastic adhesive material having a second pattern 310, 320 of melt flowable electrically conductive thermoplastic adhesive thereon for making electrical connection to the back surfaces of the plurality of solar cells 400, wherein the second pattern 310, 320 of melt flowable electrically conductive thermoplastic adhesive includes a portion extending beyond the plurality of solar cells 400; the melt flowed rear sheet 300 being laminated to the melt flowed top layer 200 and to the back surfaces of the plurality of solar cells 400 therein with the second patterns 210, 220, 310, 320 of melt flowable electrically conductive thermoplastic adhesive making electrical connection to the back surfaces of the plurality of solar cells 400; wherein the respective portions of the first and second patterns 210, 220, 310, 320 of melt flowable electrically conductive thermoplastic adhesive that extend beyond the plurality of solar cells 400 are melt flow laminated to each other to provide an electrical connection between the front surface of one of the plurality of solar cells 400 and the back surface of another of the plurality of solar cells 400, whereby ones of the plurality of solar cells 400 are electrically connected in series by the connection between the first and second patterns 210, 220, 310, 320 of electrically conductive thermoplastic adhesive. The first pattern 210, 220 may include: a first pattern 210, 220 of an electrically conductive metal on the top layer 200 in the first pattern 210, 220 and the first pattern 210, 220 of melt flowable electrically conductive thermoplastic adhesive disposed on the first pattern 210, 220 of electrically conductive metal. The first pattern 210, 220 may include: an insulating pattern 250 of a melt flowable electrically insulating thermoplastic adhesive on the first pattern 210, 220 of melt flowable electrically conductive thermoplastic adhesive, wherein the insulating pattern 250 has a plurality of elongated areas at locations corresponding to locations at which edges of the plurality of solar cells 400 are to be placed. The first pattern 210, 220 of melt flowable electrically conductive thermoplastic adhesive may include portions extending beyond edges of the plurality of solar cells 400 and exposed near the back surfaces of the plurality of solar cells 400 to provide the exposed electrical connections to the front surfaces of the plurality of solar cells 400. Each of the plurality of solar cells 400 may include a transparent electrically conductive front contact substantially covering the front surface thereof and the first pattern 210, 220 may include for each of the plurality of solar cells 400 at least one elongated conductor 210 having a plurality of relatively narrower elongated conductors 214 extending substantially perpendicular thereto for making an electrical connection to the front contact of the solar cell 400; or each of the plurality of solar cells 400 may include at least one elongated electrically conductive front contact on the front surface thereof and the first pattern 210, 220 may include for each of the plurality of solar cells 400 at least one elongated conductor 210 corresponding to the at least one elongated electrically conductive front contact of the solar cell 400 and located for making an electrical connection to the front contact of the solar cell 400; or each of the plurality of solar cells 400 includes at least two parallel elongated electrically conductive front contacts 410 on the front surface thereof and the first pattern 210, 220 includes for each of the plurality of solar cells 400 at least two parallel elongated conductors 210 corresponding to the at least two parallel elongated electrically conductive front contacts 410 of the solar cell 400 and located for making an electrical connection to the front contacts 410 of the solar cell 400. The first pattern 210, 220 of melt flowable electrically conductive thermoplastic adhesive may comprise: at least one elongated continuous strip 210 of melt flowable electrically conductive thermoplastic adhesive where the plurality of solar cells 400 do not have a metalized contact on the front surface thereof; or a plurality of areas 434 comprising between about ten percent and 100 percent of the area of metalized contact 410 where the plurality of solar cells 400 have a metalized contact on the front surface thereof. Wherein each of the plurality of solar cells 400 includes an electrically conductive tab 415, 425, 430 applied to a contact on the front surface or on the back surface thereof or on both surfaces thereof, the tab 415, 425, 430 extending beyond an edge of the solar cell 400, the electrically conductive tab 415, 425, 430 may include: a solderable metal strip 415, 425 soldered to a metalized contact 410 of the solar cell 400; or a solderable metal strip 415, 425 soldered to a metalized contact 410 on the front surface of one solar cell 400 and to a metalized contact on the back surface of an adjacent solar cell 400; or a metal strip 432 having on opposing broad surfaces thereof a plurality of areas 434 comprising melt flowable electrically conductive thermoplastic adhesive covering between about ten percent and 100 percent of the area of the metal strip and melt flowable electrically insulating thermoplastic adhesive substantially covering the remaining area 436 of the metal strip 432; or a metal strip 432 having on opposing broad surfaces thereof a plurality of areas 434 comprising melt flowable electrically conductive thermoplastic adhesive covering between about ten percent and 100 percent of the area of the metal strip and melt flowable electrically insulating thermoplastic adhesive substantially covering the remaining area 436 of the metal strip 432, wherein areas 434 of melt flowable electrically conductive thermoplastic adhesive on one surface of the metal strip 432 adhere to a metalized contact 410 on the front surface of one solar cell 400 and areas 434 of melt flowable electrically conductive thermoplastic adhesive on the other surface of the metal strip 432 adhere to a metalized contact on the back surface of an adjacent solar cell 400. The laminated module 100, 200 of solar cells 400 may further comprise: a glass layer 208 on an exposed front surface of the melt flowable optically transparent top layer 200; or a melt flowable optically transparent fluorinated polymer front layer 206 on an exposed front surface of the melt flowable optically transparent top layer 200; or a melt flowable optically transparent fluorinated polymer front layer 206 on an exposed front surface of the melt flowable optically transparent top layer 200 and a glass layer 208 on an exposed front surface of the melt flowable optically transparent polymer front layer 206. The melt flowable optically transparent fluorinated polymer layer may be of a different material than is the melt flowable optically transparent top layer 200; or the melt flowable optically transparent fluorinated polymer layer may be of a different material than is the melt flowable optically transparent top layer 200 and the melt flowable optically transparent fluorinated polymer layer and the melt flowable optically transparent top layer 200 may have respective melt flow temperatures in about the same temperature range. The melt flowable top layer 200 may be at least as thick as are the solar cells 400. The thermoplastic adhesives of the top layer 200 and of the first pattern 210, 220 of thermoplastic adhesive may comprise a molecularly flexible thermoplastic adhesive having a melt flow temperature in the range between about 80° C. and about 200° C. and having a glass transition temperature of less than about 0° C.

A laminated module 100, 200 of solar cells 400 having front and back surfaces may comprise: a top layer 200 of a melt flowed melt flowable optically transparent electrically insulating molecularly flexible thermoplastic adhesive material having at least ten percent molecular crystallites that melt flow at a temperature in the range between about 80° C. and about 250° C. and having a glass transition temperature of less than about 0° C.; to bond to the front surfaces of solar cells 400; a rear sheet 300 of a melt flowed melt flowable electrically insulating molecularly flexible thermoplastic adhesive material having at least ten percent molecular crystallites that melt flow at a temperature in the range between about 80° C. and about 250° C. and having a glass transition temperature of less than about 0° C.; to bond to the back surfaces of solar cells 400; a plurality of solar cells 400 having front and back surfaces to which electrical connection may be made, the plurality of solar cells 400 being encapsulated by the molecularly flexible thermoplastic adhesives of the melt flowed top layer 200 and of the melt flowed rear sheet 300; electrically conductive interconnection members 210, 220, 310, 320, 415, 425, 430 providing electrical connections between the front surfaces of ones of the plurality of solar cells 400 and the back surfaces of others of the plurality of solar cells 400; wherein the melt flowable molecularly flexible thermoplastic adhesive of the top layer 200 is bonded to the front surfaces of the plurality of solar cells 400 and the melt flowable molecularly flexible thermoplastic adhesive of the rear sheet 300 is bonded to the back surfaces of the plurality of solar cells 400, whereby light may pass through the melt flowed optically transparent top layer 200 to impinge upon the front surface of the plurality of solar cells 400; wherein the laminated module 100, 200 including the top layer 200 and the rear sheet 300 exhibits a flexural modulus at about 60° C. that is at least fifty percent of the flexural modulus exhibited at about 20° C. without cross-linking chemical curing. The interconnection members 210, 220, 310, 320, 415, 425, 430 may comprise: a first pattern 210, 220 of melt flowable electrically conductive thermoplastic adhesive on the top layer 200 making electrical connection to the front surfaces of the plurality of solar cells 400; a second pattern 310, 320 of melt flowable electrically conductive thermoplastic adhesive on the rear sheet 300 making electrical connection to the back surfaces of the plurality of solar cells 400, each of the first and second patterns 210, 220, 310, 320 of melt flowable electrically conductive thermoplastic adhesive including respective portions extending beyond the edges of the plurality of solar cells 400 that are melt flow connected to each other to provide an electrical connection between the front surface of one of the plurality of solar cells 400 and the back surface of another of the plurality of solar cells 400, whereby ones of the plurality of solar cells 400 are electrically connected in series by the connection between the first and second patterns 210, 220, 310, 320 of electrically conductive thermoplastic adhesive. The interconnection members 210, 220, 310, 320, 415, 425, 430 may comprise: at least one elongated continuous strip 210, 220, 310, 320 of melt flowable electrically conductive thermoplastic adhesive where the plurality of solar cells 400 do not have a metalized contact on the front surface and/or on the back surface thereof; or a plurality of areas 434 comprising between about ten percent and 100 percent of the area of metalized contact where the plurality of solar cells 400 have a metalized contact on the front surface and/or on the back surface thereof. The interconnection members 210, 220, 310, 320, 415, 425, 430 may comprise: an electrically conductive tab 415, 425, 430 applied to a contact 410 on the front surface or on the back surface of or on both surfaces of each of the plurality of solar cells 400, each tab 415, 425, 430 extending beyond an edge of the solar cell 400, wherein the electrically conductive tab 415, 425, 430 may includes: a solderable metal strip 415, 425 soldered to a metalized contact 410 of the solar cell 400; or a metal strip 432 having on opposing broad surfaces thereof a plurality of areas 434 comprising melt flowable electrically conductive thermoplastic adhesive covering between about ten percent and 100 percent of the area of the metal strip 432 and melt flowable electrically insulating thermoplastic adhesive substantially covering the remaining area 436 of the metal strip 432. The interconnection members 210, 220, 310, 320, 415, 425, 430 may comprise: solderable metal strips 415, 425 soldered to metalized contacts 410 of the plurality of solar cells 400; or metal strips 432 each having on opposing broad surfaces thereof a plurality of areas 434 comprising melt flowable electrically conductive thermoplastic adhesive covering between about ten percent and 100 percent of the area of the metal strip 432 and melt flowable electrically insulating thermoplastic adhesive substantially covering the remaining area 436 of the metal strip 432.

A method 500 for making a laminated module 100, 200 of solar cells 400 having front and back surfaces may comprise: obtaining 510 a top layer 200 of a melt flowable optically transparent electrically insulating thermoplastic adhesive material having a first pattern 210, 220 of melt flowable electrically conductive thermoplastic adhesive thereon for making electrical connection to the front surface of solar cells 400; placing 520 a plurality of solar cells 400 having front and back surfaces to which electrical connection may be made on the melt flowable top layer 200 in locations with the first pattern 210, 220 of melt flowable electrically conductive thermoplastic adhesive adjacent the front surfaces of the plurality of solar cells 400, whereby an electrical connection may be made between the first pattern 210, 220 of melt flowable electrically conductive thermoplastic adhesive and the front surfaces of the plurality of solar cells 400; obtaining 540 a rear sheet 300 of a melt flowable electrically insulating thermoplastic adhesive material having a second pattern 310, 320 of melt flowable electrically conductive thermoplastic adhesive thereon for making electrical connection to the rear surface of the solar cells 400; placing 550 the melt flowable rear sheet 300 adjacent to the melt flowable top layer 200 and the back surfaces of the plurality of solar cells 400 in a location with the second pattern 310, 320 of melt flowable electrically conductive thermoplastic adhesive adjacent the back surfaces of the plurality of solar cells 400; heat laminating 530, 560 the melt flowable top layer 200, the plurality of solar cells 400 and the melt flowable rear sheet 300 to melt flow the melt flowable top layer 200 and the melt flowable rear sheet 300 together so that electrical connections are made between the first pattern 210, 220 of melt flowable electrically conductive thermoplastic adhesive and the front surfaces of the plurality of solar cells 400, between the second pattern 310, 320 of melt flowable electrically conductive thermoplastic adhesive and the back surfaces of the plurality of solar cells 400, and between the first and second patterns 210, 220, 310, 320 of pattern of melt flowable electrically conductive thermoplastic adhesive; whereby the plurality of solar cells 400 are embedded into at least the melt flowable top layer 200, and whereby ones of the plurality of solar cells 400 are electrically connected in series by the connection between the first and second patterns 210, 220, 310, 320 of electrically conductive thermoplastic adhesive. The obtaining 510 a top layer 200 of a melt flowable optically transparent electrically insulating thermoplastic adhesive material may include: applying 514 the first pattern 210, 220 of melt flowable electrically conductive thermoplastic adhesive on one surface of the top layer 200 of melt flowable optically transparent electrically insulating thermoplastic adhesive material, wherein the first pattern 210, 220 includes at least one elongated conductor 210, 220 for making electrical connection to the front surface of solar cells 400. The applying 514, 516 the first pattern 210, 220 may include: applying 514 the first pattern 210, 220 of melt flowable electrically conductive thermoplastic adhesive by screening, stenciling, roll coating, masking, deposition, printing, screen printing, inkjet printing, or sheet laminating; or patterning an electrically conductive metal on the sheet in the first pattern 210, 220 and applying 514 the first pattern 210, 220 of melt flowable electrically conductive thermoplastic adhesive on the patterned electrically conductive metal by screening, stenciling, roll coating, masking, deposition, printing, screen printing, inkjet printing, or sheet laminating. Applying 514, 516 the first pattern 210, 220 may include: applying 516 an insulating pattern of a melt flowable electrically insulating thermoplastic adhesive 250 on the first pattern 210, 220 of melt flowable electrically conductive thermoplastic adhesive, wherein the insulating pattern 250 has a plurality of elongated areas 250 at locations corresponding to locations at which the edges of the plurality of solar cells 400 are to be placed. The method 500 wherein: the placing 520 a plurality of solar cells 400 may include placing solar cells 400 in locations with portions of the first pattern 210, 220 of melt flowable electrically conductive thermoplastic adhesive extending beyond edges of the plurality of solar cells 400; and the placing 550 the melt flowable rear sheet 300 adjacent to the melt flowable top layer 200 may include placing 550 the rear sheet 300 in a location with portions of the second pattern 310, 320 of melt flowable electrically conductive thermoplastic adhesive extending beyond edges of the plurality of solar cells 400 opposite the extending portions of the first pattern 210, 220 of electrically conductive thermoplastic adhesive; wherein electrical connections are made between the respective extending portions of the first and second patterns 210, 220, 310, 320 of pattern of melt flowable electrically conductive thermoplastic adhesive. The obtaining 540 a rear sheet 300 of a melt flowable electrically insulating thermoplastic adhesive material may include: applying 544 the second pattern 310, 320 of melt flowable electrically conductive thermoplastic adhesive on one surface of the rear sheet 300 of melt flowable electrically insulating thermoplastic adhesive material, wherein the second pattern 310, 320 includes at least one conductor 310, 320 for making electrical connection to the back surface of solar cells 400. The applying the second pattern 310, 320 may include: applying 544 the second pattern 310, 320 of melt flowable electrically conductive thermoplastic adhesive by screening, stenciling, roll coating, masking, deposition, printing, screen printing, inkjet printing, or sheet laminating; or patterning an electrically conductive metal on the sheet in the second pattern 310, 320 and applying 544 the second pattern 310, 320 of melt flowable electrically conductive thermoplastic adhesive on the patterned electrically conductive metal by screening, stenciling, roll coating, masking, deposition, printing, screen printing, inkjet printing, or sheet laminating. The placing 520 a plurality of solar cells 400 may include: placing 520 the front surfaces of the solar cells 400 adjacent to the first pattern 210, 220 of melt flowable electrically conductive thermoplastic adhesive while the melt flowable electrically conductive thermoplastic adhesive is wet; or placing 520 the front surfaces of the solar cells 400 adjacent to the first pattern 210, 220 of melt flowable electrically conductive thermoplastic adhesive after the melt flowable electrically conductive thermoplastic adhesive is dried; or placing 520 the front surfaces of the solar cells 400 adjacent to the first pattern 210, 220 of melt flowable electrically conductive thermoplastic adhesive after the melt flowable electrically conductive thermoplastic adhesive is B-staged. The method 500 wherein: each of the plurality of solar cells 400 includes a transparent electrically conductive front contact substantially covering the front surface thereof and the first pattern 210, 220 includes for each of the plurality of solar cells 400 at least one elongated conductor 210, 220 having a plurality of relatively narrower elongated conductors 214 extending substantially perpendicular thereto for making an electrical connection to the front contact of the solar cell; or each of the plurality of solar cells 400 includes at least one elongated electrically conductive front contact 410 on the front surface thereof and the first pattern 210, 220 includes for each of the plurality of solar cells 400 at least one elongated conductor 210, 220 corresponding to the at least one elongated electrically conductive front contact 410 of the solar cell 400 and located for making an electrical connection to the front contact 410 of the solar cell 400; or each of the plurality of solar cells 400 includes at least two parallel elongated electrically conductive front contacts 410 on the front surface thereof and the first pattern 210, 220 includes for each of the plurality of solar cells 400 at least two parallel elongated conductors 210, 220 corresponding to the at least two parallel elongated electrically conductive front contacts 410 of the solar cell 400 and located for making an electrical connection to the front contacts 410 of the solar cell 400. Each of the plurality of solar cells 400 may have a contact 410 on the front surface thereof to which electrical connection may be made, wherein the placing 520 a plurality of solar cells 400 on the melt flowable top layer 200 includes heating the top layer 200, the solar cells 400, or both, so as to increase the adhesion of the solar cells 400 to the top layer 200. The first pattern 210, 220 of melt flowable electrically conductive thermoplastic adhesive or the second pattern 310, 320 of melt flowable electrically conductive thermoplastic adhesive or both may comprise: at least one elongated continuous strip 210, 220, 310, 320 of melt flowable electrically conductive thermoplastic adhesive where the plurality of solar cells 400 do not have a metalized contact on the front surface and/or on the back surface thereof; or a plurality of areas 434 comprising between about ten percent and 100 percent of the area of metalized contact 410 where the plurality of solar cells 400 have a metalized contact 410 on the front surface and/or on the back surface thereof. Each of the plurality of solar cells 400 may include an electrically conductive tab 415, 425, 430 applied to a contact 410 on the front surface or on the back surface thereof or on both surfaces thereof, the tab 415, 425, 430 extending beyond an edge of the solar cell 400, and the electrically conductive tab 415, 425, 430 may include: a solderable metal strip 415, 425, soldered to a metalized contact 410 of the solar cell 400; or a metal strip 432 having on opposing broad surfaces thereof a plurality of areas 434 comprising melt flowable electrically conductive thermoplastic adhesive covering between about ten percent and 100 percent of the area of the metal strip 432 and melt flowable electrically insulating thermoplastic adhesive substantially covering the remaining area 436 of the metal strip 432. The heat laminating 530, 560 may include: heat laminating 530 the melt flowable top layer 200 and the plurality of solar cells 400 thereon to melt flow the melt flowable top layer 200 so that electrical connections are made between the first pattern 210, 220 of melt flowable electrically conductive thermoplastic adhesive and the front surfaces of the plurality of solar cells 400 and the plurality of solar cells 400 are embedded into the melt flowable top layer 200. The heat laminating 530, 560 may include: heat laminating 530, 560 the melt flowed top layer 200 with the plurality of solar cells 400 embedded therein and the melt flowable rear sheet 300 to melt flow the melt flowable top layer 200 and the melt flowable rear sheet 300 together so that electrical connections are made between the second pattern 310, 320 of melt flowable electrically conductive thermoplastic adhesive and the back surfaces of the plurality of solar cells 400, and between the respective extending portions of the first and second patterns 210, 220, 310, 320 of pattern of melt flowable electrically conductive thermoplastic adhesive; whereby ones of the plurality of solar cells 400 are electrically connected in series by the connection between the first and second patterns 210, 220, 310, 320 of electrically conductive thermoplastic adhesive. The heat laminating 530, 560 may include: heat laminating 530, 560 a glass layer 208 on an exposed front surface of the melt flowable optically transparent top layer 200; or heat laminating 530, 560 a thermally conductive layer 304, 308 on an exposed rear surface of the melt flowable rear sheet 300; or heat laminating 530, 560 a glass layer 208 on an exposed front surface of the melt flowable optically transparent top layer 200 and a thermally conductive layer 304, 308 on an exposed rear surface of the melt flowable rear sheet 300. The heat laminating 530, 560 may comprise: rolling heat laminating 530, 560; or rolling heat laminating 530, 560 employing heated laminating rollers 610; or rolling heat laminating 530, 560 employing a release liner 536, 566 between at least the top layer 200 and the laminating rollers 610; or rolling heat laminating 530, 560 employing a release liner 536, 566 between at least the rear sheet 300 and the laminating rollers 610; or rolling heat laminating 530, 560 employing one or more heating elements 630 for heating at least the top layer 200 prior to the laminating rollers 610; or rolling heat laminating 530, 560 employing one or more heating elements 630 for heating at least the rear sheet 300 prior to the laminating rollers 610; or vacuum laminating; or any combination of the foregoing. The heat laminating 530, 560 may further comprise: placing 534, 564 a release liner adjacent at least the top layer 200; and placing a backing sheet that is stiffer than the top layer 200 against the release liner 536, 566 for defining a surface to which the top layer 200 conforms when heat laminated 530, 560. The obtaining 510 a top layer 200 may include obtaining 510 a roll or sheet including a plurality of top layers 200, and the method 500 may further comprise: separating 570 a roll laminated 530, 560 roll or sheet including a plurality of top layers 200 into a plurality of individual top layers 200. The obtaining 540 a rear sheet 300 may include obtaining 540 a roll or sheet including a plurality of rear sheets 300, and the method 500 may further comprise: separating 570 a roll laminated 530, 560 roll or sheet including a plurality of rear sheets 300 into a plurality of individual rear sheets 300. The laminated module 100, 200 of solar cells 400 may comprise a laminated 530, 560 solar cell panel 100.

A method 500 for making a laminated module 100, 200 of solar cells 400 having front and back surfaces may comprise: obtaining 510 a top layer 200 of a melt flowable optically transparent electrically insulating thermoplastic adhesive material having a first pattern 210, 220 of melt flowable electrically conductive thermoplastic adhesive thereon for making electrical connection to the front surface of solar cells 400; placing 520 a plurality of solar cells 400 having front and back surfaces to which electrical connection may be made on the melt flowable top layer 200 in locations with the first pattern 210, 220 of melt flowable electrically conductive thermoplastic adhesive adjacent the front surfaces of the plurality of solar cells 400, whereby light may pass through the melt flowable optically transparent top layer 200 to impinge upon the front surface of the plurality of solar cells 400 and connection may be made to the back surfaces thereof; heat laminating 530, 560 the melt flowable top layer 200 and the plurality of solar cells 400 to melt flow the melt flowable top layer 200 so that electrical connections are made between the first pattern 210, 220 of melt flowable electrically conductive thermoplastic adhesive and the front surfaces of the plurality of solar cells 400; wherein the plurality of solar cells 400 are embedded into the melt flowable top layer 200, wherein the first pattern 210, 220 of melt flowable electrically conductive thermoplastic adhesive provides exposed electrical connections to the front surfaces of the plurality of solar cells 400, and wherein the back surfaces of the plurality of solar cells 400 are exposed for making electrical connection thereto, whereby electrical connections to the front and back surfaces of the plurality of solar cells 400 are exposed on the same surface of the laminated module 100, 200 of solar cells 400. The method 500 may further comprise: obtaining 540 a rear sheet 300 of a melt flowable electrically insulating thermoplastic adhesive material having a second pattern 310, 320 of melt flowable electrically conductive thermoplastic adhesive thereon for making electrical connection to the rear surface of the solar cells 400; placing 550 the melt flowable rear sheet 300 adjacent to the melt flowable top layer 200 and the back surfaces of the plurality of solar cells 400 in a location with the second pattern 310, 320 of melt flowable electrically conductive thermoplastic adhesive adjacent the back surfaces of the plurality of solar cells 400 with portions of the second pattern 310, 320 of melt flowable electrically conductive thermoplastic adhesive extending beyond edges of the plurality of solar cells 400 opposite the extending portions of the first pattern 210, 220 of electrically conductive thermoplastic adhesive; heat laminating 530, 560 the melt flowable top layer 200, the plurality of solar cells 400 and the melt flowable rear sheet 300 to melt flow the melt flowable top layer 200 and the melt flowable rear sheet 300 together so that electrical connections are made between the second pattern 310, 320 of melt flowable electrically conductive thermoplastic adhesive and the back surfaces of the plurality of solar cells 400, and between the respective extending portions of the first and second patterns 210, 220, 310, 320 of pattern of melt flowable electrically conductive thermoplastic adhesive; whereby the plurality of solar cells 400 are embedded into at least the melt flowable top layer 200, and whereby ones of the plurality of solar cells 400 are electrically connected in series by the connection between the first and second patterns 210, 220, 310, 320 of electrically conductive thermoplastic adhesive. The obtaining 510 a top layer 200 of a melt flowable optically transparent electrically insulating thermoplastic adhesive material may include: applying 514 the first pattern 210, 220 of melt flowable electrically conductive thermoplastic adhesive on one surface of the top layer 200 of melt flowable optically transparent electrically insulating thermoplastic adhesive material, wherein the first pattern 210, 220 includes at least one elongated conductor 210, 220 for making electrical connection to the front surface of solar cells 400. The applying 514 the first pattern 210, 220 may include: applying 514 the first pattern 210, 220 of melt flowable electrically conductive thermoplastic adhesive by screening, stenciling, roll coating, masking, deposition, printing, screen printing, inkjet printing, or sheet laminating; or patterning an electrically conductive metal on the sheet in the first pattern 210, 220 and applying 514 the first pattern 210, 220 of melt flowable electrically conductive thermoplastic adhesive on the patterned electrically conductive metal by screening, stenciling, roll coating, masking, deposition, printing, screen printing, inkjet printing, or sheet laminating. The applying the first pattern 210, 220 may include: applying 516 an insulating pattern 250 of a melt flowable electrically insulating thermoplastic adhesive on the first pattern 210, 220 of melt flowable electrically conductive thermoplastic adhesive, wherein the insulating pattern 250 has a plurality of elongated areas 250 at locations corresponding to locations at which the edges of the plurality of solar cells 400 are to be placed. The method 500 wherein: the placing 520 a plurality of solar cells 400 includes placing 520 solar cells 400 in locations with portions of the first pattern 210, 220 of melt flowable electrically conductive thermoplastic adhesive extending beyond edges of the plurality of solar cells 400, wherein the portions of the first pattern 210, 220 of melt flowable electrically conductive thermoplastic adhesive extending beyond solar cells 400 are exposed near the back surfaces of the plurality of solar cells 400 to provide the exposed electrical connections to the front surfaces of the plurality of solar cells 400. The placing 520 a plurality of solar cells 400 may include: placing 520 the front surfaces of the solar cells 400 adjacent to the first pattern 210, 220 of melt flowable electrically conductive thermoplastic adhesive while the melt flowable electrically conductive thermoplastic adhesive is wet; or placing 520 the front surfaces of the solar cells 400 adjacent to the first pattern 210, 220 of melt flowable electrically conductive thermoplastic adhesive after the melt flowable electrically conductive thermoplastic adhesive is dried; or placing 520 the front surfaces of the solar cells 400 adjacent to the first pattern 210, 220 of melt flowable electrically conductive thermoplastic adhesive after the melt flowable electrically conductive thermoplastic adhesive is B-staged. The method 500 wherein: each of the plurality of solar cells 400 includes a transparent electrically conductive front contact substantially covering the front surface thereof and the first pattern 210, 220 includes for each of the plurality of solar cells 400 at least one elongated conductor 210 having a plurality of relatively narrower elongated conductors 214 extending substantially perpendicular thereto for making an electrical connection to the front contact of the solar cell 400; or each of the plurality of solar cells 400 includes at least one elongated electrically conductive front contact 410 on the front surface thereof and the first pattern 210, 220 includes for each of the plurality of solar cells 400 at least one elongated conductor 210, 220 corresponding to the at least one elongated electrically conductive front contact 410 of the solar cell 400 and located for making an electrical connection to the front contact 410 of the solar cell 400; or each of the plurality of solar cells 400 includes at least two parallel elongated electrically conductive front contacts 410 on the front surface thereof and the first pattern 210, 220 includes for each of the plurality of solar cells 400 at least two parallel elongated conductors 210, 220 corresponding to the at least two parallel elongated electrically conductive front contacts 410 of the solar cell 400 and located for making an electrical connection to the front contacts 410 of the solar cell 400. The method 500 wherein each of the plurality of solar cells 400 has a contact 410 on the front surface thereof to which electrical connection may be made, wherein the placing 520 a plurality of solar cells 400 on the melt flowable top layer 200 includes heating the top layer 200, the solar cells 400, or both, so as to increase the adhesion of the solar cells to the top layer 200. The first pattern 210, 220 of melt flowable electrically conductive thermoplastic adhesive may comprise: at least one elongated continuous strip 210, 220 of melt flowable electrically conductive thermoplastic adhesive where the plurality of solar cells 400 do not have a metalized contact on the front surface thereof; or a plurality of areas 434 comprising between about ten percent and 100 percent of the area of metalized contact 410 where the plurality of solar cells 400 have a metalized contact 410 on the front surface thereof. The method 500 wherein each of the plurality of solar cells 400 may include an electrically conductive tab 415, 425, 430 applied to a contact 410 on the front surface or on the back surface thereof or on both surfaces thereof, the tab 415, 425, 430 extending beyond an edge of the solar cell 400, and wherein the electrically conductive tab 415, 425, 430 may include: a solderable metal strip 415, 425 soldered to a metalized contact 410 of the solar cell 400; or a solderable metal strip 415, 425 soldered to a metalized contact 410 on the front surface of one solar cell 400 and to a metalized contact 410 on the back surface of an adjacent solar cell 400; or a metal strip 432 having on opposing broad surfaces thereof a plurality of areas 434 comprising melt flowable electrically conductive thermoplastic adhesive covering between about ten percent and 100 percent of the area of the metal strip 432 and melt flowable electrically insulating thermoplastic adhesive substantially covering the remaining area 436 of the metal strip 432; or a metal strip 432 having on opposing broad surfaces thereof a plurality of areas 434 comprising melt flowable electrically conductive thermoplastic adhesive covering between about ten percent and 100 percent of the area of the metal strip 432 and melt flowable electrically insulating thermoplastic adhesive substantially covering the remaining area 436 of the metal strip 432, wherein areas 434 of melt flowable electrically conductive thermoplastic adhesive on one surface of the metal strip 432 adhere to a metalized contact 410 on the front surface of one solar cell 400 and areas 434 of melt flowable electrically conductive thermoplastic adhesive on the other surface of the metal strip 432 adhere to a metalized contact 410 on the back surface of an adjacent solar cell 400. The heat laminating 530, 560 may include: heat laminating 530, 560 a glass layer 208 on an exposed front surface of the melt flowable optically transparent top layer 200. The method 500 wherein the heat laminating 530, 560 may comprise: rolling heat laminating 530, 560; or rolling heat laminating 530, 560 employing heated laminating rollers 610; or rolling heat laminating 530, 560 employing a release liner 536, 536 between at least the top layer 200 and the laminating rollers 610; or rolling heat laminating 530, 560 employing one or more heating elements 630 for heating at least the top layer 200 prior to the laminating rollers 610; or vacuum laminating; or any combination of the foregoing. The heat laminating 530, 560 may further comprise: placing 534, 564 a release liner 536, 566 adjacent at least the top layer 200; and placing 534, 536 a backing sheet 536, 566 that is stiffer than the top layer 200 against the release liner 536, 566 for defining a surface to which the top layer 200 conforms when heat laminated 530, 560. The obtaining 510 a top layer 200 may include obtaining 510 a roll or sheet including a plurality of top layer 200s, the method further comprising: separating 570 a roll laminated roll or sheet including a plurality of top layers 200 into a plurality of individual top layers 200.

A method 500 for making a laminated module 100, 200 of solar cells 400 having front and back surfaces may comprise: obtaining 510 a top layer 200 of a melt flowable optically transparent electrically insulating molecularly flexible thermoplastic adhesive material having at least ten percent molecular crystallites that melt flow at a temperature in the range between about 80° C. and about 250° C. and having a glass transition temperature of less than about 0° C.; to bond to the front surfaces of solar cells 400; placing 520 a plurality of solar cells 400 having front and back surfaces to which electrical connection may be made with the front surfaces thereof adjacent the melt flowable top layer 200; providing electrical connections 210, 220, 310, 320, 415, 425, 430 between the front surface of ones of the plurality of solar cells 400 and the back surface of others of the plurality of solar cells 400; placing 550 adjacent the back surfaces of the plurality of solar cells 400 and top sheet 200 a rear sheet 300 of a melt flowable electrically insulating molecularly flexible thermoplastic adhesive material having at least ten percent molecular crystallites that melt flow at a temperature in the range between about 80° C. and about 250° C. and having a glass transition temperature of less than about 0° C.; to bond to the back surfaces of solar cells 400; heat laminating 530, 560 the melt flowable top layer 200, the plurality of solar cells 400 and the melt flowable rear sheet 300 to melt flow the melt flowable top layer 200 and the melt flowable rear sheet 300 together so that the plurality of solar cells 400 and the electrical connections there between are encapsulated in the melt flowed molecularly flexible thermoplastic adhesive of at least the top layer 200; whereby light may pass through the melt flowed optically transparent top layer 200 to impinge upon the front surface of the plurality of solar cells 400; wherein the laminated module 100, 200 including the top layer 200 and the rear sheet 300 exhibits a flexural modulus at about 60° C. that is at least fifty percent of the flexural modulus exhibited at about 20° C. without cross-linking chemical curing. The providing electrical connections 210, 220, 310, 320, 415, 525, 430 may comprise: providing 514 a first pattern 210, 220 of melt flowable electrically conductive thermoplastic adhesive on the top layer 200 in locations for making electrical connection to the front surfaces of the plurality of solar cells 400; providing 544 a second pattern 310, 320 of melt flowable electrically conductive thermoplastic adhesive on the rear sheet 300 in locations for making electrical connection to the back surfaces of the plurality of solar cells 400, wherein each of the first and second patterns 210, 220, 310, 320 of melt flowable electrically conductive thermoplastic adhesive include respective portions extending beyond the edges of the plurality of solar cells 400 that melt flow connect to each other to provide an electrical connection between the front surface of one of the plurality of solar cells 400 and the back surface of another of the plurality of solar cells 400, whereby ones of the plurality of solar cells 400 are electrically connected in series by the connection between the first and second patterns 210, 220, 310, 320 of electrically conductive thermoplastic adhesive. The providing electrical connections 210, 220, 310, 320, 415, 525, 430 may comprise: providing 514 at least one elongated continuous strip of melt flowable electrically conductive thermoplastic adhesive where the plurality of solar cells 400 do not have a metalized contact on the front surface and/or on the back surface thereof; or providing 514 a plurality of areas 434 comprising between about ten percent and 100 percent of the area of metalized contact 410 where the plurality of solar cells 400 have a metalized contact 410 on the front surface and/or on the back surface thereof. The providing electrical connections 210, 220, 310, 320, 415, 525, 430 may comprise: applying an electrically conductive tab 415, 525, 430 to a contact 410 on the front surface or on the back surface of or on both surfaces of each of the plurality of solar cells 400, each tab 415, 525, 430 extending beyond an edge of the solar cell, wherein the electrically conductive tab 415, 525, 430 may include: a solderable metal strip 415, 525 soldered to a metalized contact 410 of the solar cell 400; or a metal strip 432 having on opposing broad surfaces thereof a plurality of areas 434 comprising melt flowable electrically conductive thermoplastic adhesive covering between about ten percent and 100 percent of the area of the metal strip 432 and melt flowable electrically insulating thermoplastic adhesive substantially covering the remaining area 436 of the metal strip 432, attached to a metalized contact 410 of the solar cell 400. The providing electrical connections 415, 525, 430 may comprise: soldering solderable metal strips 415, 525 to metalized contacts 410 of the plurality of solar cells 400; or attaching 530 metal strips 432 having on opposing broad surfaces thereof a plurality of areas 434 comprising melt flowable electrically conductive thermoplastic adhesive covering between about ten percent and 100 percent of the area of the metal strip 432 and melt flowable electrically insulating thermoplastic adhesive substantially covering the remaining area 436 of the metal strip 432, to metalized contacts 410 of the plurality of solar cells 400.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. It is noted that embodiments of very different sizes, shapes and dimensions may employ the described arrangements.

Although terms such as "up," "down," "left," "right," "front," "rear," "back," side," "top," "bottom," "forward," "backward," "under" and/or "over," may be used herein as a convenience in describing one or more embodiments and/or uses of the present arrangement, the articles described may be positioned in any desired orientation and/or may be utilized in any desired position and/or orientation, and even if such a term might apply in use it may not apply in processing, manufacture and/or testing. Such terms of position and/or orientation should be understood as being for convenience only, and not as limiting of the invention as claimed.

Further, what is stated as being "optimum" or "deemed optimum" may or not be a true optimum condition, but is the condition deemed to be desirable or acceptably "optimum" by virtue of its being selected in accordance with the decision rules and/or criteria defined by the applicable controlling function.

While the present invention has been described in terms of the foregoing example embodiments, variations within the scope and spirit of the present invention as defined by the claims following will be apparent to those skilled in the art. For example, the steps in any process, e.g., that for forming top layer 200 and/or rear sheet 300, and/or forming other layers, may be performed in any desired suitable order.

For example, a top layer 200 may be formed by applying the electrically conductive adhesive pattern 210, 220 and/or insulating pattern 250 to a layer or sheet 200 of suitable material, or the electrically conductive pattern 210, 220 and/or insulating adhesive pattern 250 may be formed on a release liner and top layer 200 may be applied thereto. In either case, the building up may be by applying wet adhesive, e.g., by screening, stenciling, roll coating, masking, deposition, printing, screen printing, inkjet printing, and the like, or by laminating sheets, e.g., dried or B-staged sheets) of the various layers together using any of the methods described or another suitable method. The same is true where one layer, e.g., top layer 200, has wells 202 or other raised or recessed features that are conveniently formed by the building up of plural layers, e.g., of layers with the features and layers without features.

While melt flowable materials that melt flow at about the same temperature are generally preferred, melt flowing at about the same temperature should be understood to include a range of temperatures, e.g., an about 10-20° C. range of temperatures at or above a melt flow temperature, as well as including melt flowing at about a particular melt flow temperature, e.g., about 125° C. Preferably the melt flow temperatures of all of the melt flowable materials employed in a given solar cell panel 100 should be above the highest temperature at which the solar cell panel 100 is expected to be used or is rated or specified to be used. Preferably, the melt flow temperature of the electrically conductive thermoplastic adhesives should be in the range between about 80° C. and about 200° C., and may have a slightly lower melt flow temperature, e.g., about 10-20° C. lower, than does the substrate on which they are applied.

In a further alternative, process 580 may in effect combine steps 584-586 by applying a solvent, e.g., NMP or MEK, to a substrate layer or sheet, e.g., a FP or NFP sheet or layer, then laminating that substrate sheet to the obtained 582 substrate layer or sheet, e.g., at ambient temperature or at a slightly elevated temperature, e.g., at about 25-100° C., and then slowly drying 588 the laminate to drive the solvent out of the interface between the sheets so as to not create voids or bubbles, either in the layers or sheets or at their interface. Adhesion may also be promoted by employing a blend of polymers, e.g., by blending PVF and/or PVDF and/or their co-polymers with a non-fluorinated polymer, e.g., about 5-75% of EVA or an acrylic and the like, as may be desired for improving adhesion to glass and/or solar cells.

Conventional melt film extension may also be employed to produce fluorinated polymer films for top sheet 200 so long as the fluorinated polymer resins are pre-blended or pre-mixed to resins suitable for forming a film.

Although rolling heat laminating is the preferred laminating method, solar cell interconnections, module 100, 200s and solar cell panels according to the present arrangement may be made utilizing heated pressing lamination and/or heated vacuum lamination.

While simple metals may be described, e.g., copper, aluminum, and tin, metals should be understood to include the metals and/or their alloys, e.g., brass, beryllium copper, and the like, as well as metals having a flash, plated or other coating, e.g., tin, nickel, silver, nickel-tin, nickel-silver, copper-nickel, copper-nickel-silver, and combinations thereof that resist oxidation which can increase the contact resistance of the base layer or metal. Likewise, solder should be understood to include a solder of any type, whether tin based, silver based, lead based or based on another metal. For electrically conductive adhesive tabbing, a metal finish such as a tin, nickel, silver, nickel-silver or other oxidation resistant finish is preferred.

Each of the U.S. Provisional Applications, U.S. patent applications, and/or U.S. patents identified herein are hereby incorporated herein by reference in their entirety, for any purpose and for all purposes irrespective of how it may be referred to herein.

Finally, numerical values stated are typical or example values, are not limiting values, and do not preclude substantially larger and/or substantially smaller values. Values in any given embodiment may be substantially larger and/or may be substantially smaller than the example or typical values stated.

What is claimed is:

1. A method for making a laminated module of solar cells having front and back surfaces comprising:

obtaining a top layer of a melt flowable optically transparent electrically insulating thermoplastic adhesive material having a first pattern of melt flowable electrically conductive thermoplastic adhesive thereon for making electrical connection to the front surface of solar cells;

placing a plurality of solar cells having front and back surfaces to which electrical connection may be made on the melt flowable top layer in locations with the first pattern of melt flowable electrically conductive thermoplastic adhesive adjacent the front surfaces of the plurality of solar cells, whereby an electrical connection may be made between the first pattern of melt flowable electrically conductive thermoplastic adhesive and the front surfaces of the plurality of solar cells;

whereby light may pass through said melt flowable optically transparent top layer to impinge upon the front surface of said plurality of solar cells and connection may be made to the back surfaces thereof;

obtaining a rear sheet of a melt flowable electrically insulating thermoplastic adhesive material having a second pattern of melt flowable electrically conductive thermoplastic adhesive thereon for making electrical connection to the back surfaces of the solar cells;

placing the melt flowable rear sheet adjacent to the melt flowable top layer and the back surfaces of the plurality of solar cells in a location with the second pattern of melt flowable electrically conductive thermoplastic adhesive adjacent the back surfaces of the plurality of solar cells;

heat laminating the melt flowable top layer, the plurality of solar cells and the melt flowable rear sheet to melt flow the melt flowable top layer and the melt flowable rear sheet together so that electrical connections are made between the first pattern of melt flowable electrically conductive thermoplastic adhesive and the front surfaces of the plurality of solar cells, between the second pattern of melt flowable electrically conductive thermoplastic adhesive and the back surfaces of the plurality of solar cells, and between the first and second patterns of pattern of melt flowable electrically conductive thermoplastic adhesive;

whereby the plurality of solar cells are embedded into at least the melt flowable top layer, and whereby ones of the plurality of solar cells are electrically connected in series by the connection between the first and second patterns of electrically conductive thermoplastic adhesive.

2. The method of claim 1 wherein said obtaining a top layer of a melt flowable optically transparent electrically insulating thermoplastic adhesive material includes:

applying the first pattern of melt flowable electrically conductive thermoplastic adhesive on one surface of the top layer of melt flowable optically transparent electrically insulating thermoplastic adhesive material, wherein the first pattern includes at least one elongated conductor for making electrical connection to the front surface of solar cells.

3. The method of claim 2 wherein said applying the first pattern includes:

applying the first pattern of melt flowable electrically conductive thermoplastic adhesive by screening, stenciling, roll coating, masking, deposition, printing, screen printing, inkjet printing, or sheet laminating; or patterning an electrically conductive metal on the sheet in the first pattern and applying the first pattern of melt flowable electrically conductive thermoplastic adhesive on the patterned electrically conductive metal by screening, stenciling, roll coating, masking, deposition, printing, screen printing, inkjet printing, or sheet laminating.

4. The method of claim 2 wherein said applying the first pattern includes:
applying an insulating pattern of a melt flowable electrically insulating thermoplastic adhesive on the first pattern of melt flowable electrically conductive thermoplastic adhesive, wherein the insulating pattern has a plurality of elongated areas at locations corresponding to locations at which the edges of the plurality of solar cells are to be placed.

5. The method of claim 1 wherein:
said placing a plurality of solar cells includes placing solar cells in locations with portions of the first pattern of melt flowable electrically conductive thermoplastic adhesive extending beyond edges of the plurality of solar cells; and
said placing the melt flowable rear sheet adjacent to the melt flowable top layer includes placing the rear sheet in a location with portions of the second pattern of melt flowable electrically conductive thermoplastic adhesive extending beyond edges of the plurality of solar cells opposite the extending portions of the first pattern of electrically conductive thermoplastic adhesive;
wherein electrical connections are made between the respective extending portions of the first and second patterns of pattern of melt flowable electrically conductive thermoplastic adhesive.

6. The method of claim 1 wherein said obtaining a rear sheet of a melt flowable electrically insulating thermoplastic adhesive material includes:
applying the second pattern of melt flowable electrically conductive thermoplastic adhesive on one surface of the rear sheet of melt flowable electrically insulating thermoplastic adhesive material,
wherein the second pattern includes at least one conductor for making electrical connection to the back surface of solar cells.

7. The method of claim 6 wherein said applying the second pattern includes:
applying the second pattern of melt flowable electrically conductive thermoplastic adhesive by screening, stenciling, roll coating, masking, deposition, printing, screen printing, inkjet printing, or sheet laminating; or
patterning an electrically conductive metal on the sheet in the second pattern and applying the second pattern of melt flowable electrically conductive thermoplastic adhesive on the patterned electrically conductive metal by screening, stenciling, roll coating, masking, deposition, printing, screen printing, inkjet printing, or sheet laminating.

8. The method of claim 1 wherein said placing a plurality of solar cells includes:
placing the front surfaces of the solar cells adjacent to the first pattern of melt flowable electrically conductive thermoplastic adhesive while the melt flowable electrically conductive thermoplastic adhesive is wet; or
placing the front surfaces of the solar cells adjacent to the first pattern of melt flowable electrically conductive thermoplastic adhesive after the melt flowable electrically conductive thermoplastic adhesive is dried; or
placing the front surfaces of the solar cells adjacent to the first pattern of melt flowable electrically conductive thermoplastic adhesive after the melt flowable electrically conductive thermoplastic adhesive is B-staged.

9. The method of claim 1 wherein:
each of the plurality of solar cells includes a transparent electrically conductive front contact substantially covering the front surface thereof and the first pattern includes for each of the plurality of solar cells at least one elongated conductor having a plurality of relatively narrower elongated conductors extending substantially perpendicular thereto for making an electrical connection to the front contact of the solar cell; or
each of the plurality of solar cells includes at least one elongated electrically conductive front contact on the front surface thereof and the first pattern includes for each of the plurality of solar cells at least one elongated conductor corresponding to the at least one elongated electrically conductive front contact of the solar cell and located for making an electrical connection to the front contact of the solar cell; or
each of the plurality of solar cells includes at least two parallel elongated electrically conductive front contacts on the front surface thereof and the first pattern includes for each of the plurality of solar cells at least two parallel elongated conductors corresponding to the at least two parallel elongated electrically conductive front contacts of the solar cell and located for making an electrical connection to the front contacts of the solar cell.

10. The method of claim 1 wherein each of the plurality of solar cells has a contact on the front surface thereof to which electrical connection may be made, wherein said placing a plurality of solar cells on the melt flowable top layer includes heating the top layer, the solar cells, or both, so as to increase the adhesion of the solar cell s to the top layer.

11. The method of claim 1 wherein the first pattern of melt flowable electrically conductive thermoplastic adhesive or the second pattern of melt flowable electrically conductive thermoplastic adhesive or both comprise:
at least one elongated continuous strip of melt flowable electrically conductive thermoplastic adhesive where said plurality of solar cells do not have a metalized contact on the front surface and/or on the back surface thereof; or
a plurality of areas comprising between about ten percent and 100 percent of the area of metalized contact where said plurality of solar cells have a metalized contact on the front surface and/or on the back surface thereof.

12. The method of claim 1 wherein each of said plurality of solar cells includes an electrically conductive tab applied to a contact on the front surface or on the back surface thereof or on both surfaces thereof, said tab extending beyond an edge of the solar cell, and wherein said electrically conductive tab includes:
a solderable metal strip soldered to a metalized contact of the solar cell; or
a metal strip having on opposing broad surfaces thereof a plurality of areas comprising melt flowable electrically conductive thermoplastic adhesive covering between about ten percent and 100 percent of the area of said metal strip and melt flowable electrically insulating thermoplastic adhesive substantially covering the remaining area of said metal strip.

13. The method of claim 1 wherein said heat laminating includes:
heat laminating the melt flowable top layer and the plurality of solar cells thereon to melt flow the melt flowable top layer so that electrical connections are made between the first pattern of melt flowable electrically conductive thermoplastic adhesive and the front surfaces of the plurality of solar cells and the plurality of solar cells are embedded into the melt flowable top layer.

14. The method of claim 13 wherein said heat laminating includes:

heat laminating the melt flowed top layer with the plurality of solar cells embedded therein and the melt flowable rear sheet to melt flow the melt flowable top layer and the melt flowable rear sheet together so that electrical connections are made between the second pattern of melt flowable electrically conductive thermoplastic adhesive and the back surfaces of the plurality of solar cells, and between the respective extending portions of the first and second patterns of pattern of melt flowable electrically conductive thermoplastic adhesive;

whereby ones of the plurality of solar cells are electrically connected in series by the connection between the first and second patterns of electrically conductive thermoplastic adhesive.

15. The method of claim 1 wherein said heat laminating includes:
heat laminating a glass layer on an exposed front surface of the melt flowable optically transparent top layer; or
heat laminating a thermally conductive layer on an exposed rear surface of the melt flowable rear sheet; or
heat laminating a glass layer on an exposed front surface of the melt flowable optically transparent top layer and a thermally conductive layer on an exposed rear surface of the melt flowable rear sheet.

16. The method of claim 1 wherein said heat laminating comprises:
rolling heat laminating; or
rolling heat laminating employing heated laminating rollers; or
rolling heat laminating employing a release liner between at least the top layer and the laminating rollers; or
rolling heat laminating employing a release liner between at least the rear sheet and the laminating rollers; or
rolling heat laminating employing one or more heating elements for heating at least the top layer prior to the laminating rollers; or
rolling heat laminating employing one or more heating elements for heating at least the rear sheet prior to the laminating rollers; or
vacuum laminating; or
any combination of the foregoing.

17. The method of claim 1 wherein said heat laminating further comprises:
placing a release liner adjacent at least the top layer; and
placing a backing sheet that is stiffer than the top layer against the release liner for defining a surface to which the top layer conforms when heat laminated.

18. The method of claim 1 wherein said obtaining a top layer includes obtaining a roll or sheet including a plurality of top layers, said method further comprising:
separating a roll laminated roll or sheet including a plurality of top layers into a plurality of individual top layers.

19. The method of claim 1 wherein said obtaining a rear sheet includes obtaining a roll or sheet including a plurality of rear sheets, said method further comprising:
separating a roll laminated roll or sheet including a plurality of rear sheets into a plurality of individual rear sheets.

20. The method of claim 1 wherein said laminated module of solar cells comprises a laminated solar cell panel.

21. The method of claim 1 wherein:
the top layer of a melt flowable optically transparent electrically insulating thermoplastic adhesive material includes a molecularly flexible thermoplastic adhesive material having at least ten percent molecular crystallites that melt flow at a temperature in the range between about 80° C. and about 250° C. and having a glass transition temperature of less than about 0° C., to bond to the front surfaces of solar cells; and the rear sheet of a melt flowable electrically insulating thermoplastic adhesive material includes a molecularly flexible thermoplastic adhesive material having at least ten percent molecular crystallites that melt flow at a temperature in the range between about 80° C. and about 250° C. and having a glass transition temperature of less than about 0° C., to bond to the back surfaces of solar cells.

22. The method of claim 21 wherein the laminated module including the top layer and the rear sheet exhibits a flexural modulus at about 60° C. that is at least fifty percent of the flexural modulus exhibited at about 20° C. without crosslinking chemical curing.

23. A method for making a laminated module of solar cells having front and back surfaces comprising:
obtaining a top layer of a melt flowable optically transparent electrically insulating thermoplastic adhesive material having a first pattern of melt flowable electrically conductive thermoplastic adhesive thereon for making electrical connection to the front surface of solar cells;
placing a plurality of solar cells having front and back surfaces to which electrical connection may be made on the melt flowable top layer in locations with the first pattern of melt flowable electrically conductive thermoplastic adhesive adjacent the front surfaces of the plurality of solar cells,
whereby light may pass through said melt flowable optically transparent top layer to impinge upon the front surface of said plurality of solar cells and connection may be made to the back surfaces thereof;
heat laminating the melt flowable top layer and the plurality of solar cells to melt flow the melt flowable top layer so that electrical connections are made between the first pattern of melt flowable electrically conductive thermoplastic adhesive and the front surfaces of the plurality of solar cells;
wherein the plurality of solar cells are embedded into the melt flowable top layer,
wherein the first pattern of melt flowable electrically conductive thermoplastic adhesive provides exposed electrical connections to the front surfaces of said plurality of solar cells, and
wherein the back surfaces of said plurality of solar cells are exposed for making electrical connection thereto,
whereby electrical connections to the front and back surfaces of said plurality of solar cells are exposed on the same surface of said laminated module of solar cells.

24. The method of claim 23 further comprising:
obtaining a rear sheet of a melt flowable electrically insulating thermoplastic adhesive material having a second pattern of melt flowable electrically conductive thermoplastic adhesive thereon for making electrical connection to the back surfaces of the solar cells;
placing the melt flowable rear sheet adjacent to the melt flowable top layer and the back surfaces of the plurality of solar cells in a location with the second pattern of melt flowable electrically conductive thermoplastic adhesive adjacent the back surfaces of the plurality of solar cells with portions of the second pattern of melt flowable electrically conductive thermoplastic adhesive extending beyond edges of the plurality of solar cells opposite the extending portions of the first pattern of electrically conductive thermoplastic adhesive;
heat laminating the melt flowable top layer, the plurality of solar cells and the melt flowable rear sheet to melt flow the melt flowable top layer and the melt flowable rear sheet together so that electrical connections are made between the second pattern of melt flowable electrically conductive thermoplastic adhesive and the back surfaces of the plurality of solar cells, and between the respective extending portions of the first and second patterns of pattern of melt flowable electrically conductive thermoplastic adhesive;

whereby the plurality of solar cells are embedded into at least the melt flowable top layer, and whereby ones of the plurality of solar cells are electrically connected in series by the connection between the first and second patterns of electrically conductive thermoplastic adhesive.

25. The method of claim 24 wherein:

the top layer of a melt flowable optically transparent electrically insulating thermoplastic adhesive material includes a molecularly flexible thermoplastic adhesive material having at least ten percent molecular crystallites that melt flow at a temperature in the range between about 80° C. and about 250° C. and having a glass transition temperature of less than about 0° C., to bond to the front surfaces of solar cells; and the rear sheet of a melt flowable electrically insulating thermoplastic adhesive material includes a molecularly flexible thermoplastic adhesive material having at least ten percent molecular crystallites that melt flow at a temperature in the range between about 80° C. and about 250° C. and having a glass transition temperature of less than about 0° C., to bond to the back surfaces of solar cells.

26. The method of claim 25 wherein the laminated module including the top layer and the rear sheet exhibits a flexural modulus at about 60° C. that is at least fifty percent of the flexural modulus exhibited at about 20° C. without cross-linking chemical curing.

27. The method of claim 23 wherein said obtaining a top layer of a melt flowable optically transparent electrically insulating thermoplastic adhesive material includes:

applying the first pattern of melt flowable electrically conductive thermoplastic adhesive on one surface of the top layer of melt flowable optically transparent electrically insulating thermoplastic adhesive material, wherein the first pattern includes at least one elongated conductor for making electrical connection to the front surface of solar cells.

28. The method of claim 27 wherein said applying the first pattern includes:

applying the first pattern of melt flowable electrically conductive thermoplastic adhesive by screening, stenciling, roll coating, masking, deposition, printing, screen printing, inkjet printing, or sheet laminating; or patterning an electrically conductive metal on the sheet in the first pattern and applying the first pattern of melt flowable electrically conductive thermoplastic adhesive on the patterned electrically conductive metal by screening, stenciling, roll coating, masking, deposition, printing, screen printing, inkjet printing, or sheet laminating.

29. The method of claim 27 wherein said applying the first pattern includes:

applying an insulating pattern of a melt flowable electrically insulating thermoplastic adhesive on the first pattern of melt flowable electrically conductive thermoplastic adhesive, wherein the insulating pattern has a plurality of elongated areas at locations corresponding to locations at which the edges of the plurality of solar cells are to be placed.

30. The method of claim 23 wherein:

said placing a plurality of solar cells includes placing solar cells in locations with portions of the first pattern of melt flowable electrically conductive thermoplastic adhesive extending beyond edges of the plurality of solar cells, wherein the portions of the first pattern of melt flowable electrically conductive thermoplastic adhesive extending beyond solar cells are exposed near the back surfaces of said plurality of solar cells to provide the exposed electrical connections to the front surfaces of said plurality of solar cells.

31. The method of claim 23 wherein said placing a plurality of solar cells includes:

placing the front surfaces of the solar cells adjacent to the first pattern of melt flowable electrically conductive thermoplastic adhesive while the melt flowable electrically conductive thermoplastic adhesive is wet; or placing the front surfaces of the solar cells adjacent to the first pattern of melt flowable electrically conductive thermoplastic adhesive after the melt flowable electrically conductive thermoplastic adhesive is dried; or placing the front surfaces of the solar cells adjacent to the first pattern of melt flowable electrically conductive thermoplastic adhesive after the melt flowable electrically conductive thermoplastic adhesive is B-staged.

32. The method of claim 23 wherein:

each of the plurality of solar cells includes a transparent electrically conductive front contact substantially covering the front surface thereof and the first pattern includes for each of the plurality of solar cells at least one elongated conductor having a plurality of relatively narrower elongated conductors extending substantially perpendicular thereto for making an electrical connection to the front contact of the solar cell; or each of the plurality of solar cells includes at least one elongated electrically conductive front contact on the front surface thereof and the first pattern includes for each of the plurality of solar cells at least one elongated conductor corresponding to the at least one elongated electrically conductive front contact of the solar cell and located for making an electrical connection to the front contact of the solar cell; or each of the plurality of solar cells includes at least two parallel elongated electrically conductive front contacts on the front surface thereof and the first pattern includes for each of the plurality of solar cells at least two parallel elongated conductors corresponding to the at least two parallel elongated electrically conductive front contacts of the solar cell and located for making an electrical connection to the front contacts of the solar cell.

33. The method of claim 23 wherein each of the plurality of solar cells has a contact on the front surface thereof to which electrical connection may be made, wherein said placing a plurality of solar cells on the melt allowable top layer includes heating the top layer, the solar cells, or both, so as to increase the adhesion of the solar cell s to the top layer.

34. The method of claim 23 wherein the first pattern of melt flowable electrically conductive thermoplastic adhesive comprises:

at least one elongated continuous strip of melt flowable electrically conductive thermoplastic adhesive where said plurality of solar cells do not have a metalized contact on the front surface thereof; or a plurality of areas comprising between about ten percent and 100 percent of the area of metalized contact where said plurality of solar cells have a metalized contact on the front surface thereof.

35. The method of claim 23 wherein each of said plurality of solar cells includes an electrically conductive tab applied to a contact on the front surface or on the back surface thereof or on both surfaces thereof, said tab extending beyond an edge of the solar cell, and wherein said electrically conductive tab includes:
- a solderable metal strip soldered to a metalized contact of the solar cell; or
- a solderable metal strip soldered to a metalized contact on the front surface of one solar cell and to a metalized contact on the back surface of an adjacent solar cell; or
- a metal strip having on opposing broad surfaces thereof a plurality of areas comprising melt flowable electrically conductive thermoplastic adhesive covering between about ten percent and 100 percent of the area of said metal strip and melt flowable electrically insulating thermoplastic adhesive substantially covering the remaining area of said metal strip; or
- a metal strip having on opposing broad surfaces thereof a plurality of areas comprising melt flowable electrically conductive thermoplastic adhesive covering between about ten percent and 100 percent of the area of said metal strip and melt flowable electrically insulating thermoplastic adhesive substantially covering the remaining area of said metal strip, wherein areas of melt flowable electrically conductive thermoplastic adhesive on one surface of said metal strip adhere to a metalized contact on the front surface of one solar cell and areas of melt flowable electrically conductive thermoplastic adhesive on the other surface of said metal strip adhere to a metalized contact on the back surface of an adjacent solar cell.

36. The method of claim 23 wherein said heat laminating includes:
heat laminating a glass layer on an exposed front surface of the melt flowable optically transparent top layer.

37. The method of claim 23 wherein said heat laminating comprises:
- rolling heat laminating; or
- rolling heat laminating employing heated laminating rollers; or
- rolling heat laminating employing a release liner between at least the top layer and the laminating rollers; or
- rolling heat laminating employing one or more heating elements for heating at least the top layer prior to the laminating rollers; or
- vacuum laminating; or
- any combination of the foregoing.

38. The method of claim 23 wherein said heat laminating further comprises:
placing a release liner adjacent at least the top layer; and
placing a backing sheet that is stiffer than the top layer against the release liner for defining a surface to which the top layer conforms when heat laminated.

39. The method of claim 23 wherein said obtaining a top layer includes obtaining a roll or sheet including a plurality of top layers, said method further comprising:
separating a roll laminated roll or sheet including a plurality of top layers into a plurality of individual top layers.

40. A method for making a laminated module of solar cells having front and back surfaces comprising:
obtaining a top layer of a melt flowable optically transparent electrically insulating molecularly flexible thermoplastic adhesive material having at least ten percent molecular crystallites that melt flow at a temperature in the range between about 80° C. and about 250° C. and having a glass transition temperature of less than about 0° C. to bond to the front surfaces of solar cells;
placing a plurality of solar cells having front and back surfaces to which electrical connection may be made with the front surfaces thereof adjacent the melt flowable top layer;
whereby light may pass through said melt flowable optically transparent top layer to impinge upon the front surface of said plurality of solar cells and connection may be made to the back surfaces thereof;
providing electrical connections between the front surface of ones of the plurality of solar cells and the back surface of others of said plurality of solar cells;
placing adjacent the back surfaces of the plurality of solar cells and top sheet a rear sheet of a melt flowable electrically insulating molecularly flexible thermoplastic adhesive material having at least ten percent molecular crystallites that melt flow at a temperature in the range between about 80° C. and about 250° C. and having a glass transition temperature of less than about 0° C., to bond to the back surfaces of solar cells;
heat laminating the melt flowable top layer, the plurality of solar cells and the melt flowable rear sheet to melt flow the melt flowable top layer and the melt flowable rear sheet together so that the plurality of solar cells and the electrical connections there between are encapsulated in the melt flowed molecularly flexible thermoplastic adhesive of at least the top layer;
wherein the laminated module including the top layer and the rear sheet exhibits a flexural modulus at about 60° C. that is at least fifty percent of the flexural modulus exhibited at about 20° C. without cross-linking chemical curing.

41. The method of claim 40 wherein said providing electrical connections comprises:
providing a first pattern of melt flowable electrically conductive thermoplastic adhesive on the top layer in locations for making electrical connection to the front surfaces of the plurality of solar cells;
providing a second pattern of melt flowable electrically conductive thermoplastic adhesive on the rear sheet in locations for making electrical connection to the back surfaces of the plurality of solar cells,
wherein each of the first and second patterns of melt flowable electrically conductive thermoplastic adhesive include respective portions extending beyond the edges of the plurality of solar cells that melt flow connect to each other to provide an electrical connection between the front surface of one of the plurality of solar cells and the back surface of another of the plurality of solar cells,
whereby ones of the plurality of solar cells are electrically connected in series by the connection between the first and second patterns of electrically conductive thermoplastic adhesive.

42. The method of claim 40 wherein said providing electrical connections comprises:
providing at least one elongated continuous strip of melt flowable electrically conductive thermoplastic adhesive where the plurality of solar cells do not have a metalized contact on the front surface and/or on the back surface thereof; or
providing a plurality of areas comprising between about ten percent and 100 percent of the area of metalized contact where the plurality of solar cells have a metalized contact on the front surface and/or on the back surface thereof.

43. The method of claim 40 wherein said providing electrical connections comprises:

applying an electrically conductive tab to a contact on the front surface or on the back surface of or on both surfaces of each of the plurality of solar cells, each tab extending beyond an edge of the solar cell, wherein the electrically conductive tab includes:

a solderable metal strip soldered to a metalized contact of the solar cell; or a metal strip having on opposing broad surfaces thereof a plurality of areas comprising melt flowable electrically conductive thermoplastic adhesive covering between about ten percent and 100 percent of the area of the metal strip and melt flowable electrically insulating thermoplastic adhesive substantially covering the remaining area of the metal strip, attached to a metalized contact of the solar cell.

44. The method of claim 40 wherein said providing electrical connections comprises:

soldering solderable metal strips to metalized contacts of the plurality of solar cells; or attaching metal strips having on opposing broad surfaces thereof a plurality of areas comprising melt flowable electrically conductive thermoplastic adhesive covering between about ten percent and 100 percent of the area of the metal strip and melt flowable electrically insulating thermoplastic adhesive substantially covering the remaining area of the metal strip, to metalized contacts of the plurality of solar cells.

* * * * *